(12) United States Patent
Uchida et al.

(10) Patent No.: US 9,558,967 B2
(45) Date of Patent: Jan. 31, 2017

(54) METHOD OF MANUFACTURING SEMICONDUCTOR DEVICE

(71) Applicant: Renesas Electronics Corporation, Tokyo (JP)

(72) Inventors: Shinichi Uchida, Tokyo (JP); Takafumi Kuramoto, Tokyo (JP); Risho Koh, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/928,780

(22) Filed: Oct. 30, 2015

(65) Prior Publication Data
US 2016/0197066 A1 Jul. 7, 2016

(30) Foreign Application Priority Data
Jan. 5, 2015 (JP) .................. 2015-000204

(51) Int. Cl.
*H01L 25/00* (2006.01)
*H01L 21/56* (2006.01)
(Continued)

(52) U.S. Cl.
CPC ......... *H01L 21/56* (2013.01); *H01L 21/02164* (2013.01); *H01L 21/31051* (2013.01); *H01L 21/31055* (2013.01); *H01L 21/31144* (2013.01); *H01L 21/768* (2013.01); *H01L 23/3192* (2013.01); *H01L 23/49575* (2013.01); *H01L 23/5227* (2013.01); *H01L 23/58* (2013.01); *H01L 28/10* (2013.01); *H01L 2224/05554* (2013.01); *H01L 2224/32145* (2013.01); *H01L 2224/48091* (2013.01); *H01L 2224/48247* (2013.01); *H01L 2224/48465* (2013.01); *H01L 2224/49171* (2013.01); *H01L 2224/73215* (2013.01); *H01L 2224/73265* (2013.01);
(Continued)

(58) Field of Classification Search
CPC ............... H01L 25/50; H01L 21/02164; H01L 21/31051; H01L 21/31055; H01L 21/31144; H01L 21/56; H01L 21/768; H01L 23/5227; H01L 25/0657; H01L 28/10; H01L 2225/06527
See application file for complete search history.

(56) References Cited

U.S. PATENT DOCUMENTS 9,219,028 B1 * 12/2015 Higgins, III ........ H01L 23/5389
2011/0049693 A1   3/2011 Nakashiba et al.
(Continued)

FOREIGN PATENT DOCUMENTS

JP        2011-054800 A      3/2011

*Primary Examiner* — Peter Bradford
(74) *Attorney, Agent, or Firm* — McGinn IP Law Group, PLLC

(57) ABSTRACT

An improvement is achieved in the reliability of a semiconductor device by preventing a dielectric breakdown between two semiconductor chips facing each other. During the manufacturing of first and second semiconductor chips, the process of planarizing the upper surfaces of insulating films is performed. Then, the first and second semiconductor chips are stacked via an insulating sheet with the respective insulating films of the first and second semiconductor chips facing each other such that the respective coils of the first and second semiconductor chips are magnetically coupled to each other.

12 Claims, 37 Drawing Sheets

(51) Int. Cl.
*H01L 49/02* (2006.01)
*H01L 23/522* (2006.01)
*H01L 21/768* (2006.01)
*H01L 21/3105* (2006.01)
*H01L 21/311* (2006.01)
*H01L 21/02* (2006.01)
*H01L 23/31* (2006.01)
*H01L 23/495* (2006.01)
*H01L 23/58* (2006.01)

(52) U.S. Cl.
CPC ............... *H01L 2224/92147* (2013.01); *H01L 2224/92247* (2013.01); *H01L 2924/0002* (2013.01); *H01L 2924/181* (2013.01)

(56) References Cited

U.S. PATENT DOCUMENTS

| | | | |
|---|---|---|---|
| 2015/0130022 A1* | 5/2015 | Watanabe | H01L 23/645 257/531 |
| 2015/0171934 A1* | 6/2015 | Brauchler | H01L 29/7393 455/41.1 |
| 2016/0093570 A1* | 3/2016 | Watanabe | H04B 5/0031 257/531 |

* cited by examiner

METHOD OF MANUFACTURING SEMICONDUCTOR DEVICE

CROSS-REFERENCE TO RELATED APPLICATIONS

The disclosure of Japanese Patent Application No. 2015-000204 filed on Jan. 5, 2015 including the specification, drawings and abstract is incorporated herein by reference in its entirety.

BACKGROUND

The present invention relates to a method of manufacturing a semiconductor device, which can be used appropriately as a method of manufacturing a semiconductor device in which, e.g., two semiconductor chips formed with respective inductors are placed to face each other.

As a technique which transmits an electric signal between two circuits to which electric signals having different potentials are input, there is a technique using a photocoupler. The photocoupler has a light emitting element such as a light emitting diode and a light receiving element such as a phototransistor. The photocoupler converts the electric signal input thereto to light using the light emitting element and returns the light to the electric signal using the light receiving element to transmit the electric signal.

On the other hand, a technique which magnetically couples (inductively couples) two inductors to transmit an electric signal has been developed.

Japanese Unexamined Patent Publication No. 2011-54800 (Patent Document 1) discloses a technique related to a semiconductor chip in which a first semiconductor chip and a second semiconductor chip are formed with respective inductors and signal transmission between the individual chips is performed using the inductive coupling of the inductors. Patent Document 2 describes that, between the two semiconductor chips, an insulating adhesive layer may also be provided.

RELATED ART DOCUMENT

Patent Document

[Patent Document 1]
Japanese Unexamined Patent Publication No. 2011-54800

SUMMARY

In the semiconductor device in which the two semiconductor chips formed with the respective inductors are placed to face each other and an electric signal is transmitted using the magnetic coupling, a dielectric breakdown may occur between the individual chips. Accordingly, it is desired to maximize the breakdown voltage between the chips and improve the reliability of the semiconductor device.

Other problems and novel features of the present invention will become apparent from a statement in the present specification and the accompanying drawings.

According to an embodiment, a method of manufacturing a semiconductor device is a method of manufacturing a semiconductor device in which a first semiconductor chip and a second semiconductor chip are stacked via an insulating sheet and a first coil of the first semiconductor chip is magnetically coupled to a second coil of the second semiconductor chip. A process of manufacturing the first semiconductor chip includes the steps of forming a first wiring structure having one or more wiring layers and including the first coil over a first semiconductor substrate, forming a first insulating film over the first wiring structure, and planarizing an upper surface of the first insulating film. A process of manufacturing the second semiconductor chip includes the steps of forming a second wiring structure having one or more wiring layers and including the second coil over a second semiconductor substrate, forming a second insulating film over the second wiring structure, and planarizing an upper surface of the second insulating film. The first and second semiconductor chips are stacked via the insulating sheet with the first insulating film of the first semiconductor chip and the second insulating film of the second semiconductor chip facing each other such that the first coil of the first semiconductor chip is magnetically coupled to the second coil of the second semiconductor chip.

According to the embodiment, the reliability of the semiconductor device can be improved.

DETAILED DESCRIPTION

Figure 1:
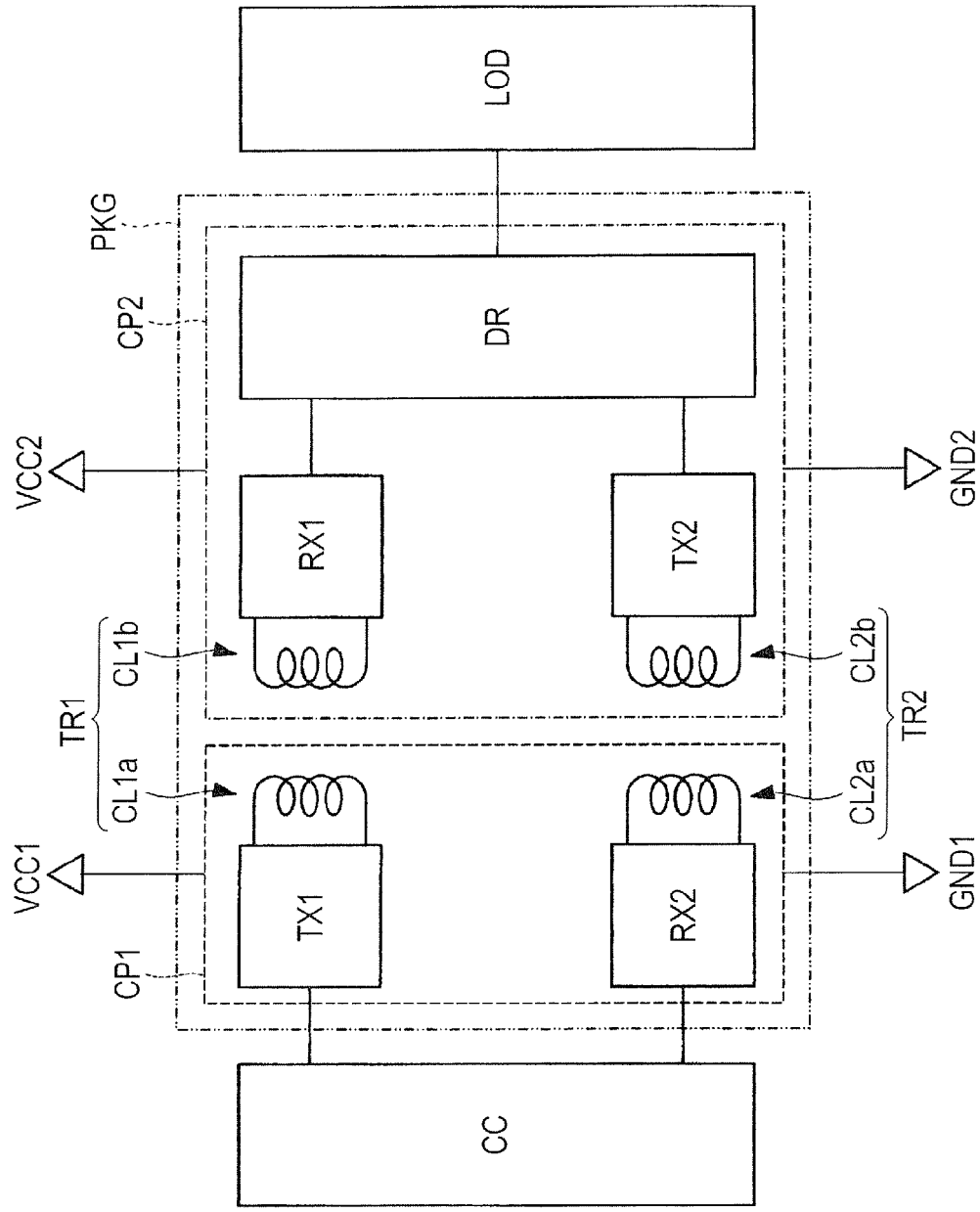
FIG. 1 is a circuit diagram showing an example of an electronic device using a semiconductor device in an embodiment.

In the following embodiments, if necessary for the sake of convenience, the embodiments will be each described by being divided into a plurality of sections or embodiments. However, they are by no means irrelevant to each other unless particularly explicitly described otherwise, but are in relations such that one of the sections or embodiments is a modification, details, supplementary explanation, and so forth of part or the whole of the others. Also, in the following embodiments, when the number and the like (including the number, numerical value, amount, range, and the like) of elements are referred to, they are not limited to specific numbers unless particularly explicitly described otherwise or unless they are obviously limited to specific numbers in principle. The number and the like of the elements may be not less than or not more than specific numbers. Also, in the following embodiments, it goes without saying that the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in the following embodiments, the shapes and the like are assumed to include those substantially proximate or similar thereto and the like unless particularly explicitly described otherwise or unless it can be considered that they obviously do not in principle. The same shall apply in regard to the foregoing numerical value and range.

The embodiments of the present invention will be described below in detail on the basis of the drawings. Note that, throughout all the drawings for illustrating the embodiments, members having the same functions are designated by the same reference numerals, and a repeated description thereof is omitted. In the following embodiments, a description of the same or like parts will not be repeated in principle unless particularly necessary.

In the drawings used in the embodiments, hatching may be omitted even in a cross section for improved clarity of illustration, while even a plan view may be hatched for improved clarity of illustration.

Embodiment 1

About Circuit Configuration

FIG. 1 is a circuit diagram showing an example of an electronic device (semiconductor device) using a semiconductor device in an embodiment. Note that, in FIG. 1, the portion enclosed by the dotted line is formed in a semiconductor chip CP1, the portion enclosed by the dot-dash line is formed in a semiconductor chip CP2, and the portion enclosed by the two-dot-dash line is formed in a semiconductor package PKG.

The electronic device shown in FIG. 1 includes the semiconductor package (semiconductor device) PKG in which the semiconductor chips (semiconductor devices) CP1 and CP2 are embedded. In the semiconductor chip CP1, a transmission circuit TX1 and a reception circuit RX2 are formed. In the semiconductor chip CP2, a reception circuit RX1, a transmission circuit TX2, and a drive circuit DR are formed. The electronic device shown in FIG. 1 also has a control circuit CC. The control circuit CC is formed in another semiconductor chip provided outside the semiconductor package PKG.

The transmission circuit TX1 and the reception circuit RX1 are circuits for transmitting a control signal from the control circuit CC to the drive circuit DR. The transmission circuit TX2 and the reception circuit RX2 are circuits for transmitting a signal from the drive circuit DR to the control circuit CC. The control circuit CC controls or drives the drive circuit DR, while the drive circuit DR drives a load LOD. The semiconductor chips CP1 and CP2 are embedded in the semiconductor package PKG. The load LOD is provided outside the semiconductor package PKG.

To the circuit in the semiconductor chip CP1 including the transmission circuit TX1 and the reception circuit RX2, a power supply voltage VCC1 is supplied and grounded with a ground voltage NGD1. To the circuit in the semiconductor chip CP2 including the transmission circuit TX2 and the reception circuit RX1, a power supply voltage VCC2 is supplied and grounded with a ground voltage GND2. The power supply voltages VCC1 and VCC2 may be the same as or different from each other. Likewise, the ground voltages GND1 and GND2 may also be the same as or different from each other.

Between the transmission circuit TX1 and the reception circuit RX1, a transformer (converter, magnetic coupling element, or electromagnetic coupling element) TR1 including magnetically coupled (inductively coupled) coils (inductors) CL1$a$ and CL1$b$ is interposed. A signal can be transmitted from the transmission circuit TX1 to the reception circuit RX1 via the transformer TR1 (i.e., via the magnetically coupled coils CL1$a$ and CL1$b$). This allows the reception circuit RX1 in the semiconductor chip CP2 to receive the signal transmitted by the transmission circuit TX1 in the semiconductor chip CP1. Consequently, the control circuit CC can transmit a signal (control signal) to the drive circuit DR via the transmission circuit TX1, the transformer TR1, and the reception circuit RX1.

Of the coils CL1$a$ and CL1$b$ included in the transformer TR1, the coil CL1$a$ is formed in the semiconductor chip CP1 and the coil CL1$b$ is formed in the semiconductor chip CP2. That is, the transformer TR1 is formed of the coil CL1$a$ formed in the semiconductor chip CP1 and the coil CL1$b$ formed in the semiconductor chip CP2. Each of the coils CL1$a$ and CL1$b$ can also be regarded as an inductor. The transformer TR1 can also be regarded as a magnetic coupling element.

Between the transmission circuit TX2 and the reception circuit RX2, a transformer (converter, magnetic coupling element, or electromagnetic coupling element) TR2 including magnetically coupled (inductively coupled) coils (inductors) CL2$b$ and CL2$a$ is interposed. A signal can be transmitted from the transmission circuit TX2 to the reception circuit RX2 via the transformer TR2 (i.e., via the magnetically coupled coils CL2$b$ and CL2$a$). This allows the reception circuit RX2 in the semiconductor chip CP1 to receive the signal transmitted by the transmission circuit TX2 in the semiconductor chip CP2. Consequently, the drive circuit DR can transmit the signal to the control circuit CC via the transmission circuit TX2, the transformer TR2, and the reception circuit RX2.

Of the coils CL2$b$ and CL2$a$ included in the transformer TR2, the coil CL2$a$ is formed in the semiconductor chip CP1 and the coil CL2$b$ is formed in the semiconductor chip CP2. That is, the transformer TR2 is formed of the coil CL2$a$ formed in the semiconductor chip CP1 and the coil CL2$b$ formed in the semiconductor chip CP2. Each of the coils CL2$b$ and CL2$a$ can also be regarded as an inductor. The transformer TR2 can also be regarded as a magnetic coupling element.

The transformer TR1 is formed of the coil CL1$a$ formed in the semiconductor chip CP1 and the coil CL1$b$ formed in the semiconductor chip CP2. The coils CL1$a$ and CL1$b$ are not connected via a conductor, but are magnetically coupled to each other. Accordingly, when a current flows in the coil CL1$a$, an induced electromotive force is generated in the coil CL1$b$ in response to the current change so that an induced current flows therein. The coil CL1$a$ is a primary coil, while the coil CL1$b$ is a secondary coil. Using the coils CL1$a$ and CL1$b$, a signal is transmitted from the transmission circuit TX1 to the coil CL1$a$ (primary coil) of the transformer TR1 to allow a current to flow, and the induced current (or induced electromotive force) generated in the coil CL1$b$ (secondary coil) of the transformer TR1 in accordance with the current is sensed (received) by the reception circuit RX1. Thus, the signal corresponding to the signal transmitted by the transmission circuit TX1 can be received by the reception circuit RX1.

The transformer TR2 is formed of the coil CL2$b$ formed in the semiconductor chip CP2 and the coil CL2$a$ formed in the semiconductor chip CP1. The coils CL2$b$ and CL2$a$ are not connected via a conductor, but are magnetically coupled. Accordingly, when a current flows in the coil CL2$b$, an induced electromotive force is generated in the coil CL2$a$ in response to the current change so that an induced current flows therein. The coil CL2$b$ is a primary coil, while the coil CL2$a$ is a secondary coil. Using the coils CL2$b$ and CL2$a$, a signal is transmitted from the transmission circuit TX2 to the coil CL2$b$ (primary coil) of the transformer TR2 to allow a current to flow, and the induced current (or induced electromotive force) generated in the coil CL2$a$ (secondary coil) of the transformer TR2 in accordance with the current is sensed (received) by the reception circuit RX2. Thus, the signal corresponding to the signal transmitted by the transmission circuit TX2 can be received by the reception circuit RX2.

Using a path extending from the transmission circuit TX1 to the reception circuit RX1 via the transformer TR1 and a path extending from the transmission circuit TX2 to the reception circuit RX2 via the transformer TR2, signal transmission/reception is performed between the semiconductor chips CP1 and CP2. That is, the signal transmitted by the transmission circuit TX1 is received by the reception circuit RX1, and the signal transmitted by the transmission circuit TX2 is received by the reception circuit RX2. This allows signal transmission/reception to be performed between the semiconductor chips CP1 and CP2. As described above, signal transmission from the transmission circuit TX1 to the reception circuit RX1 is performed via the transformer TR1 (i.e., the magnetically coupled coils CL1$a$ and CL1$b$). On the other hand, signal transmission from the transmission circuit TX2 to the reception circuit RX2 is performed via the transformer TR2 (i.e., the magnetically coupled coils CL2$b$ and CL2$a$). The drive circuit DR can drive the load LOD in accordance with the signal transmitted from the semiconductor chip CP1 to the semiconductor chip CP2 (i.e., the signal transmitted from the transmission circuit TX1 to the reception circuit RX1 via the transformer TR1). As the load LOD, various loads can be used depending on an intended purpose. For example, a motor, an inverter for driving a motor, or the like can be used.

The semiconductor chips CP1 and CP2 have different voltage levels (reference potentials). For example, the semiconductor chip CP1 is connected to a lower voltage region having a circuit (e.g., the control circuit CC) which is operated or driven with a lower voltage (e.g., several to several tens of volts) via wires BW and leads LD each described later or the like. On the other hand, the semiconductor chip CP2 is connected to a higher voltage region having a circuit (e.g., the load LOD) which is operated or driven with a voltage (e.g., not less than 100 V) higher than the lower voltage via the wires BW and the leads LD each described later or the like. However, since signal transmission between the semiconductor chips CP1 and CP2 is performed via the transformers TR1 and TR2, signal transmission between different-voltage circuits is possible.

In each of the transformers TR1 and TR2, a large potential difference may be produced between the primary and secondary coils. Conversely, since a large potential difference may be produced, the primary and secondary coils which are magnetically coupled instead of being connected via a conductor are used for signal transmission. Accordingly, in forming the transformer TR, it is important to maximize the dielectric breakdown voltage between the coils CL1a and CL1b in terms of improving the reliability of the semiconductor package PKG in which the semiconductor chips CP1 and CP2 are embedded or the electronic device using the semiconductor package PKG. It is also important in forming the transformer TR2 to maximize the dielectric breakdown voltage between the coils CL2b and CL2a in terms of improving the reliability of the semiconductor package PKG in which the semiconductor chips CP1 and CP2 are embedded or the electronic device using the semiconductor package PKG.

In the case shown in FIG. 1, the control circuit CC is embedded in the semiconductor chip other than the semiconductor chips CP1 and CP2. However, in another embodiment, it is also possible to embed the control circuit CC in the semiconductor chip CP1. Also, in the case shown in FIG. 1, the drive circuit DR is embedded in the semiconductor chip CP2. However, in another embodiment, it is also possible to embed the drive circuit DR in a semiconductor chip other than the semiconductor chips CP1 and CP2.

<About Example of Signal Transmission>

Figure 2:
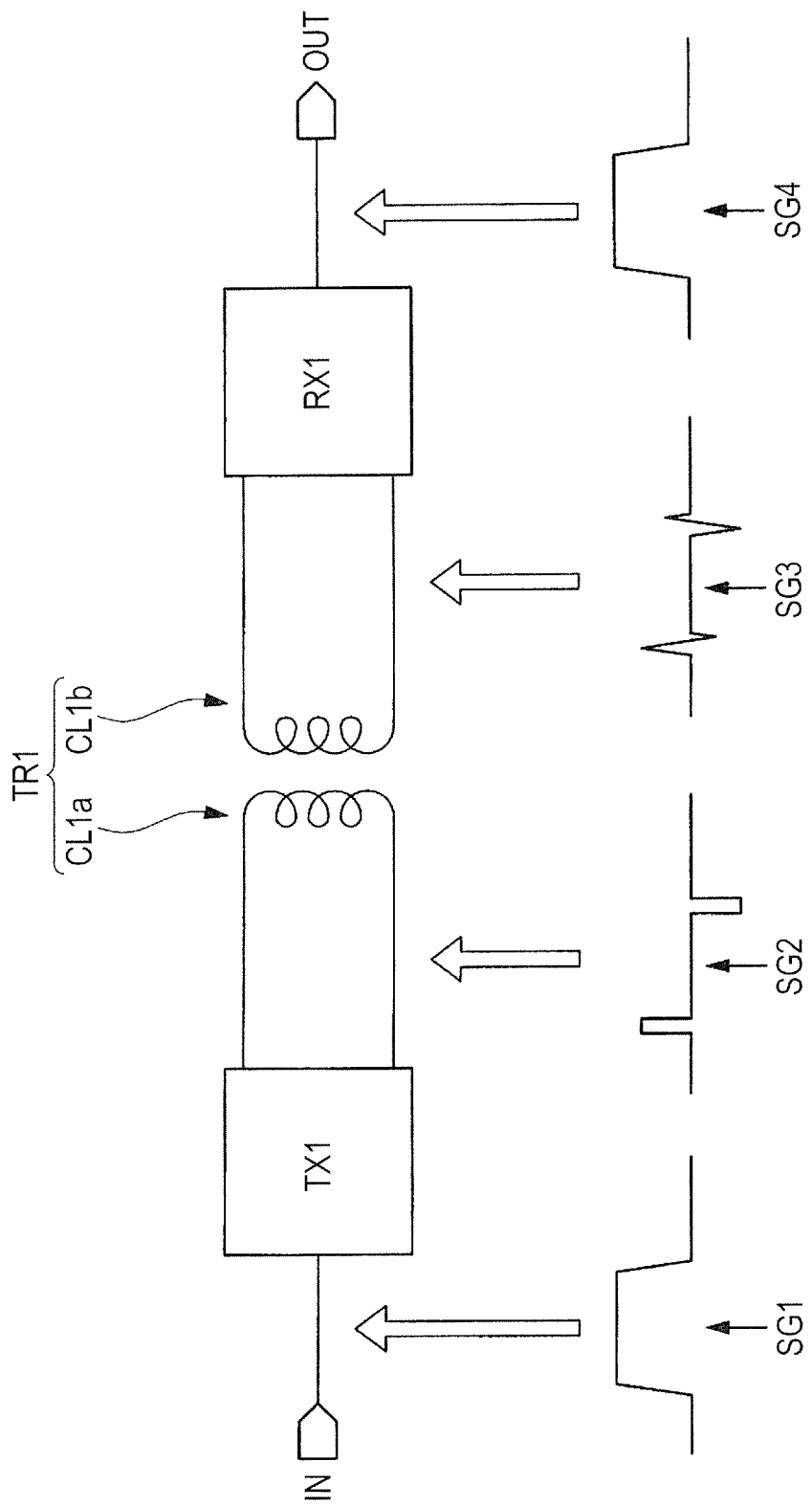
FIG. 2 is an illustrative view showing an example of signal transmission.
Figure 3:
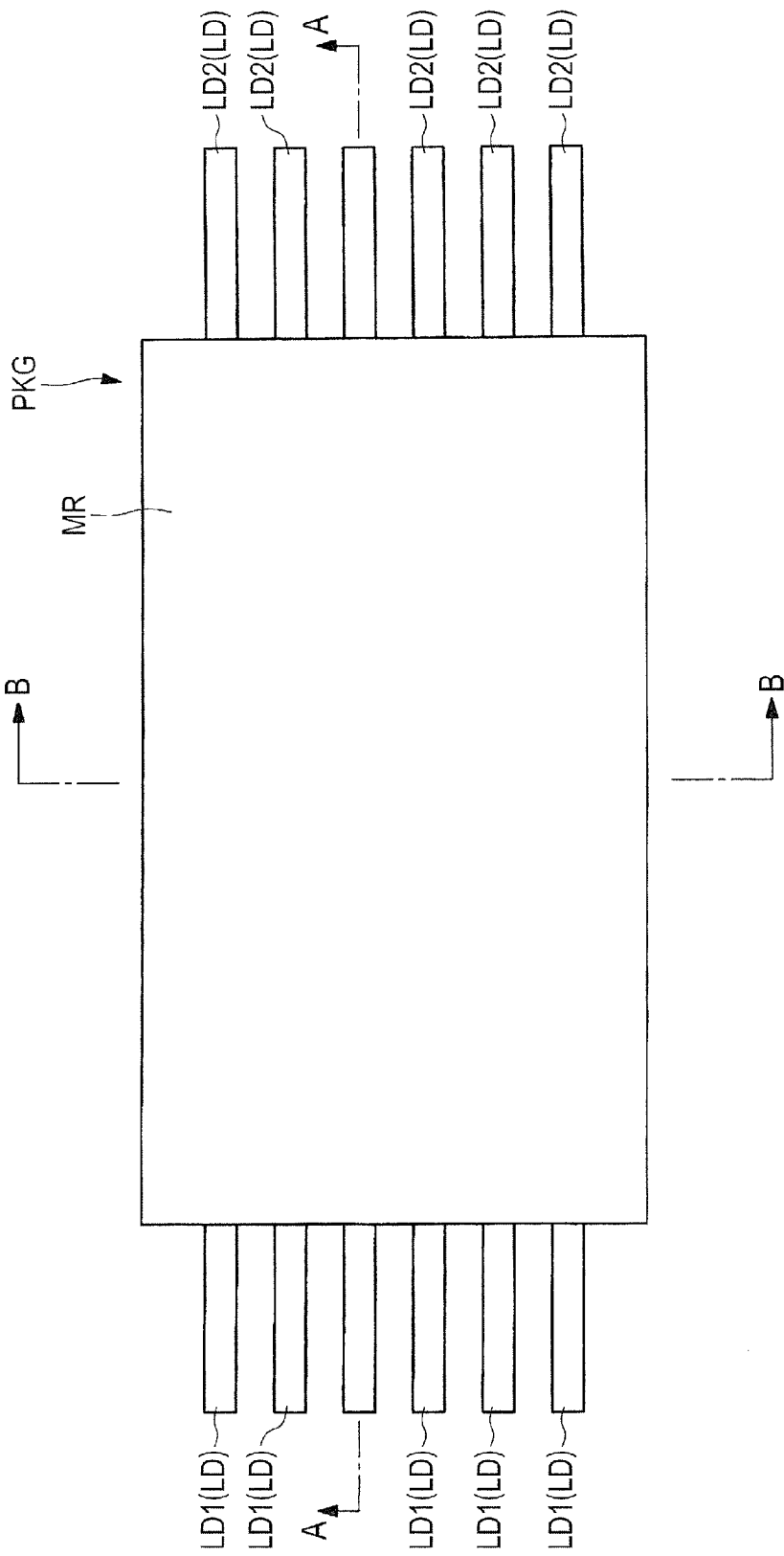
FIG. 3 is a top view of a semiconductor package in the embodiment.

FIG. 2 is an illustrative view showing an example of signal transmission.

The transmission circuit TX extracts an edge portion from a square-wave signal SG1 input to the transmission circuit TX1 to generate a signal SG2 having a given pulse width and transmits the signal SG2 to the coil CL1a (primary coil) of the transformer TR1. When a current resulting from the signal SG2 flows in the coil CL1a (primary coil) of the transformer TR1, a signal SG3 corresponding thereto flows into the coil CL1b (secondary coil) of the transformer TR1 due to an induced electromotive force. The signal SG3 is amplified in the reception circuit RX1 and further modulated into a square wave so that a square-wave signal SG4 is output from the reception circuit RX1. Thus, the signal SG4 corresponding to the signal SG1 input to the transmission circuit TX1 can be output from the reception circuit RX1. In this manner, the signal is transmitted from the transmission circuit TX1 to the reception circuit RX1. Signal transmission from the transmission circuit TX2 to the reception circuit RX2 can also be similarly performed.

In FIG. 2, an example of signal transmission from a transmission circuit to a reception circuit is shown. However, the signal transmission is not limited thereto, but can variously be modified. It is sufficient for the signal transmission to be performed by a method which transmits a signal via magnetically coupled coils (primary and secondary coils).

<About Example of Configuration of Semiconductor Package>

Next, a description will be given of an example of a configuration of the semiconductor package in the present embodiment. Note that the semiconductor package can also be regarded as a semiconductor device.

Figure 4:
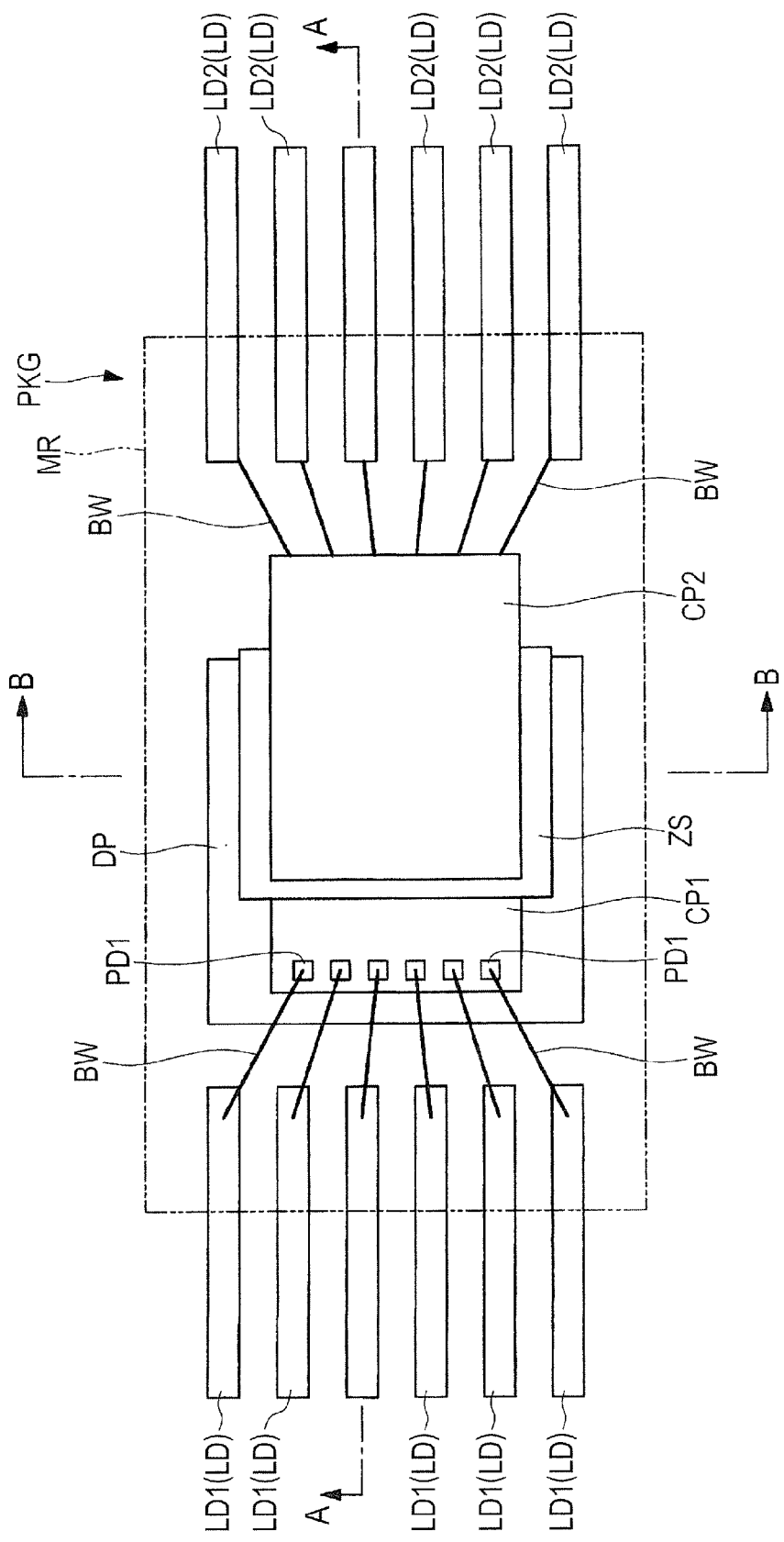
FIG. 4 is a perspective plan view of the semiconductor package in FIG. 3.
Figure 5:
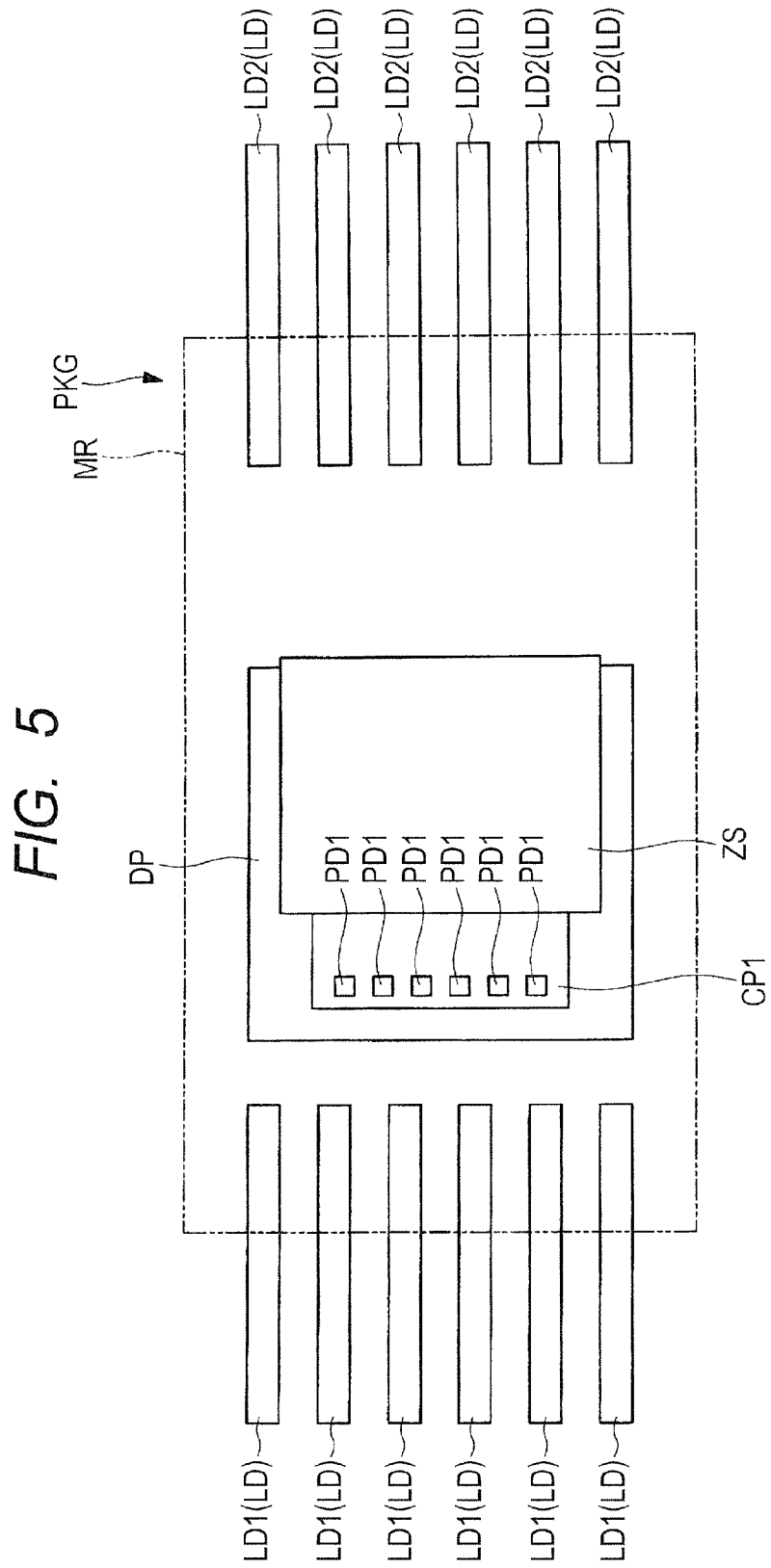
FIG. 5 is a perspective plan view of the semiconductor package in FIG. 3.
Figure 6:
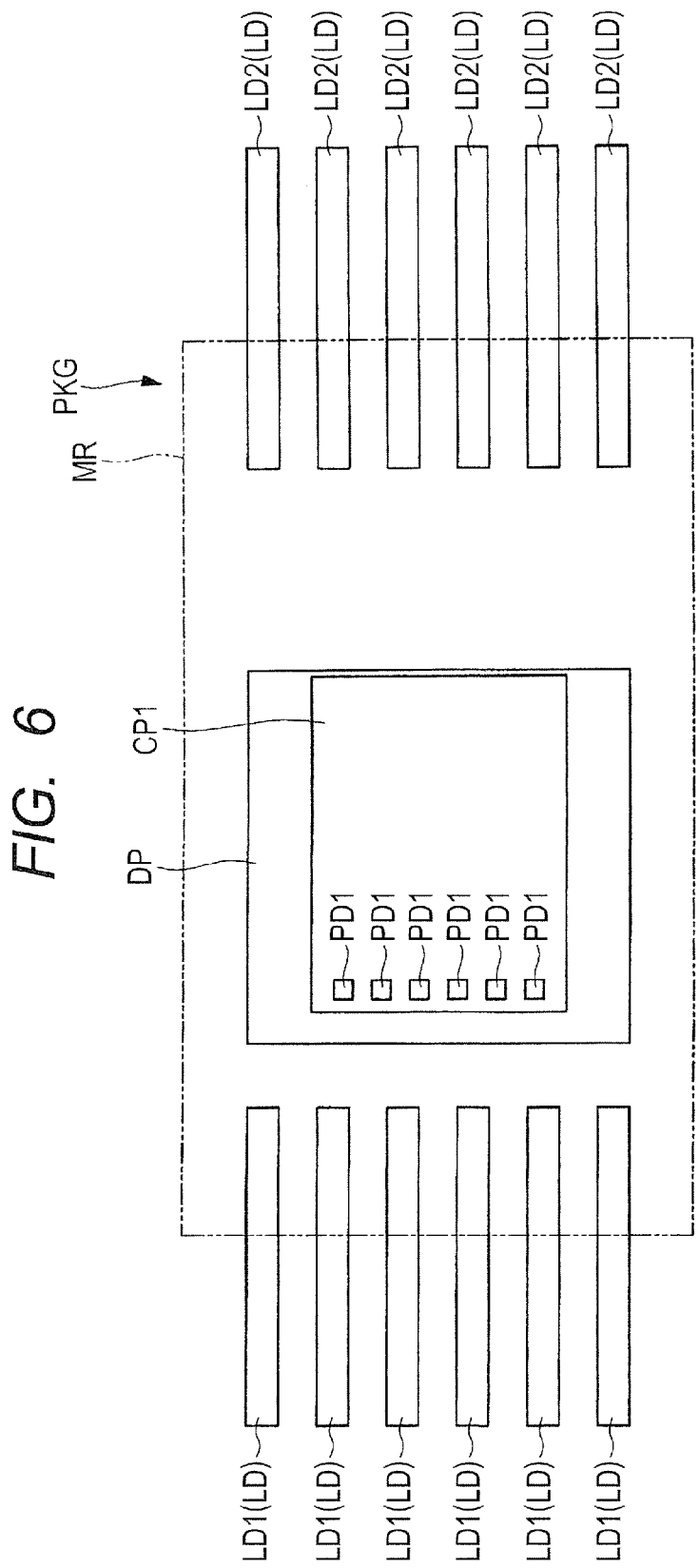
FIG. 6 is a perspective plan view of the semiconductor package in FIG. 3.
Figure 7:
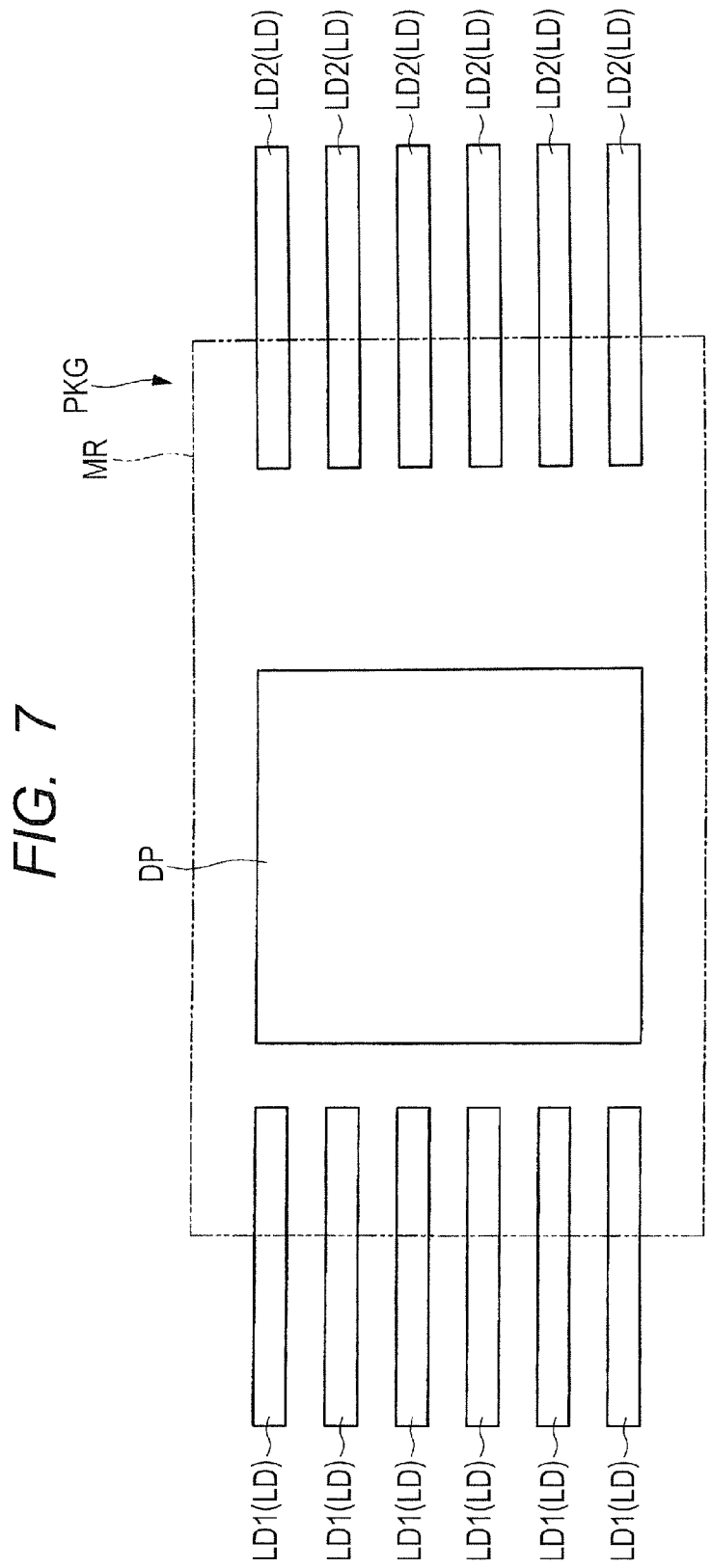
FIG. 7 is a perspective plan view of the semiconductor package in FIG. 3.
Figure 8:
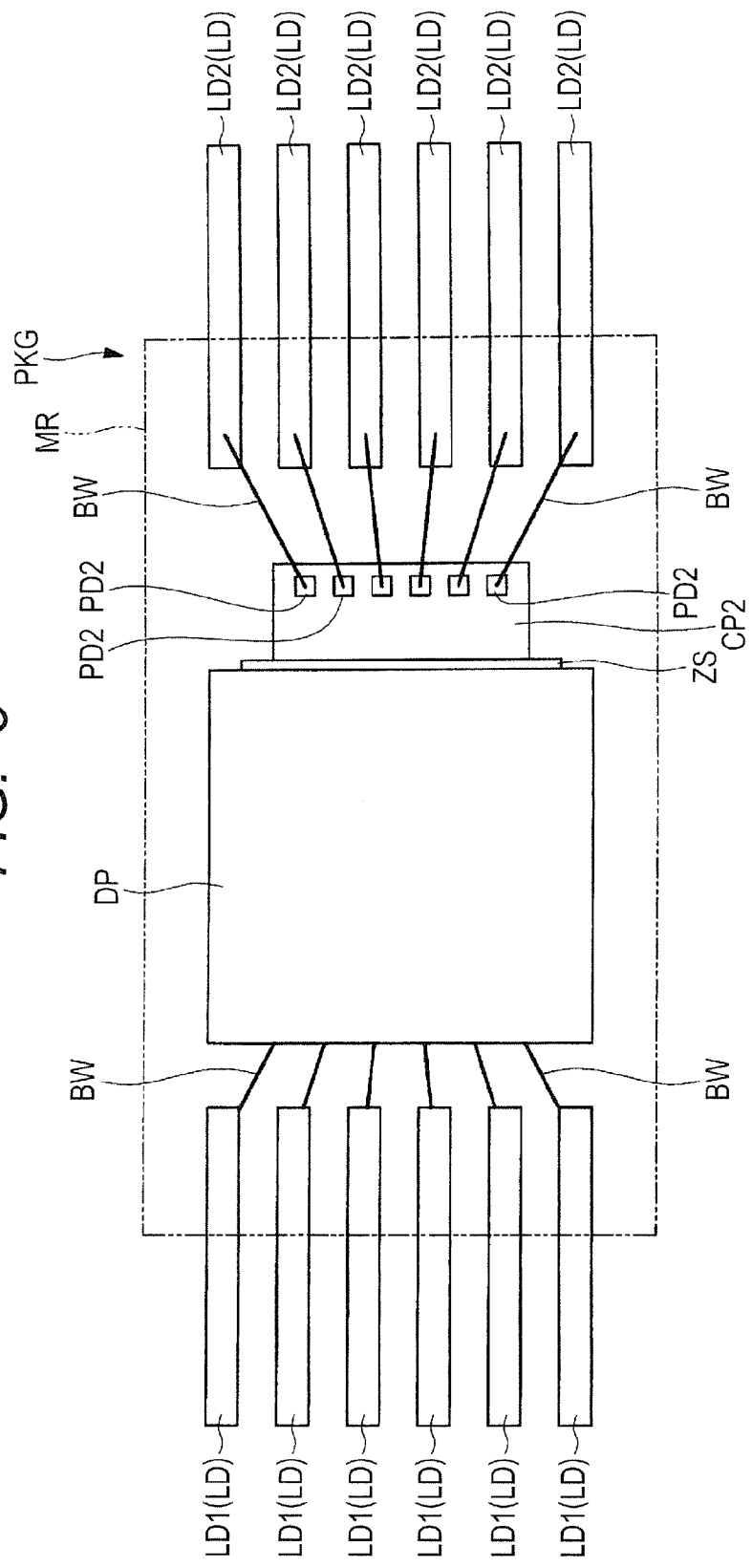
FIG. 8 is a perspective plan view of the semiconductor package in FIG. 3.
Figure 9:
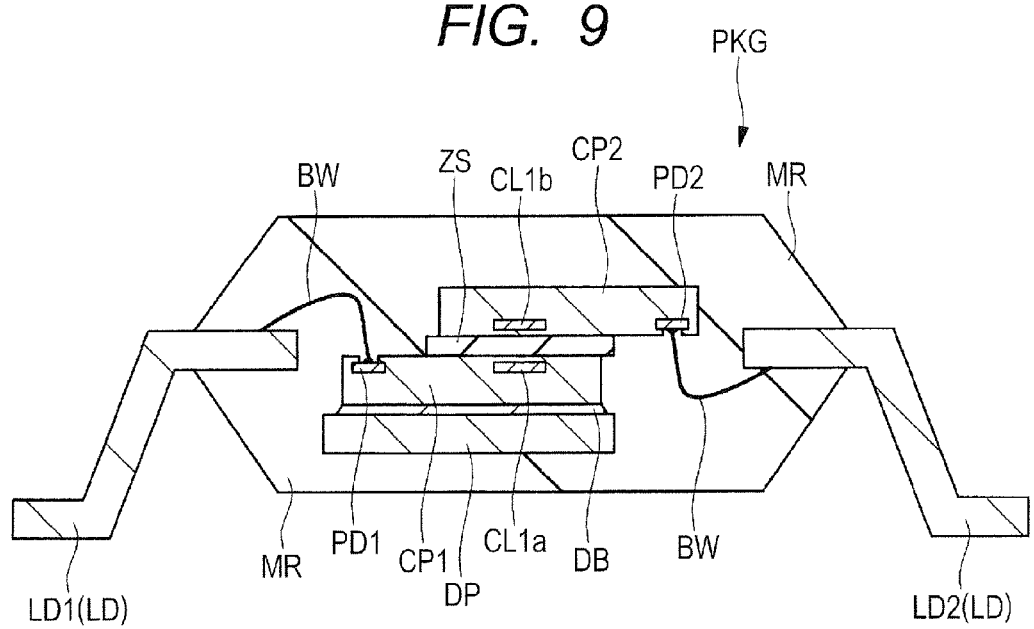
FIG. 9 is a cross-sectional view of the semiconductor package in FIG. 3.
Figure 10:
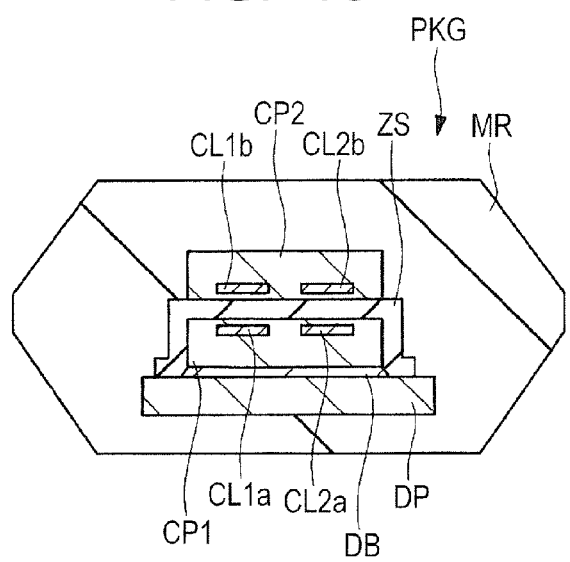
FIG. 10 is a cross-sectional view of the semiconductor package in FIG. 3.

FIGS. 3 to 8 are plan views each showing the semiconductor package (semiconductor device) PKG in the present embodiment. FIGS. 9 and 10 are cross-sectional views each showing the semiconductor package PKG in the present embodiment. Among FIGS. 3 to 8, FIG. 3 is a top view (upper-surface-side plan view) of the semiconductor package PKG. FIGS. 4 to 7 are perspective plan views when the semiconductor package PKG is transparently viewed from over the upper surface thereof. FIG. 8 is a perspective plan view when the semiconductor package PKG is transparently viewed from under the lower surface thereof. In FIG. 4, the semiconductor package PKG is viewed through a sealing resin portion MR, and the outer shape (outer periphery) of the sealing resin portion MR is shown by the two-dot-dash line. FIG. 5 corresponds to a perspective plan view obtained by removing the semiconductor chip CP2 and the wires BW from FIG. 4. FIG. 6 corresponds to a perspective plan view obtained by removing an insulating sheet ZS from FIG. 5. FIG. 7 corresponds to a perspective plan view obtained by removing the semiconductor chip CP1 from FIG. 6. In FIG. 8, in the same manner as in FIG. 4, the semiconductor package PKG is viewed through the sealing resin portion MR, and the outer shape (outer periphery) of the sealing resin portion MR is shown by the two-dot-dash line. However, in FIGS. 8 and 4, the semiconductor package PKG is viewed in opposite directions. A cross-sectional view along the line A-A in each of FIGS. 3 and 4 substantially corresponds to FIG. 9. A cross-sectional view along the line B-B in each of FIGS. 3 and 4 substantially corresponds to FIG. 10.

The semiconductor package PKG shown in FIGS. 3 to 10 includes the semiconductor chips CP1 and CP2. The following will specifically describe a configuration of the semiconductor package PKG.

The semiconductor package PKG shown in FIGS. 3 to 10 includes the semiconductor chips CP1 and CP2, a die pad DP mounting thereon the semiconductor chip CP1, the plurality of leads LD, the insulating sheet ZS interposed between the semiconductor chips CP1 and CP2, the plurality of wires BW coupling the semiconductor chip CP1 to the leads LD and coupling the semiconductor chip CP2 to the leads LD, and the sealing resin portion MR sealing therein the semiconductor chips CP1 and CP2, the die pad DP, the leads LD, the insulating sheet ZS, and the wires BW.

The sealing resin portion (sealing portion, sealing resin, or sealing body) MR as a sealing portion is made of a resin material such as, e.g., a thermosetting resin material or the like and can also include a filler or the like. By the sealing resin portion MR, the semiconductor chips CP1 and CP2, the die pad DP, the insulating sheet ZS, the plurality of leads LD, and the plurality of wires BW are sealed and electrically and mechanically protected. The two-dimensional shape (outer shape) of the sealing resin portion MR crossing the thickness thereof can be, e.g., a square (quadrilateral).

Over a top surface of the semiconductor chip CP1 serving as the main surface of the semiconductor chip CP1 where elements are formed, a plurality of pads (pad electrodes or bonding pads) PD1 are formed. The plurality of pads PD1 are the external coupling terminals of the semiconductor chip CP1. Each of the pads PD1 of the semiconductor chip CP1 is electrically coupled to a semiconductor integrated circuit (such as, e.g., the foregoing transmission circuit TX1 or the foregoing reception circuit RX2) formed in the semiconductor chip CP1.

Over a top surface of the semiconductor chip CP2 serving as the main surface of the semiconductor chip CP2 where elements are formed, a plurality of pads PD2 are formed. The plurality of pads PD2 are the external coupling terminals of the semiconductor chip CP2. Each of the pads PD2 of the semiconductor chip CP2 is electrically coupled to a semiconductor integrated circuit (such as, e.g., the foregoing transmission circuit TX2, the foregoing reception circuit RX1, or the foregoing drive circuit DR) formed in the semiconductor chip CP2.

Note that, of the semiconductor chip CP1, the main surface where the pads PD1 are formed is referred to as the top surface of the semiconductor chip CP1 and the main surface opposite thereto is referred to as the back surface of the semiconductor chip CP1. Also, of the semiconductor chip CP2, the main surface where the pads PD2 are formed is referred to as the top surface of the semiconductor chip CP2 and the main surface opposite thereto is referred to as the back surface of the semiconductor chip CP2. The respective top surfaces of the semiconductor chips CP1 and CP2 are formed mainly of the upper surfaces of insulating films PA described later.

The semiconductor chip CP1 is mounted (placed) over the upper surface of the die pad DP as a chip mounting portion such that the top surface of the semiconductor chip CP1 faces upward and the back surface of the semiconductor chip CP1 faces the upper surface of the die pad DP. The back surface of the semiconductor chip CP1 is bonded and fixed to the upper surface of the die pad DP via a die bonding material (adhesive material) DB.

The semiconductor chip CP2 is mounted (placed) over and fixed to the top surface of the semiconductor chip CP1 via the insulating sheet (insulating adhesive sheet) ZS such that the top surface of the semiconductor chip CP2 faces the top surface of the semiconductor chip CP1. That is, the semiconductor chip CP2 is mounted (placed) over the top surface of the semiconductor chip CP1 such that the top surface of the semiconductor chip CP2 faces the top surface of the semiconductor chip CP1 and the back surface of the semiconductor chip CP2 faces upward. Between the semiconductor chip CP2 (the top surface thereof) and the semiconductor chip CP1 (the top surface thereof), the insulating sheet ZS is interposed. The semiconductor chips CP1 and CP2 are spaced apart by a distance corresponding to the thickness of the insulating sheet ZS with the insulating sheet ZS being interposed therebetween and electrically insulated from each other.

In plan view, the semiconductor chips CP1 and CP2 partially overlap each other and, between the respective overlapping regions of the semiconductor chip CP2 (the top surface thereof) and the semiconductor chip CP1 (the top surface thereof), the insulating sheet ZS is interposed. That is, in plan view, not the entire top surface of the semiconductor chip CP1 overlaps the semiconductor chip CP2 and not the entire top surface of the semiconductor chip CP2 overlaps the semiconductor chip CP1. The semiconductor chip CP1 has the region overlapping the semiconductor chip CP2 in plan view and the region not overlapping the semiconductor chip CP2 in plan view. Also, the semiconductor chip CP2 has the region overlapping the semiconductor chip CP1 in plan view and the region not overlapping the semiconductor chip CP1 in plan view. Note that the wording "in plan view" corresponds to the case where an object is viewed in a plane generally parallel with the main surface of the semiconductor chip CP1, the main surface of the semiconductor chip CP2, or both of the main surfaces.

The semiconductor chip CP1 has the plurality of pads PD1. The plurality of pads PD1 are placed over the region of the top surface of the semiconductor chip CP1 which does not overlap the semiconductor chip CP2 in plan view. Consequently, the plurality of pads PD1 provided over the semiconductor chip CP1 are not covered with the insulating sheet ZS. On the other hand, the semiconductor chip CP2 has the plurality of pads PD2. The plurality of pads PD2 are placed over the region of the top surface of the semiconductor chip CP2 which does not overlap the semiconductor chip CP1 in plan view. Consequently, the plurality of pads PD2 provided over the semiconductor chip CP2 are not covered with the insulating sheet ZS.

From another perspective, the top surface of the semiconductor chip CP1 has a region facing the top surface of the semiconductor chip CP2 and a region not facing the top surface of the semiconductor chip CP2. The plurality of pads PD1 provided over the top surface of the semiconductor chip CP1 are placed over the region of the top surface of the semiconductor chip CP1 which does not face the top surface of the semiconductor chip CP2. In addition, the plurality of pads PD1 provided over the semiconductor chip CP1 are not covered with the insulating sheet ZS. On the other hand, the top surface of the semiconductor chip CP2 has a region facing the top surface of the semiconductor chip CP1 and a region not facing the top surface of the semiconductor chip CP1. The plurality of pads PD2 provided over the top surface of the semiconductor chip CP2 are placed over the region of the top surface of the semiconductor chip CP2 which does not face the top surface of the semiconductor chip CP1. In addition, the plurality of pads PD2 provided over the semiconductor chip CP2 are not covered with the insulating sheet ZS.

That is, the semiconductor chip CP1 has a region neither facing the semiconductor chip CP2 nor overlapping the insulating sheet ZS and, over the region (region neither facing the semiconductor chip CP2 nor overlapping the insulating sheet ZS), the plurality of pads PD1 are placed. On the other hand, the semiconductor chip CP2 has a region neither facing the semiconductor chip CP1 nor overlapping the insulating sheet ZS and, over the region (region neither facing the semiconductor chip CP1 nor overlapping the insulating sheet ZS), the plurality of pads PD2 are placed.

Since the plurality of pads PD1 of the semiconductor chip CP1 neither overlap (neither face) the semiconductor chip CP2 nor are covered with the insulating sheet ZS, the wires BW can be coupled to the pads PD1. On the other hand, since the plurality of pads PD2 of the semiconductor chip CP2 neither overlap (neither face) the semiconductor chip CP1 nor are covered with the insulating sheet ZS, the wires BW can be coupled to the pads PD2.

The insulating sheet ZS is a sheet-like (film-like) member made of an insulating material. The insulating sheet ZS has adhesion and, e.g., a DAF (Die Attach Film) can be used as the insulating sheet ZS. To one of the main surfaces of the insulating sheet ZS located opposite to each other, the top surface of the semiconductor chip CP1 is bonded while, to the other main surface thereof, the top surface of the semiconductor chip CP2 is bonded. Thus, the insulating sheet ZS also has the function of bonding or fixing the semiconductor chips CP1 and CP2 to each other.

As the material of the insulating sheet ZS, e.g., a thermosetting resin or a thermoplastic resin can be used. Of these resins, the thermoplastic resin is more preferably used as the material of the insulating sheet ZS. The semiconductor chips CP1 and CP2 are stacked with the insulating sheet ZS interposed therebetween. The thickness of the insulating sheet ZS is less likely to change from the initial thickness thereof when the thermoplastic resin is used as the material of the insulating sheet ZS than when the thermosetting resin is used as the material of the insulating sheet ZS. Accordingly, a sufficient dielectric breakdown voltage is more likely to be ensured between the semiconductor chips CP1 and CP2 when the thermoplastic resin is used as the material of the insulating sheet ZS than when the thermosetting resin is used as the material of the insulating sheet ZS.

The leads LD are each formed of a conductor. Preferably, the leads LD are made of a metal material such as copper (Cu) or a copper alloy. Each of the leads LD includes an inner lead portion as the portion of the lead LD which is located in the sealing resin portion MR and an outer lead portion as the portion of the lead LD which is located outside the sealing resin portion MR. The outer lead portion of the lead LD protrudes from the side surface of the sealing resin portion MR to the outside of the sealing resin portion MR. The spaces between the inner lead portions of the adjacent leads LD are filled with the material forming the sealing resin portion MR. The outer lead portion of each of the leads LD can function as the external coupling terminal portion (external terminal) of the semiconductor package PKG. The outer lead portion of each of the leads LD has been bent such that the lower surface of the outer lead portion in the vicinity of the end portion thereof is located slightly below the lower surface of the sealing resin portion MR.

In another form, it is also possible not to bend the outer lead portion of each of the leads LD. In that case, the outer lead portion of each of the leads LD is allowed to protrude from the side surface of the sealing resin portion MR and extend in a direction parallel with the lower or upper surface of the sealing resin portion MR.

The pads PD1 over the top surface of the semiconductor chip CP1 and the pads PD2 over the top surface of the semiconductor chip CP2 are electrically coupled to the respective inner lead portions of the leads LD via the wires BW each as a conductive coupling member.

It is assumed herein that, of the plurality of leads LD of the semiconductor package PKG, the leads LD electrically coupled to the pads PD1 of the semiconductor chip CP1 via the wires BW are each designated by a reference numeral LD1 and referred to as the leads LD1. It is also assumed that, of the plurality of leads LD of the semiconductor package PKG, the leads LD electrically coupled to the pads PD2 of the semiconductor chip CP2 via the wires BW are each designated by a reference numeral LD2 and referred to as the leads LD2.

That is, the pads PD1 over the top surface of the semiconductor chip CP1 are electrically coupled to the respective inner lead portions of the leads LD1 via the wires BW, while the pads PD2 over the top surface of the semiconductor chip CP2 are electrically coupled to the respective inner lead portions of the leads LD2 via the wires BW. In short, the wires BW having one ends coupled to the individual pads PD1 over the top surface of the semiconductor chip CP1 have the other ends coupled to the respective upper surfaces of the inner lead portions of the leads LD1. Also, the wires BW having one ends coupled to the individual pads PD2 over the top surface of the semiconductor chip CP2 have the other ends coupled to the respective lower surfaces of the inner lead portions of the leads LD2.

Note that the leads LD1 coupled to the pads PD1 of the semiconductor chip CP1 via the wires BW are different from the leads LD2 coupled to the pads PD2 of the semiconductor chip CP2 via the wires BW. The pads PD1 of the semiconductor chip CP1 are not coupled to the pads PD2 of the semiconductor chip CP2 via the wires BW. Thus, the pads PD1 of the semiconductor chip CP1 are not coupled to the pads PD2 of the semiconductor chip CP2 via conductors.

In the rectangle (quadrilateral) forming the two-dimensional shape of the sealing resin portion MR, the plurality of leads LD1 and the plurality of leads LD2 are arranged along the sides (side surfaces) opposite to each other.

The wires (bonding wires) BW are conductive coupling members (members for coupling). More specifically, the wires BW are conductive wires and made of metal thin wires such as, e.g., gold (Au) wires or copper (Cu) wires. The wires BW are sealed in the sealing resin portion MR and are not exposed from the sealing resin portion MR.

As described above, the semiconductor chips CP1 and CP2 are placed to face each other with the insulating sheet ZS being interposed therebetween such that the respective top surfaces of the semiconductor chips CP1 and CP2 face each other. In the semiconductor chip CP1, the coils CL1$a$ and CL2$a$ described above are formed while, in the semiconductor chip CP2, the coils CL1$b$ and CL2$b$ described above are formed. The coil CL1$a$ formed in the semiconductor chip CP1 and the coil CL1$b$ formed in the semiconductor chip CP2 overlap each other in plan view. The coil CL2$a$ formed in the semiconductor chip CP1 and the coil CL2$b$ formed in the semiconductor chip CP2 overlap each other in plan view. That is, the semiconductor chips CP1 and CP2 are placed to face each other via the insulating sheet ZS such that the coil CL1$a$ formed in the semiconductor chip CP1 and the coil CL1$b$ formed in the semiconductor chip CP2 face each other and the coil CL2$a$ formed in the semiconductor chip CP1 and the coil CL2$b$ formed in the semiconductor chip CP2 face each other.

The coil CL1$a$ formed in the semiconductor chip CP1 and the coil CL1$b$ formed in the semiconductor chip CP2 are magnetically coupled (inductively coupled) to form the foregoing transformer TR1. The coil CL2$a$ formed in the semiconductor chip CP1 and the coil CL2$b$ formed in the semiconductor chip CP2 are magnetically coupled (inductively coupled) to form the foregoing transformer TR2.

Between the coil CL1$a$ in the semiconductor chip CP1 and the coil CL1$b$ in the semiconductor chip CP2, the insulating film (corresponding to the insulating film PA described later) included in the semiconductor chip CP1, the insulating film (corresponding to the insulating film PA described later) included in the semiconductor chip CP2, and the insulating sheet ZS are interposed. Also, between the coil CL2$a$ in the semiconductor chip CP1 and the coil CL2$b$ in the semiconductor chip CP2, the insulating film (corresponding to the insulating film PA described later) included in the semiconductor chip CP1, the insulating film (corresponding to the insulating film PA described later) included in the semiconductor chip CP2, and the insulating sheet ZS are interposed. Consequently, the coil CL1$a$ in the semiconductor chip CP1 and the coil CL1$b$ in the semiconductor chip CP2 are not connected via a conductor. Also, the coil CL2$a$ in the semiconductor chip CP1 and the coil CL2$b$ in the semiconductor chip CP2 are not connected via a conductor.

The transmission of an electric signal between the semiconductor chips CP1 and CP2 is performed only via the transformers TR1 and TR2. That is, only the signal transmitted from the circuit (such as the foregoing transmission circuit TX1) formed in the semiconductor chip CP1 by electromagnetic induction via the coil CL1$a$ (primary coil) in the semiconductor chip CP1 and the coil CL1$b$ (secondary coil) in the semiconductor chip CP2 is transmitted to the semiconductor chip CP2 (the foregoing reception circuit RX1). Also, only the signal transmitted from the circuit (such as the foregoing transmission circuit TX2) formed in the semiconductor chip CP2 by electromagnetic induction via the coil CL2a (primary coil) in the semiconductor chip CP2 and the coil CL2b (secondary coil) in the semiconductor chip CP1 is transmitted to the semiconductor chip CP1 (the foregoing reception circuit RX2).

<About Manufacturing Process of Semiconductor Package>

Figure 11:
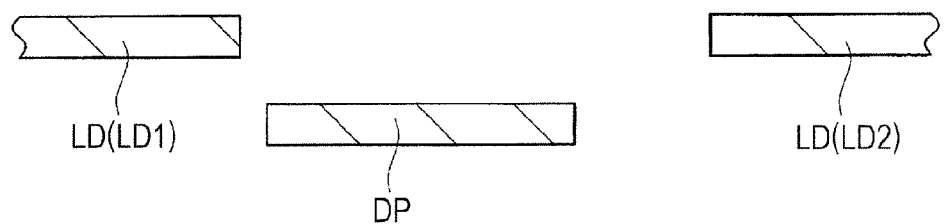
FIG. 11 is a cross-sectional view of the semiconductor package in FIG. 3 during the manufacturing process thereof.

Next, referring to FIGS. 11 to 16, a description will be given of an example of the manufacturing process of the semiconductor package PKG. FIG. 11 is a cross-sectional view of the semiconductor package PKG during the manufacturing process thereof and shows a cross section corresponding to FIG. 9 described above.

For example, the semiconductor package PKG can be manufactured as follows.

That is, first, as shown in FIG. 11, a lead frame in which the die pad DP and the plurality of leads LD are connected to a framework is provided (prepared). Also, the semiconductor chips CP1 and CP2 are provided (prepared). The manufacturing process (provision process) of the semiconductor chips CP1 and CP2 will be described later in greater detail.

Figure 12:
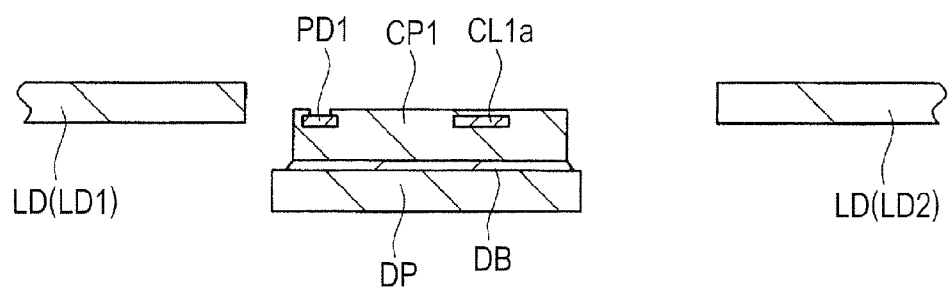
FIG. 12 is a cross-sectional view of the semiconductor package during the manufacturing process thereof, which is subsequent to FIG. 11.

Next, as shown in FIG. 12, a die bonding step is performed to mount the semiconductor chip CP1 over the die pad DP of the lead frame via the die bonding material (adhesive material) DB and join the semiconductor chip CP1 thereto. At this time, the back surface of the semiconductor chip CP1 is bonded to the upper surface of the die pad DP with the die bonding material DB such that the back surface of the semiconductor chip CP1 faces the upper surface of the die pad DP. This achieves a state where the semiconductor chip CP1 is mounted over and fixed to the die pad DP as the chip mounting portion.

Figure 13:
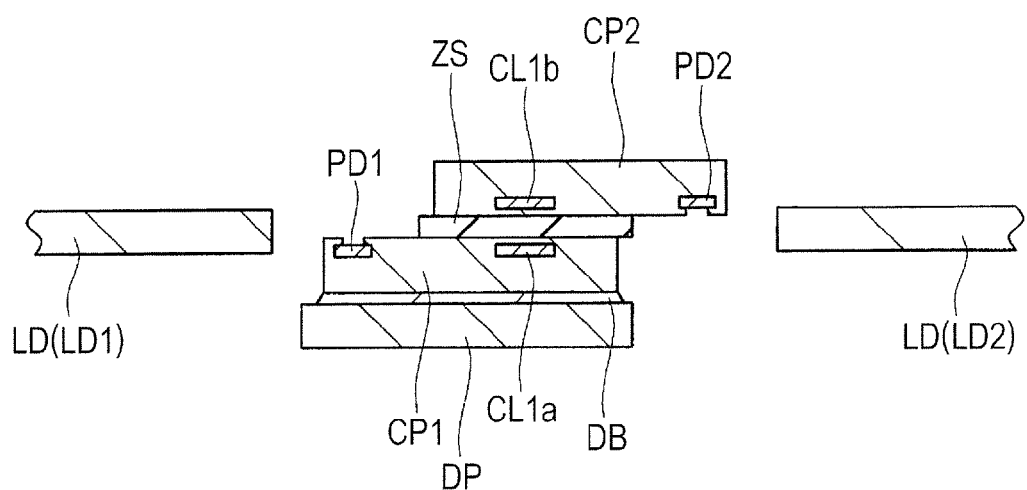
FIG. 13 is a cross-sectional view of the semiconductor package during the manufacturing process thereof, which is subsequent to FIG. 12.

Next, as shown in FIG. 13, the semiconductor chip CP2 is mounted over and fixed to the top surface of the semiconductor chip CP1 via the insulating sheet ZS such that the top surface of the semiconductor chip CP2 faces the top surface of the semiconductor chip CP1. This achieves a state where the semiconductor chips CP1 and CP2 are stacked via the insulating sheet ZS, and the coils (CL1a and CL2a) in the semiconductor chip CP1 and the coils (CL1b and CL2b) in the semiconductor chip CP2 are magnetically coupled to each other. At this time, it is appropriate to stick the insulating sheet ZS to the top surface of the semiconductor chip CP1 and then mount the semiconductor chip CP2 over the insulating sheet ZS or stick the insulating sheet ZS to the top surface of the semiconductor chip CP2 and then stick the opposite surface (surface opposite to the surface to which the semiconductor chip CP1 has been stuck) of the insulating sheet ZS to the top surface of the semiconductor chip CP1.

The description has been given heretofore of the case where the semiconductor chip CP1 is mounted over the die pad DP of the lead frame via the die bonding material DB and then the semiconductor chip CP2 is mounted over the semiconductor chip CP1 mounted over the die pad DP via the insulating sheet ZS. In another embodiment, it is also possible to stick the semiconductor chips CP1 and CP2 to each other via the insulating sheet ZS with the respective top surfaces thereof facing each other and then join the back surface of the semiconductor chip CP1 stuck to the semiconductor chip CP2 via the insulating sheet ZS to the die pad DP of the lead frame via the die bonding material DB.

The process step in FIG. 13 can be regarded as the step of stacking the semiconductor chips CP1 and CP2 via the insulating sheet ZS. In the step in FIG. 13, the semiconductor chips CP1 and CP2 are stacked via the insulating sheet ZS such that the coils (CL1a and CL2a) in the semiconductor chip CP1 are magnetically coupled to the coils (CL1b and CL2b) in the semiconductor chip CP2 with the respective insulating films PA of the semiconductor chips CP1 and CP2 described later facing each other.

Figure 14:
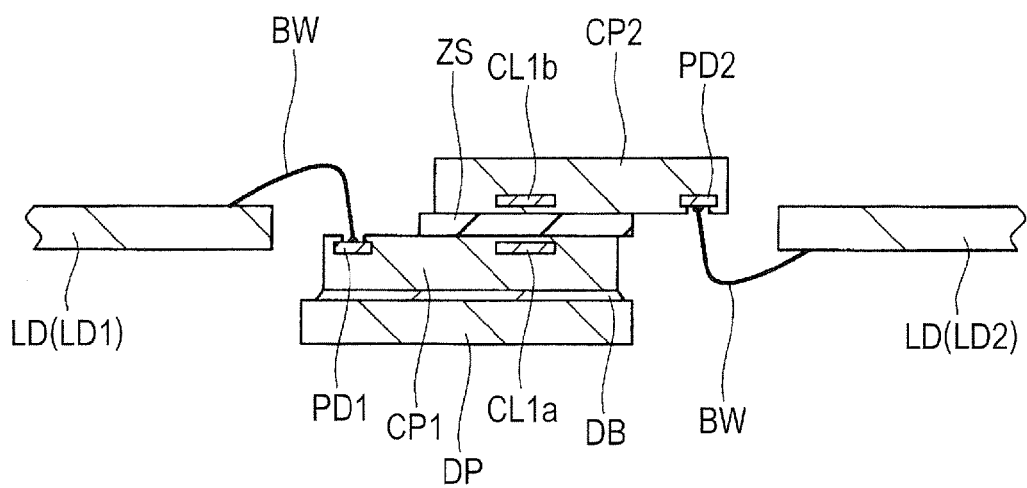
FIG. 14 is a cross-sectional view of the semiconductor package during the manufacturing process thereof, which is subsequent to FIG. 13.

Next, as shown in FIG. 14, a wire bonding step is performed to couple the plurality of pads PD1 and PD2 of the semiconductor chips CP1 and CP2 to the plurality of leads LD with the plurality of wires (conductive coupling members) BW. At this time, it is appropriate to, e.g., couple the plurality of pads PD1 over the top surface of the semiconductor chip CP1 to the plurality of leads LD1 via the plurality of wires BW and then invert the lead frame and couple the plurality of pads PD2 over the top surface of the semiconductor chip CP2 to the plurality of leads LD2 via the plurality of wires BW. Alternatively, it is also possible to reverse the order in which wire bonding is performed on the semiconductor chips CP1 and CP2 by first coupling the plurality of pads PD2 over the top surface of the semiconductor chip CP2 to the plurality of leads LD2 via the plurality of wires BW and then coupling the plurality of pads PD1 over the top surface of the semiconductor chip CP1 to the plurality of leads LD1 via the plurality of wires BW. By performing the wire bonding step, the plurality of pads PD1 of the semiconductor chip CP1 are electrically coupled to the plurality of leads LD1 via the plurality of wires BW, and the plurality of pads PD2 of the semiconductor chip CP2 are electrically coupled to the plurality of leads LD2 via the other plurality of wires BW.

Figure 15:
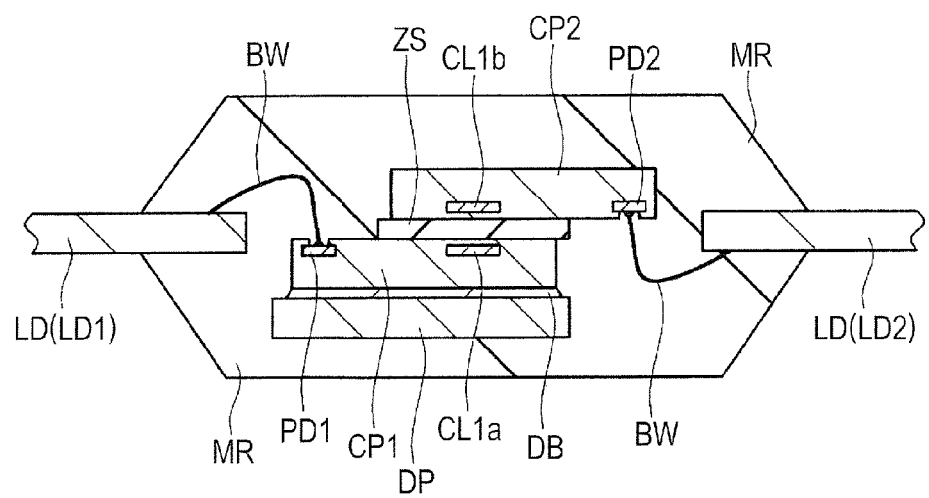
FIG. 15 is a cross-sectional view of the semiconductor package during the manufacturing process thereof, which is subsequent to FIG. 14.

Next, as shown in FIG. 15, a resin sealing step is performed to form the sealing resin portion MR which seals the semiconductor chips CP1 and CP2, the die pads DP, the insulating sheet ZS, the plurality of leads LD, and the plurality of wires BW.

Figure 16:
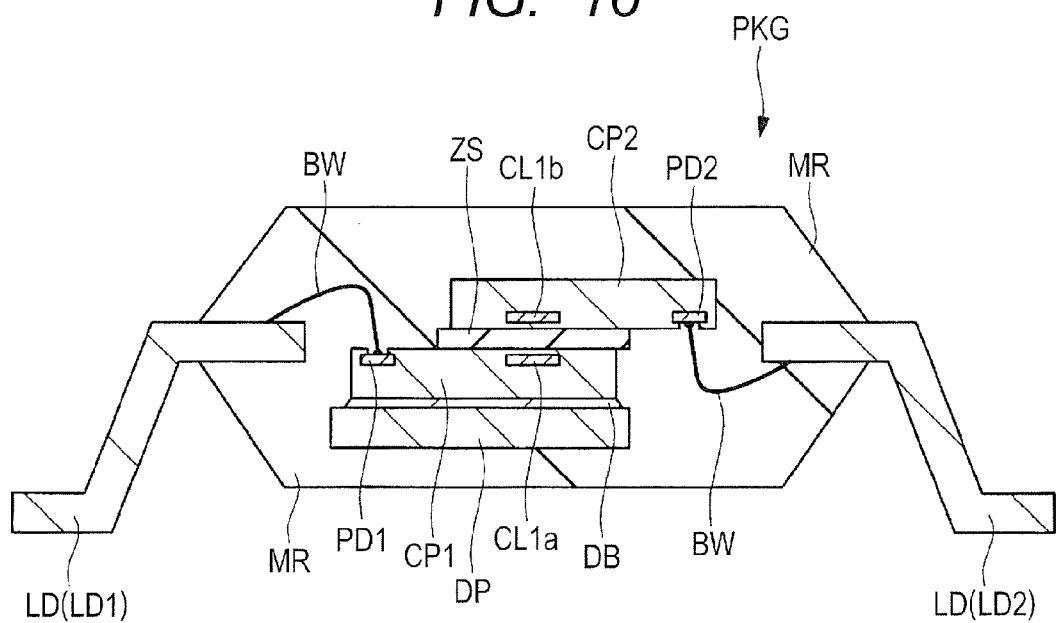
FIG. 16 is a cross-sectional view of the semiconductor package during the manufacturing process thereof, which is subsequent to FIG. 15.

Next, the plurality of leads LD having the respective inner lead portions sealed in the sealing resin portion MR are cut from the framework of the lead frame. Then, as shown in FIG. 16, the outer lead portions of the plurality of leads LD are subjected to bending. In this manner, the semiconductor package PKG can be manufactured. There may also be a case where the bending of the leads LD is not performed. Each of the leads LD has at least one portion exposed from the sealing resin portion MR which functions as the external terminal of the semiconductor package PKG.

Note that the description has been given heretofore of the case where the semiconductor chip CP1 is mounted over the die pad DP in the semiconductor package PKG. However, in another form, it is also possible to switch the semiconductor chips CP1 and CP2 to each other in the semiconductor package PKG. In that case, over the die pad DP, the semiconductor chip CP2 is mounted.

Also, the description has been given heretofore of the case where the package form of the semiconductor package PKG is a SOP (Small Outline Package) by way of example. However, the semiconductor package PKG is also applicable to a package form other than the SOP.

In either case, the manufacturing process of the semiconductor package includes the step of providing the semiconductor chip CP1, the step of providing the semiconductor chip CP2, and stacking the semiconductor chips CP1 and CP2 via the insulating sheet ZS.

Here, a description will be given of examples of the applications of a product in which the semiconductor package PKG is mounted. Examples of the applications of the product include the motor control unit of an automobile or a household electrical appliance such as a washer, a switching power supply, an illumination controller, a solar power generation controller, a mobile phone, and a mobile communication device.

For example, in an automotive application, the semiconductor chip CP1 is a lower-voltage chip to which a low power supply voltage is supplied. The voltage supplied at that time is, e.g., about 5 V. On the other hand, the power supply voltage of an object (such as an inverter INV described later) to be driven by the drive circuit DR is a high voltage of, e.g., 600 V to 1000 V or higher. The higher voltage may possibly be supplied from the object to be driven (such as the inverter INV described later) to the semiconductor chip CP2.

<About Electronic System Using Semiconductor Device>

Figure 17:
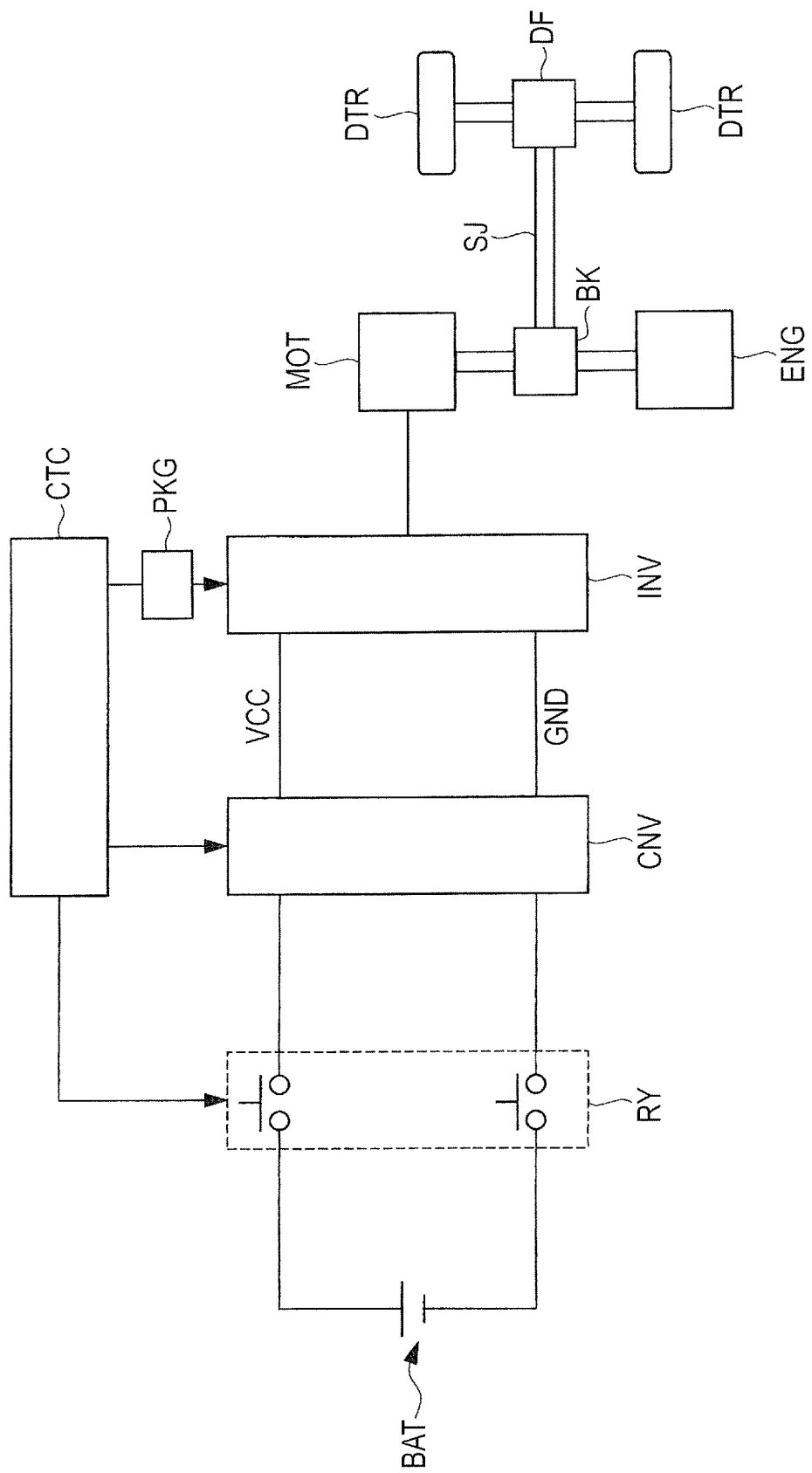
FIG. 17 is an illustrative view showing an example of an electronic system using the semiconductor device in the embodiment.

Next, a description will be given of an example of an electronic system (electronic device) using the semiconductor package (semiconductor device) PKG in the present embodiment. FIG. 17 is an illustrative view (circuit block diagram) showing an example of an electronic system (electronic device) using the semiconductor package PKG in the present embodiment, which is an electric automobile system herein.

The electronic system (which is the electric automobile system herein) shown in FIG. 17 has a load such as a motor MOT, the inverter (inverter circuit) INV, a power supply BAT, and a control unit (control circuit or controller) CTC. As the motor MOT, e.g., a 3-phase motor or the like can be used. The 3-phase motor is configured to be driven with three-phase voltages in different phases. The foregoing semiconductor package PKG is coupled between the control unit CTC and the inverter INV.

In the electronic system (which is the electric automobile system) in FIG. 17, the power supply BAT is coupled to the inverter INV via a relay RY and a converter (boosting converter) CNV such that the voltage (power) of the power supply BAT is supplied to the inverter INV. Since the converter CNV is interposed between the power supply BAT and the inverter INV, the voltage (dc voltage) of the power supply BAT is converted (boosted) to a voltage appropriate for driving the motor in the converter CNV and then supplied to the inverter INV. The relay RY is interposed between the power supply BAT and the converter CNV. Using the relay RY, it is possible to switch between a coupled state and a non-coupled state between the power supply BAT and the converter CNV.

To the inverter INV, the motor MOT is coupled. The dc voltage (dc power) supplied from the power supply BAT to the inverter INV via the converter CNV is converted to an ac voltage (ac power) in the inverter INV and supplied to the motor MOT. The motor MOT is driven with the ac voltage (ac power) supplied from the inverter INV.

The motor MOT can rotate (drive) the tires (wheels) of an automobile or the like.

For example, in the case of a hybrid automobile, the output shaft of the motor MOT and the output shaft of the engine ENG are combined with each other in a power distribution mechanism BK and the torque thereof is transmitted to an axle SJ. The axle SJ operates in association with a drive wheel DTR via differentials DF. In such a case as where a large drive force is required, the motor MOT is driven in conjunction with the engine ENG. The output torques thereof are combined in the power distribution mechanism BK and transmitted to the drive wheel DTR via the axle SJ to be able to drive the drive wheel DTR. In such a case as where the required drive force is not so large (e.g., when the automobile runs at a given speed), it is possible to stop the engine ENG and drive the drive wheel DTR only with the motor MOT. In the case of a hybrid automobile, the engine ENG is also needed in addition to the motor MOT. However, in the case of an electric automobile having no engine, the engine ENG can be omitted.

To the inverter INV, the control unit CTC is coupled via the semiconductor package PKG to allow the control unit CTC to control the inverter INV. That is, from the power supply BAT, a dc voltage (dc power) is supplied to the inverter INV and converted to an ac voltage (ac power) by the inverter INV controlled by the control unit CTC, which is supplied to the motor MOT to be able to drive the motor MOT. The control unit CTC is comprised of, e.g., an ECU (Electronic Control Unit) and has an embedded control semiconductor chip such as an MCU (Micro Controller Unit). The relay RY and the converter CNV can also be controlled by the control unit CTC.

However, the control unit CTC and the inverter INV do not directly perform signal transmission therebetween. Between the control unit CTC and the inverter INV, the foregoing semiconductor package PKG is interposed. That is, the signal transmission between the control unit CTC and the inverter INV is performed via the semiconductor package PKG. In the electronic system (which is the electric automobile system) in FIG. 17, the foregoing control circuit CC in FIG. 1 described above corresponds to the control unit CTC in FIG. 17, and the foregoing load LOD in FIG. 1 described above corresponds to the inverter INV in FIG. 17. The foregoing leads LD1 of the semiconductor package PKG are coupled to the control unit CTC, and the foregoing leads LD2 of the semiconductor package PKG are coupled to the inverter INV. When the foregoing drive circuit DR in FIG. 1 described above is embedded in the semiconductor chip outside the semiconductor package PKG, it follows that the semiconductor chip (semiconductor chip having the embedded drive circuit DR) is interposed between the semiconductor package PKG and the inverter INV in FIG. 17. In response to the signal (control signal) transmitted from the control unit CTC to the drive circuit DR via the foregoing transmission circuit TX1, the foregoing transformer TR1, and the foregoing reception circuit RX1, the drive circuit DR outputs a signal (control signal or drive signal) for controlling or driving the inverter INV and the signal (control signal or drive signal) is input to the inverter INV. The control unit CTC can control the inverter INV via the semiconductor package PKG.

The inverter INV has power semiconductor elements (power transistors). Examples of the power semiconductor elements include IGBTs (Insulated Gate Bipolar Transistors) and the like. For example, in the case where the motor MOT is a 3-phase motor, the inverter INV has six IGBTs corresponding to the three phases. To each of the power semiconductor elements of the inverter INV, a signal (control signal or drive signal) is input from the drive circuit DR. In the case where the power semiconductor elements of the inverter INV are IGBTs, the signal (control signal or drive signal) from the drive circuit DR is input to the gate electrode of each of the IGBT. The control unit CTC controls the power semiconductor elements (e.g., IGBTs) of the inverter INV via the semiconductor package PKG and can thus control the inverter INV.

By controlling the currents flowing in the power semiconductor elements (such as IGBTs) of the inverter INV using the control unit CTC, the motor MOT is driven (rotated). That is, by controlling the turning ON/OFF of the power semiconductor elements (e.g., IGBTs) of the inverter INV using the control unit CTC, the motor MOT can be driven.

As described above, the semiconductor package PKG has the foregoing semiconductor chips CP1 and CP2 embedded therein, but the semiconductor chips CP1 and CP2 have different voltage levels (reference potentials). For example, to drive or control the inverter INV, the drive circuit DR is coupled to the inverter INV, and the reference potential (voltage level) of the semiconductor chip CP may rise to a voltage substantially equal to the power supply voltage VCC of the inverter INV to be driven. The power supply voltage VCC is considerably high (e.g., about several hundreds of volts to about several thousands of volts). The same applies also to the case where the drive circuit DR is embedded in a semiconductor chip other than the semiconductor chip CP2. This produces a large voltage level (reference potential) difference between the semiconductor chips CP1 and CP2. That is, to the semiconductor chip CP2, a voltage (e.g., about several hundreds of volts to several thousands of volts) higher than the power supply voltage (e.g., about several volts to several tens of volts) supplied to the semiconductor chip CP1 may be supplied from the inverter INV.

However, as described above, what is electrically transmitted between the semiconductor chips CP1 and CP2 is the signal transmitted from the primary coil (CL1a) in the semiconductor chip CP1 to the secondary coil (CL1b) in the semiconductor chip CP2 by electromagnetic induction or the signal transmitted from the primary coil (CL2b) in the semiconductor chip CP2 to the secondary coil (CL2a) in the semiconductor chip CP1 by electromagnetic induction. Accordingly, even when the respective voltage levels (reference potentials) of the semiconductor chips CP1 and CP2 are different, it is possible to properly prevent the voltage level (reference potential) of the semiconductor chip CP2 from being input to the semiconductor chip CP1 or prevent the voltage level (reference potential) of the semiconductor chip CP1 from being input to the semiconductor chip CP2. That is, even when the reference potential (voltage level) of the semiconductor chip CP2 has risen to a voltage substantially equal to the power supply voltage VCC (e.g., several hundreds of volts to several thousands of volts) of the inverter INV to be driven, it is possible to properly prevent the reference potential of the semiconductor chip CP2 from being input to the semiconductor chip CP1. Therefore, it is possible to properly transmit an electric signal between the semiconductor chips CP1 and CP2 having the different voltage levels (reference potentials).

In an electric automobile system, when the rise and drop of an ambient temperature is repeated, it is necessary to prevent the insulating sheet ZS from peeling off the semiconductor chip (CP1 or CP2) due to a thermal stress. For example, in an environmental temperature test based on the quality reference AEC-Q100, the electric automobile system is required to have a durability of 500 cycles or more at −65° C. to 150° C. in a temperature cycle test. In the present embodiment, even in such an environment, it is possible to prevent the insulating sheet ZS from peeling off the semiconductor chip (CP1 or CP2).

It is also possible to enhance the reliability of the semiconductor chips CP1 and CP2. Accordingly, it is also possible to improve the reliability of the semiconductor package PKG. Therefore, it is also possible to improve the reliability of the electronic device using the semiconductor package PKG.

Since signal transmission between the semiconductor chips is performed using the magnetically coupled coils, the size of the semiconductor package PKG can be reduced.

In the case where the power supply voltage VCC is increased, it is accordingly necessary to increase the breakdown voltage of the semiconductor package PKG, i.e., the breakdown voltage between the semiconductor chips CP1 and CP2 in the semiconductor package PKG. By contrast, in the present embodiment, as will be described later, it is possible to improve the breakdown voltage between the semiconductor chips CP1 and CP2 in the semiconductor package PKG and consequently improve the breakdown voltage of the semiconductor package PKG. Since the breakdown voltage of the semiconductor package PKG (breakdown voltage between the semiconductor chips CP1 and CP2) has successively been improved, the power supply voltage VCC converted (boosted) by the converter CNV and supplied to the inverter INV can be increased. By thus increasing the power supply voltage VCC supplied to the inverter INV, a current allowed to flow in the motor MOT can be increased and the speed (rotating speed) of the motor MOT can be improved.

<About Structure of Semiconductor Chip>

Figure 18:
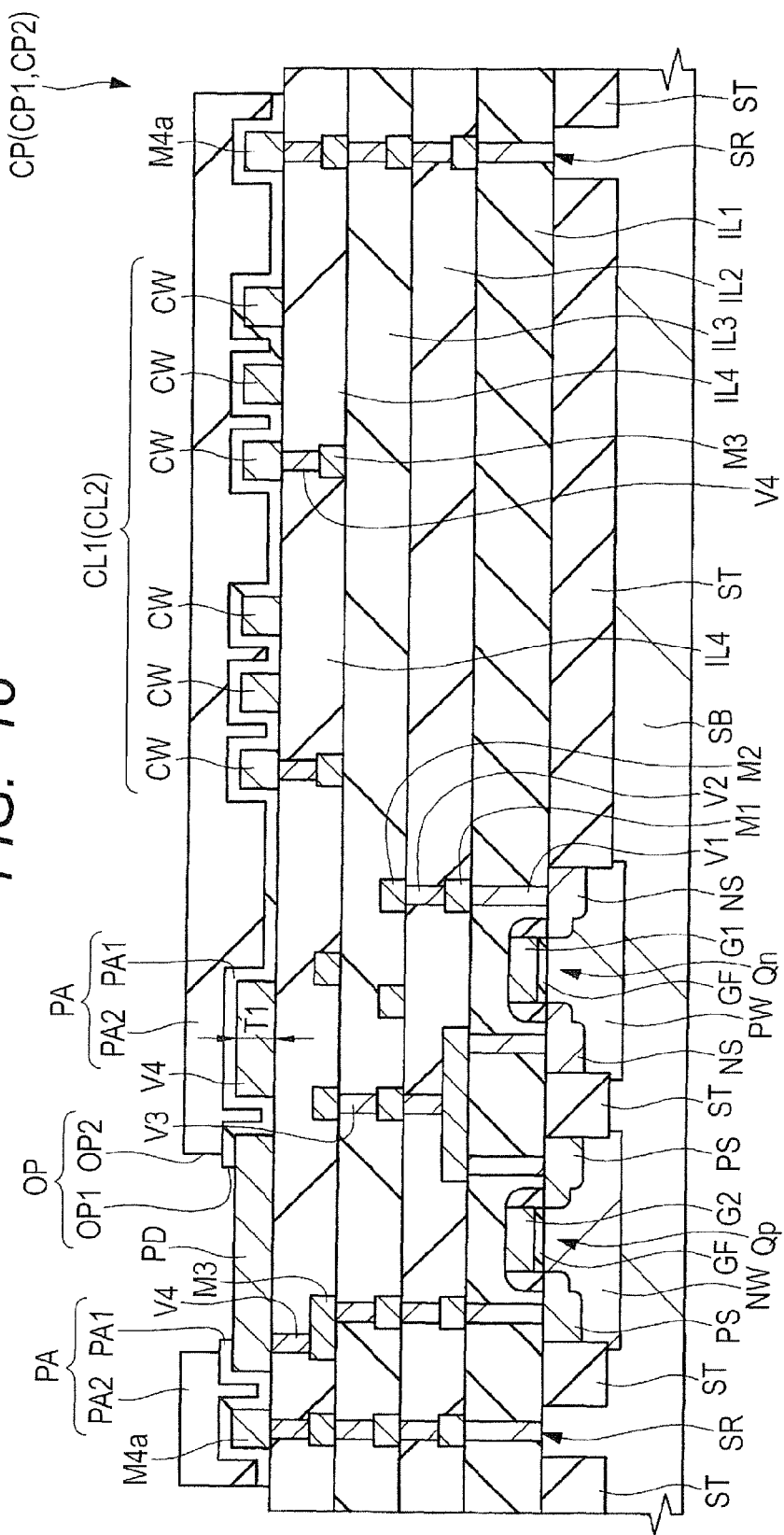
FIG. 18 is a cross-sectional view of a semiconductor chip in the embodiment.
Figure 19:
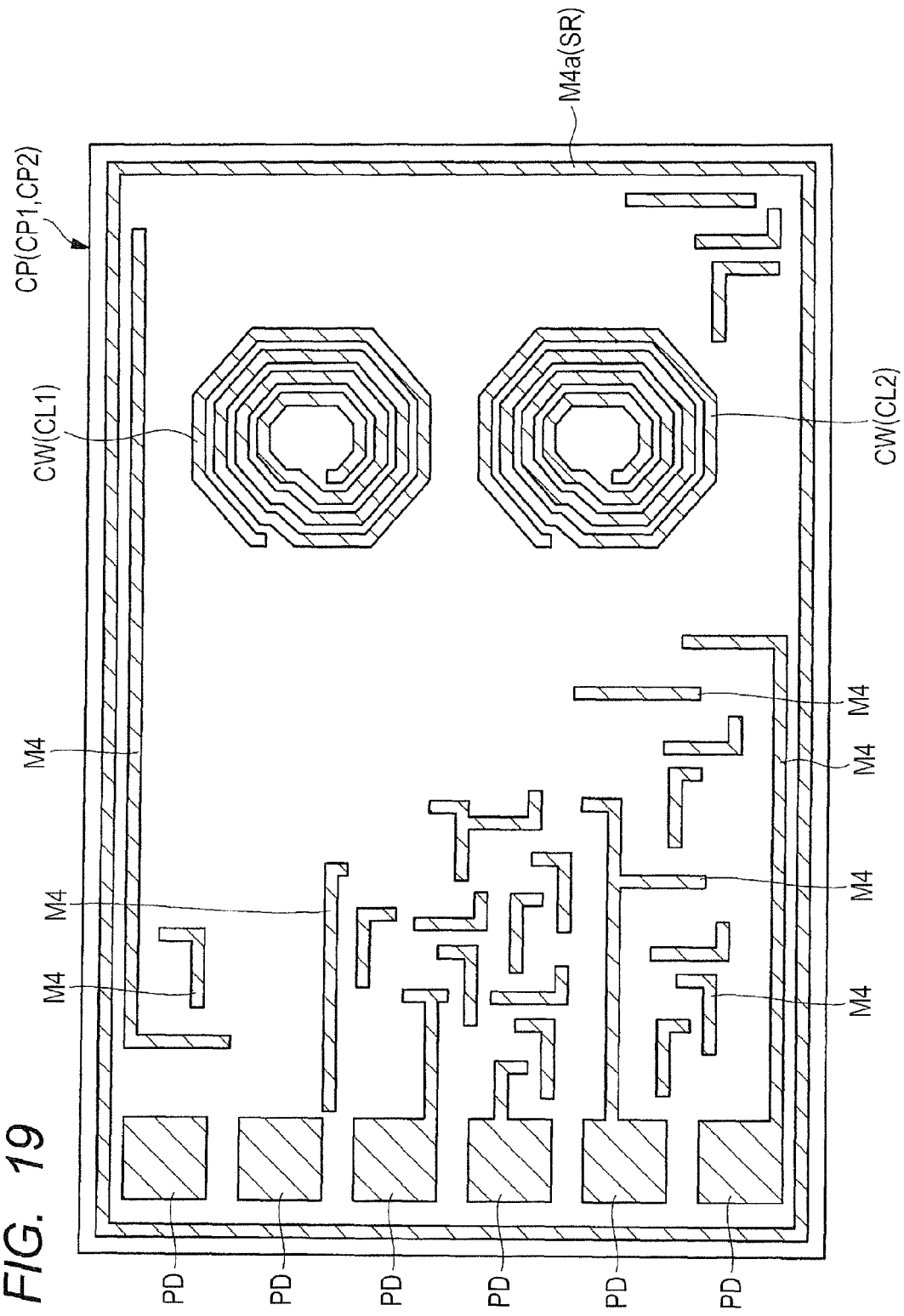
FIG. 19 is a plan view of the semiconductor chip in the embodiment.

FIG. 18 is a cross-sectional view schematically showing a cross-sectional structure of the semiconductor chip (semiconductor device) CP in the present embodiment. FIG. 19 is a plan view of the semiconductor chip (semiconductor device) CP in the present embodiment. FIG. 19 shows the metal pattern of the uppermost wiring layer (which is the fourth wiring layer herein) in the semiconductor chip CP. Here, the metal pattern of the uppermost wiring layer (which is the fourth wiring layer herein) is formed of a conductive film CD described later.

The semiconductor chip CP shown in FIGS. 18 and 19 corresponds to the foregoing semiconductor chip CP1 or CP2. That is, to either of the foregoing semiconductor chips CP1 and CP2, the configuration of the semiconductor chip CP shown in FIGS. 18 and 19 is applicable.

The semiconductor chip CP in the present embodiment is formed by using the semiconductor substrate SB made of monocrystalline silicon or the like.

As shown in FIG. 18, in the semiconductor substrate SB made of monocrystalline silicon or the like and included in the semiconductor chip (semiconductor device) CP in the present embodiment, a semiconductor element such as a MISFET (Metal Insulator Semiconductor Field Effect Transistor) is formed.

For example, in a semiconductor substrate SB1, a p-type well PW and an n-type well NW are formed. Over the p-type well PW, a gate electrode GI for an n-channel MISFET is formed via a gate insulating film GF while, over the n-type well NW, a gate electrode G2 for a p-channel MISFET is formed via the gate insulating film GF. The gate insulating films GF are each made of, e.g., a silicon dioxide film or the like. The gate electrodes G1 and G2 are each made of, e.g., a polycrystalline silicon film (doped polysilicon film) into which an impurity has been introduced or the like.

In the p-type well PW of the semiconductor substrate SB, the source/drain n-type semiconductor regions NS of the n-channel MISFET are formed while, in the n-type well NW of the semiconductor substrate SB, the source/drain p-type semiconductor regions PS of the p-channel MISFET are formed. The gate electrode G1, the gate insulating film GF under the gate electrode G1, and the n-type semiconductor regions NS (source/drain regions) on both sides of the gate electrode G1 form the n-channel MISFET Qn. On the other hand, the gate electrode G2, the gate insulating film GF under the gate electrode G2, and the p-type semiconductor regions PS (source/drain regions) on both sides of the gate electrode G2 form the p-channel MISFET Qp. Each of the n-type semiconductor regions NS can also have an LDD (Lightly doped Drain) structure. In this case, over the side walls of the gate electrode G1, side-wall insulating films referred to also as sidewall spacers are formed. Likewise, each of the p-type semiconductor regions PS can also have an LDD structure. In this case, over the side walls of the gate electrode G2, side-wall insulating films referred to also as sidewall spacers are formed.

Note that, as examples of the semiconductor elements formed in the semiconductor substrate SB, the MISFETs have been described heretofore. However, it may also be possible to additionally form a capacitor element, a resistor element, a memory element, a transistor having another configuration, and the like. When the semiconductor chip CP is the foregoing semiconductor chip CP1, the semiconductor elements formed in the semiconductor substrate SB form the transmission circuit TX1 and the reception circuit RX2 each described above. When the semiconductor chip CP is the foregoing semiconductor chip CP2, the semiconductor elements formed in the semiconductor substrate SB form the transmission circuit TX2, the reception circuit RX1, and the drive circuit DR each described above.

As an example of the semiconductor substrate SB, a monocrystalline silicon substrate has been described heretofore. In another form, a SOI (Silicon On Insulator) substrate or the like can also be used as the semiconductor substrate SB.

Over the semiconductor substrate SB, a wiring structure including one or more wiring layers is formed. Preferably, a multilayer wiring structure is formed of a plurality of interlayer insulating films and a plurality of wiring layers.

That is, over the semiconductor substrate SB, a plurality of interlayer insulating films IL1, IL2, IL3, and IL4 are formed and, in the plurality of interlayer insulating films IL1, IL2, IL3, and IL4, plugs V1, via portions V2, V3, and V4, and wires M1, M2, M3, and M4 are formed.

Specifically, over the semiconductor substrate SB, the interlayer insulating film IL1 is formed as an insulating film so as to cover the foregoing MISFETs. Over the interlayer insulating film IL1, the wires M1 are formed. The wires M1 are in the first wiring layer (lowermost wiring layer). Over the interlayer insulating film IL1, the interlayer insulating film IL2 is formed as the insulating film so as to cover the wires M1. Over the interlayer insulating film IL2, the wires M2 are formed. The wires M2 are in the second wiring layer as a wiring layer immediately above the first wiring layer. Over the interlayer insulating film IL2, the interlayer insulating film IL3 is formed as the insulating film so as to cover the wires M2. Over the interlayer insulating film IL3, the wires M3 are formed. The wires M3 are in the third wiring layer as the wiring layer immediately above the second wiring layer. Over the interlayer insulating film IL3, the interlayer insulating film IL4 is formed as the insulating film so as to cover the wires M3. Over the interlayer insulating film IL4, the wires M4 are formed. The wires M4 are in the fourth wiring layer as the wiring layer immediately above the third wiring layer. The fourth wiring layer is the uppermost wiring layer.

The plugs V1 are each made of a conductor and formed in the layer located under the wires M1. That is, the plugs V1 are formed in the interlayer insulating film IL1 so as to extend through the interlayer insulating film IL1. The plugs V1 have upper surfaces in contact with the lower surfaces of the wires M1 to thus be electrically coupled to the wires M1. The plugs V1 have bottom portions coupled to various semiconductor regions (such as, e.g., the n-type semiconductor regions NS and the p-type semiconductor regions PS) formed in the semiconductor substrate SB, the gate electrodes G1 and G2, and the like. As a result, the wires M1 are electrically coupled to the various semiconductor regions formed in the semiconductor substrate SB, the gate electrodes G1 and G2, and the like via the plugs V1.

The via portions V2 are each made of a conductor and formed between the wires M2 and the wires M1, i.e., formed in the interlayer insulating film IL2 to couple the wires M2 to the wires M1. The via portions V2 can also be formed integrally with the wires M2. The via portions V3 are each made of a conductor and formed between the wires M3 and the wires M2, i.e., formed in the interlayer insulating film IL3 to couple the wires M3 to the wires M2. The via portions V3 can also be formed integrally with the wires M3. The via portions V4 are each made of a conductor and formed between the wires M4 and the wires M3, i.e., in the interlayer insulating film IL4 to couple the wires M4 to the wires M3. The via portions V4 can also be formed integrally with the wires M4.

In the semiconductor chip CP shown in FIGS. 18 and 19, the fourth wiring layer is the uppermost wiring layer and the wires M4 are the uppermost-layer wires. The semiconductor elements (e.g., the foregoing MISFETs) formed in the semiconductor substrate SB are wired as intended by the first wiring layer (wires M1), the second wiring layer (wires M2), the third wiring layer (wires M3), and the fourth wiring layer (wires M4) to be able to perform an intended operation.

A pad (pad electrode or bonding pad) PD is formed of the fourth wiring layer as the uppermost wiring layer. In short, the pad PD is formed in the same layer as that of the wires M4. That is, the wires M4 and the pad PD are formed of the same conductive layer in the same step. Accordingly, similarly to the wires M4, the pad PD is also formed over the interlayer insulating film IL4.

Also, the coils CL1 and CL2 are formed of the fourth wiring layer as the uppermost wiring layer. In short, the coils CL1 and CL2 (the coil wires CW for the coils CL1 and the coil wires CW for the coils CL2) are formed in the same layer as that of the pad PD and the wires M4. That is, the wires M4, the pad PD, and the coils CL1 and CL2 (the coil wires CW for the coils CL1 and the coil wires CW for the coils CL2) are formed of the same conductive layer in the same step. Accordingly, similarly to the wires M4 and the pad PD, the coils CL1 and CL2 (the coil wires CW for the coils CL1 and the coil wires CW for the coils CL2) are also formed over the interlayer insulating film IL4. The coils CL1 (the coil wires CW for the coils CL1) and the coils CL2 (the coil wires CW for the coils CL2) are formed in the same layer.

FIG. 19 is a plan view of the fourth wiring layer as the uppermost wiring layer, but for improved clarity of illustration, the metal pattern (including the pad PD, the wires M4, the coil wires CW, and a seal ring wire M4a herein) are hatched.

Thus, in the semiconductor chip CP in the present embodiment, the wiring structure including one or more wiring layers (preferably a plurality of wiring layers) is formed over the semiconductor substrate SB. In the uppermost wiring layer (which is the fourth wiring layer herein) among the wiring layers included in the wiring structure, the pad PD, the wires M4, and the coils CL1 and CL2 (coil wires CW) are formed. In the case of forming the wires M4 by, e.g., patterning a conductive film (corresponding to a conductive film CD described later) formed over the interlayer insulating film IL4, not only the wires M4, but also the pad PD and the coils CL1 and CL2 (coil wires CW) can be formed when the conductive film is patterned.

The coils CL1 correspond to the foregoing coils CL1a or coils CL1b. The coils CL2 correspond to the foregoing coils CL2a or CL2b. The pad PD corresponds to the foregoing pad PD1 or PD2. That is, when the semiconductor chip CP is the foregoing semiconductor chip CP1, the coils CL1 correspond to the foregoing coils CL1a, the coils CL2 correspond to the foregoing coils CL2a, and the pad PD corresponds to the foregoing pad PD1. When the semiconductor chip CP is the foregoing semiconductor chip CP2, the coils CL1 correspond to the foregoing coils CL1b, the coils CL2 correspond to the foregoing coils CL2b, and the pad PD corresponds to the foregoing pad PD2.

Each of the coils CL1 and CL2 is formed of a coil wire (coil-shaped wire) CW wound into a helical shape (coil shape or loop shape) over the interlayer insulating film IL4. The coil wire CW can be regarded as a wire for a coil. That is, each of the coils CL1 is formed of the coil wire CW for the coils CL1. Each of the coils CL2 is formed of the coil wire CW for the coil CL2. The coil wire CW for the coil CL1 and the coil wire CW for the coil CL2 are not connected, but are separated apart from each other.

The wires M4 and the coils CL1 and CL2 (coil wires CW) are covered with the insulating film (protective film or surface protective film) PA and are not exposed. On the other hand, the pad PD has at least a part exposed from an opening OP and a part covered with the insulating film PA. That is, the pad PD is exposed from the opening OP, but the portion of the pad PD which does not overlap the opening OP in plan view is covered with the insulating film PA. Specifically, the middle portion of the pad is not covered with the insulating film PA, while the outer peripheral portion of the pad PD is covered with the insulating film PA.

The pad PD is electrically coupled to the internal wiring of the semiconductor chip CP. For example, by providing the wire M4 integrally formed with the pad PD and allowing the wire ME4 integrally formed with the pad PD to be coupled to the wire M3 via the via portion V4 provided immediately under the wire M4, the pad PD can electrically be coupled to the wire M3. It is also possible to provide the via portion V4 immediately under the pad PD and electrically couple the pad PD to the wire M3 via the via portion V4.

Note that the internal wiring of the semiconductor chip CP is formed in the multilayer wiring structure over the semiconductor substrate SB and includes the wires M1, M2, M3, and M4 herein.

Each of the coils CL1 and CL2 is electrically coupled to the internal wiring of the semiconductor chip CP and coupled to the circuit formed in the semiconductor chip CP via the internal wiring of the semiconductor chip CP. For example, it is possible to provide the via portion V4 immediately under one end portion of one of the coils CL1 and electrically couple the one end portion of the coil CL1 to the wire M3 via the via portion V4 and also provide another via portion V4 immediately under the other end portion of the coil CL1 and electrically couple the other end portion of the coil CL1 to another wire M3 via the via portion V4. For example, it is possible to provide the via portion V4 immediately under one end portion of one of the coils CL2 and electrically couple the one end portion of the coil CL2 to the wire M3 via the via portion V4 and also provide another via portion V4 immediately under the other end portion of the coil CL2 and electrically couple the other end portion of the coil CL2 to another wire M3 via the via portion V4.

FIGS. 18 and 19 show the case where the number of the wiring layers formed over the semiconductor substrate SB is 4 (where the total of four layers including the wires M1, M2, M3, and M4 are formed). However, the number of the wiring layers is not limited to 4 and can variously be changed, but is preferably not less than 2.

As shown in FIG. 18, over the interlayer insulating film IL4, the insulating film PA is formed so as to cover the wires M4 and the coils CL1 and CL2. The insulating film PA is the uppermost-layer film (insulating film) of the semiconductor chip CP. That is, in the semiconductor chip CP, the film located closest to the top surface is the insulating film PA. The upper surface of the insulating film PA mainly forms the upper surface (top surface) of the semiconductor chip CP. The insulating film PA can function as the top surface protective film of the semiconductor chip CP. The insulating film PA covers and protects the coils CL1 and CL2. The insulating film PA can also be regarded as a passivation film.

Preferably, the insulating film PA is made of a laminated film including an insulating film PA1 and an insulating film PA2 over the insulating film PA1. The insulating film PA1 is preferably made of a silicon nitride film, while the insulating film PA2 is preferably made of a resin film. As the resin film forming the insulating film PA2, a polyimide film (polyimide resin film) can be used appropriately. The polyimide film is made of a polymer containing imide bonds in repetitive units and is a type of an organic insulating film. As the insulating film forming the insulating film PA2, another organic insulating film made of an epoxy-based resin, a PBO-based resin, an acrylic resin, a WRP-based resin, or the like can also be used instead of the polyimide film. The polyimide-based resin is an organic resin which is used appropriately for a device required to have a high heat resistance of not less than 200° C. and can be used selectively depending on a mechanical strength of a material such as a thermal expansion coefficient or ductility, a cure temperature, or the like. When a resin film is used as the insulating film PA2, the uppermost-layer (upmost) film of the semiconductor chip CP is a resin film (insulating film PA2). Consequently, the advantage of easier handling of the semiconductor chip CP can also be obtained.

The silicon nitride film is an insulating film having a low moisture absorbency. Accordingly, as the insulating film PA1 covering the wires M4 and the coils CL1 and CL2, a silicon nitride film is appropriate to allow an improvement in the moisture resistance of the semiconductor chip CP. However, when the thickness of the silicon nitride film is excessively increased, a semiconductor wafer (semiconductor substrate SB) is likely to warp while the semiconductor chips are manufactured. To prevent this, the insulating film PA is not formed entirely of the silicon nitride film, but is formed as a laminated insulating film. By causing the laminated insulating film to include the silicon nitride film, it is possible to improve the moisture resistance and simultaneously prevent the semiconductor wafer from warping during the manufacturing thereof.

The insulating film PA can also be regarded as a laminated insulating film including a plurality of laminated insulating films (specifically, the two insulating films PA1 and PA2). Note that, in the present application, a laminated insulating film means a laminated film including a plurality of laminated insulating films. As described above, the pad PD is exposed from the opening OP of the insulating film PA, while the wires M4 and the coils CL1 and CL2 are covered with the insulating film PA and not exposed therefrom.

As will be described later, when the semiconductor chip CP is manufactured, the process of planarizing the upper surface of the insulating film PA (corresponding to the upper surface of the insulating film PA2) has been performed. Consequently, in the manufactured semiconductor chip CP, the upper surface of the insulating film PA (corresponding to the upper surface of the insulating film PA2) is a substantially flat surface.

The insulating film PA has the opening OP exposing at least a part of the pad PD. However, since the insulating film PA is the laminated film including the insulating films PA1 and PA2, the opening OP of the insulating film PA is formed of an opening OP2 of the insulating film PA2 and an opening OP1 of the insulating film PA1.

The pad PD is exposed from the opening OP of the insulating film PA. That is, by providing the opening OP over the pad PD, the pad PD is exposed from the opening OP of the insulating film PA. This allows a conductive coupling member such as the foregoing wires BW to be coupled to the pad PD exposed from the opening OP of the insulating film PA.

When the semiconductor chip CP is the foregoing semiconductor chip CP1, in the semiconductor chip CP (CP1), the foregoing transmission circuit TX1, the foregoing reception circuit RX2, and the coils CL1 and CL2 (corresponding to the foregoing coils CL1a and CL2a) are formed. In this case, the coil CL1 (corresponding to the foregoing coil CL1a) is coupled to the foregoing transmission circuit TX1 in the semiconductor chip CP (CP1) via the internal wiring of the semiconductor chip CP (CP1), and the coil CL2 (corresponding to the foregoing coil CL2a) is coupled to the foregoing reception circuit RX2 in the semiconductor chip CP (CP1) via the internal wiring of the semiconductor chip CP (CP1).

When the semiconductor chip CP is the foregoing semiconductor chip CP2, in the semiconductor chip CP (CP2), the foregoing reception circuit RX1, the foregoing transmission circuit TX2, and the coils CL1 and CL2 (corresponding to the foregoing coils CL1b and CL2b) are formed. In this case, the coil CL1 (corresponding to the foregoing coil CL1b) is coupled to the foregoing reception circuit RX1 in the semiconductor chip CP (CP2) via the internal wiring of the semiconductor chip CP (CP2), and the coil CL2 (corresponding to the foregoing coil CL2b) is coupled to the foregoing transmission circuit TX2 in the semiconductor chip CP (CP2) via the internal wiring of the semiconductor chip CP (CP2).

As shown in FIGS. 18 and 19, in the outer peripheral portion of the semiconductor chip CP, a seal ring SR is formed. The seal ring may be referred to also as a guard ring. In plan view, the seal ring SR is formed in the outer peripheral portion of the semiconductor chip CP so as to circle along the outer periphery of the semiconductor chip CP. Accordingly, in plan view, the seal ring SR is formed in an annular shape (ring shape) along the outer periphery of the semiconductor chip CP. However, since the semiconductor chip CP has a generally rectangular outer shape, the seal ring SR may also have a generally rectangular outer shape or an outer shape obtained by rounding or cutting off the corners of the rectangular shape. In plan view, in the semiconductor chip CP, various circuits and semiconductor elements are formed in the region enclosed in the seal ring SR. Accordingly, in plan view, the n-channel MISFET Qn, the p-channel MISFET Qp, the wires M1, M2, M3, and M4, the pads PD, and the coils CL1 and CL2 (coil wires CW) are formed (positioned) in the region enclosed in the seal ring SR in the semiconductor chip CP.

The seal ring SR is formed of seal ring wires (metal pattern) Mia, M2a, M3a, and M4a and seal ring via portions (metal pattern) Via, V2a, V3a, and V4a. The seal ring wire Mia is formed of the same material as that of the wires M1 in the same step to be included in the same layer. The seal ring wire M2a is formed of the same material as that of the wires M2 in the same step to be included in the same layer. The seal ring wire M3a is formed of the same material as that of the wires M3 in the same step to be included in the same layer. The seal ring wire M4a is formed of the same material as that of the wires M4 in the same step to be included in the same layer. The seal ring via portion V1a is formed of the same material as that of the plugs V1 in the same step to be included in the same layer. The seal ring via portion V2a is formed of the same material as that of the via portions V2 in the same step to be included in the same layer. The seal ring via portion V3a is formed of the same material as that of the via portions V3 in the same step to be included in the same layer. The seal ring via portion V4a is formed of the same material as that of the via portions V4 in the same step to be included in the same layer.

The seal ring SR is formed of these seal ring wires Mia, M2a, M3a, and M4a and the sealing ring via portions Via, V2a, V3a, and V4a to have a metal wall shape. That is, the seal ring SR is formed of the seal ring wire M4a, the seal ring via portion V4a, the seal ring wire M3a, the seal ring via portion V3a, the seal ring wire M2a, the seal ring via portion V2a, the seal ring wire Mia, and the seal ring via portion V1a which are arranged in a vertical direction to have a metal wall shape. That is, the seal ring via portion V1a, the seal ring wire Mia, the seal ring via portion V2a, the seal ring wire M2a, the seal ring via portion V3a, the seal ring wire M3a, the seal ring via portion V4a, and the seal ring wire M4a are formed in different layers and stacked upwardly in this order to form the seal ring SR as a whole. Accordingly, the seal ring via portion V1a, the seal ring wire Mia, the seal ring via portion V2a, the seal ring wire M2a, the seal ring via portion V3a, the seal ring wire M3a, the seal ring via portion V4a, and the seal ring wire M4a are formed in the outer peripheral portion of the semiconductor chip CP so as to circle along the outer periphery of the semiconductor chip CP in plan view.

By providing the seal ring SR, when a crack is formed in a cut surface by a dicing blade in a dicing step (cutting step) during the manufacturing of the semiconductor chip CP, it is possible to stop the extension of the crack using the seal ring SR. It is also possible to stop the entrance of moisture from the cut surface (side surface) of the semiconductor chip CP.

Accordingly, the seal ring wires Mia, M2a, M3a, and M4a and the seal ring via portions Via, V2a, V3a, and V4a are formed not to wire elements or circuits, but to form the seal ring SR.

FIG. 18 shows the case where elements (semiconductor elements) such as MISFETs are not formed immediately under the coils CL1 and CL2. In this case, it is possible to inhibit or prevent the elements (semiconductor elements) such as MISFETs from being affected by magnetic fields produced by the coils CL1 and CL2. In another form, it is also possible to form elements (semiconductor elements) such as MISFETs immediately under the coils CL1 and CL2. In this case, the form is advantageous in terms of reducing the size (area) of the semiconductor chip.

<About Manufacturing Process of Semiconductor Chip>

Next, a description will be given of the manufacturing process of the semiconductor chip (semiconductor device) CP in the present embodiment. By the following manufacturing process, the semiconductor chip CP in FIGS. 18 and 19 described above is manufactured.

FIGS. 20 to 36 are main-portion cross-sectional views of the semiconductor chip (semiconductor device) CP in the present embodiment during the manufacturing process thereof. FIGS. 20 to 36 show cross-sectional views corresponding to FIG. 18 described above.

Figure 20:
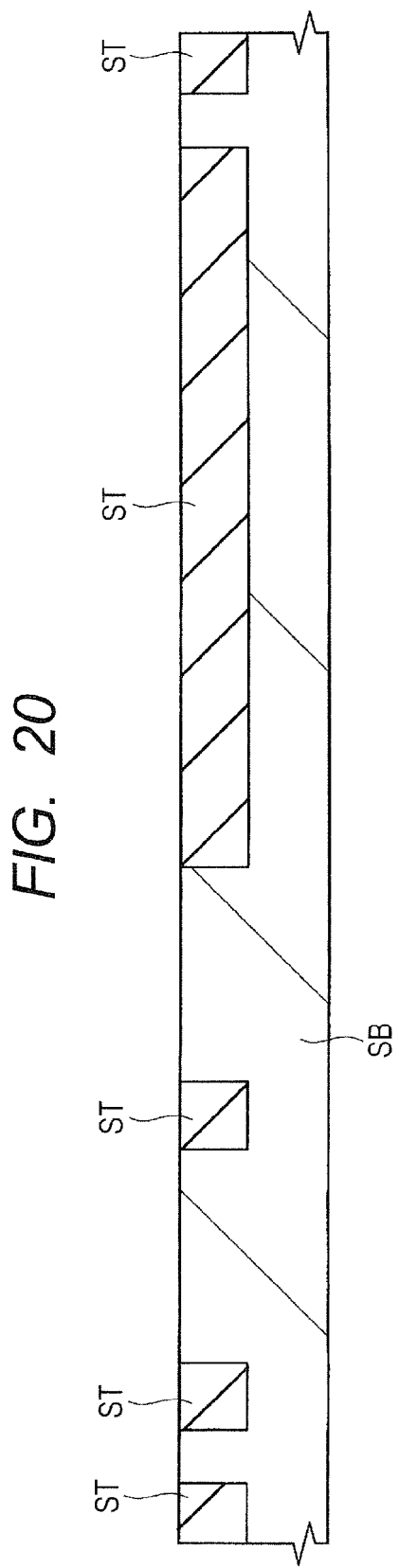
FIG. 20 is a cross-sectional view of the semiconductor chip in the embodiment during the manufacturing process thereof.

First, as shown in FIG. 20, the semiconductor substrate (semiconductor wafer) SB made of p-type monocrystalline silicon having a specific resistance of, e.g., about 1 to 10 Ωcm or the like is provided (prepared). At this stage, the semiconductor substrate SB is in the form of a semiconductor wafer.

Next, in the main surface of the semiconductor substrate SB, isolation regions ST are formed by, e.g., a STI (Shallow Trench Isolation) method or the like. The isolation regions ST are formed by forming trenches in the semiconductor substrate SB and embedding an insulating film in the trenches. In the active regions defined (demarcated) in the semiconductor substrate SB by the isolation regions ST, MISFETs are formed, as will be described later.

Figure 21:
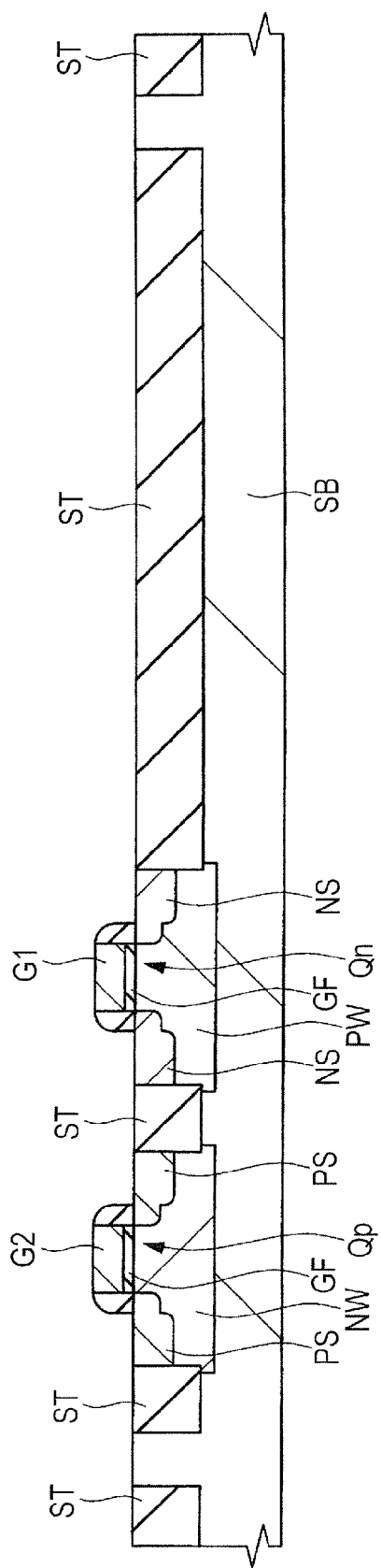
FIG. 21 is a cross-sectional view of the semiconductor chip during the manufacturing process thereof, which is subsequent to FIG. 20.

Next, as shown in FIG. 21, the semiconductor elements such as MISFETs are formed in the semiconductor substrate SB (the active region thereof).

That is, using an ion implantation method, the p-type well PW and the n-type well NW are formed. Over the p-type well PW and the n-type well NW, the gate electrodes G1 and G2 are formed via the gate insulating films GF and, using an ion implantation method, the n-type semiconductor regions NS and the p-type semiconductor regions PS are formed. Thus, in the semiconductor substrate SB, the n-channel MISFET Qn and the p-channel MISFET Qp are formed. Then, using a salicide (Self Aligned Silicide) technique, in the respective upper portions (top layer portions) of the n-type semiconductor regions NS, the p-type semiconductor regions PS, the gate electrodes G1 and G2, and the like, low-resistance metal silicide layers (not shown) can also be formed.

Figure 22:
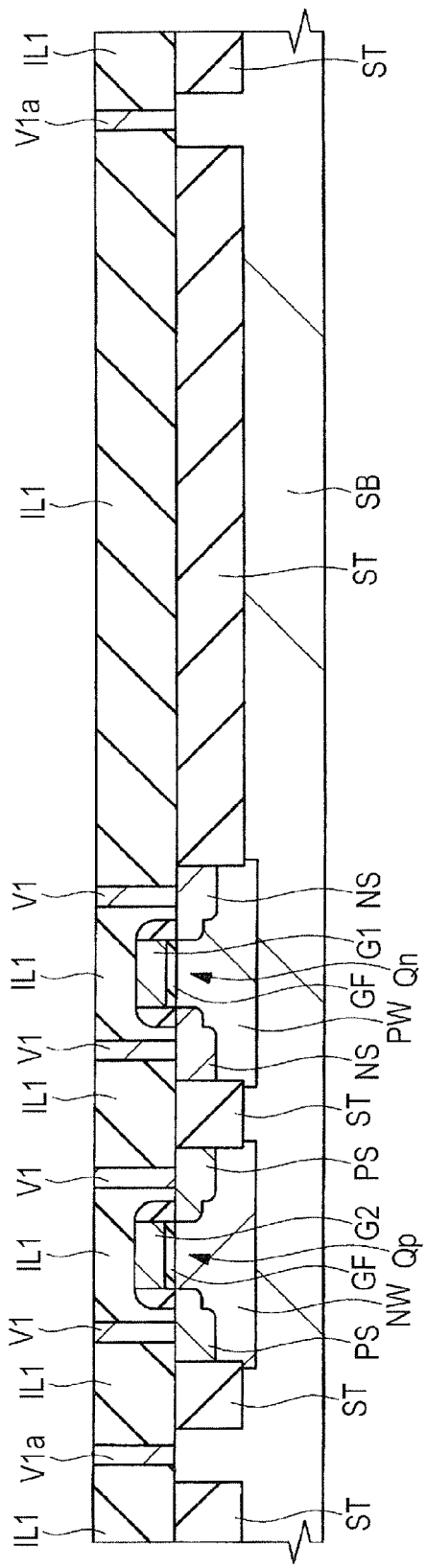
FIG. 22 is a cross-sectional view of the semiconductor chip during the manufacturing process thereof, which is subsequent to FIG. 21.

Next, as shown in FIG. 22, over the main surface (entire main surface) of the semiconductor substrate SB, the interlayer insulating film IL1 is formed so as to cover the MISFETs Qn and Qp. The interlayer insulating film IL1 is made of a single-layer film, e.g., a silicon dioxide film, a laminated film including a silicon nitride film and a silicon dioxide film thicker than the silicon nitride film (the silicon nitride film is in the lower layer and the silicon dioxide film is in the upper layer), or the like. After the deposition of the interlayer insulating film IL1, the upper surface of the interlayer insulating film IL1 can also be planarized by performing polishing or the like on the top surface (upper surface) of the interlayer insulating film IL1 as necessary in accordance with a CMP (Chemical Mechanical Polishing) method.

Next, using the photoresist layer (not shown) formed over the interlayer insulating IL1 using a photolithographic technique as an etching mask, dry etching is performed on the interlayer insulating film IL1 to form contact holes (through holes or holes) in the interlayer insulating film IL1. Then, by embedding a conductive film in the contact holes, the conductive plugs (coupling conductor portions) V1 are formed. At this time, the seal ring via portion V1a is also formed.

To form the plugs V1, e.g., over the interlayer insulating film IL1 including the insides (the bottom portions and the side walls) of the contact holes, a barrier conductor film (e.g., a titanium film, a titanium nitride film, or a laminated film thereof) is formed by a sputtering method, a plasma CVD method, or the like. Then, a main conductor film made of a tungsten film or the like is formed over the barrier conductor film by a CVD method or the like to be embedded in the contact holes. Then, the respective unneeded portions of the main conductor film and the barrier conductor film which are located outside the contact holes (over the interlayer insulating film IL1) are removed by a CMP method, an etch-back method, or the like. As a result, the upper surface of the interlayer insulating film IL1 is exposed, and the plugs V1 are formed of the remaining barrier conductor film and the remaining main conductor film each embedded in the contact holes of the interlayer insulating film IL1. In FIG. 22, for easier illustration, the main conductor film and the barrier conductor film are integrally shown in each of the plugs V1. The plugs V1 have bottom portions each electrically coupled to the n-type semiconductor region NS, the p-type semiconductor region PS, the gate electrode G1, the gate electrode G2, or the like.

Figure 23:
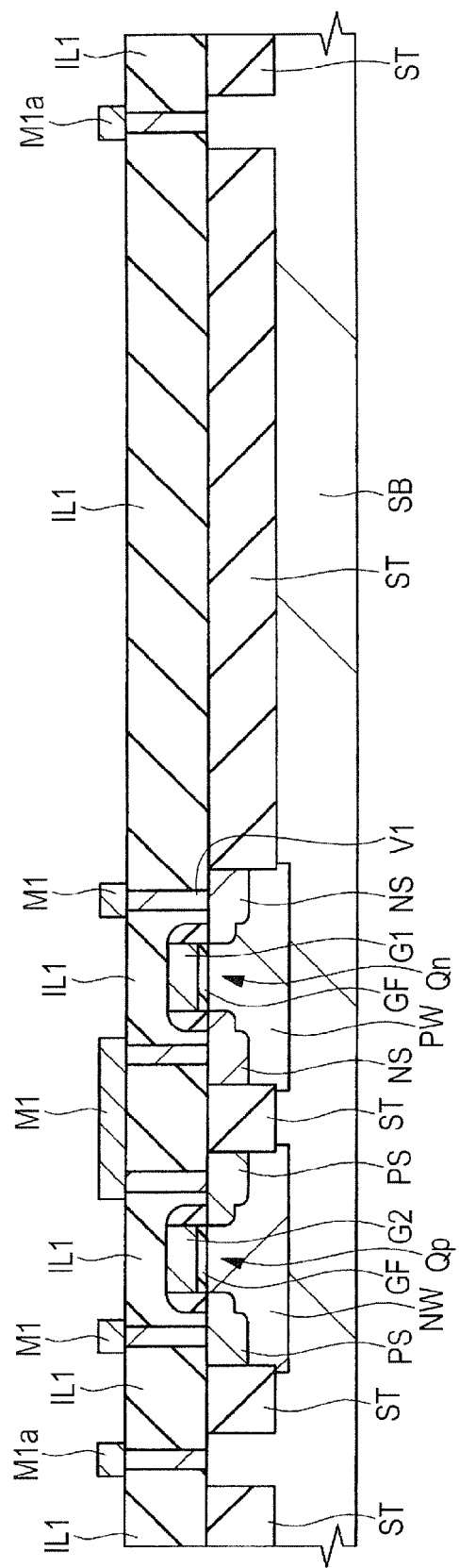
FIG. 23 is a cross-sectional view of the semiconductor chip during the manufacturing process thereof, which is subsequent to FIG. 22.

Next, as shown in FIG. 23, over the interlayer insulating film IL1 in which the plugs V1 are embedded, the wires M1 in the first wiring layer as the lowermost wiring layer are formed. To form the wires M1, first, over the interlayer insulating film IL1 in which the plugs V1 are embedded, a conductive film for the first wiring layer is formed. The conductive film for the first wiring layer is made of a laminated film including, e.g., a barrier conductor film (e.g., a titanium film, a titanium nitride film, or a laminated film thereof), an aluminum film, and a barrier conductor film (e.g., a titanium film, a titanium nitride film, or a laminated film thereof) which are stacked upwardly in this order. The conductive film for the first wiring layer can be formed using, e.g., a sputtering method or the like. The aluminum film in the conductive film for the first wiring layer can be regarded as an aluminum film for forming the wires M1. Then, by patterning the conductive film for the first wiring layer using a photolithographic technique and an etching technique, the wires M1 can be formed. At this time, the seal ring wire Mia is also formed. The plugs V1 have upper surfaces in contact with the wires M1 to thus be electrically coupled to the wires M1.

The foregoing aluminum film for forming the wires M1 are not limited to a pure aluminum film. As the aluminum film for forming the wires M1, a conductive material film (conductive material film showing metallic conduction) containing aluminum as a main component can be used. For example, an Al (aluminum)/Si (silicon) compound or alloy film, an Al (aluminum)/Cu (copper) compound or alloy film, or an Al (aluminum)/Si (silicon)/Cu (copper) compound or alloy film can be used appropriately as the aluminum for forming the wires M1. The composition ratio of Al (aluminum) in the aluminum film is preferably higher than 50 at % (atomic percent) (i.e., Al-rich). The same applies not only to the foregoing aluminum film for forming the wires M1, but also to an aluminum film for forming the wires M2, an aluminum film for forming the wires M3, and an aluminum film for forming the wires M4.

The description has been given heretofore of the case where the wires M1 are formed by a method which patterns the conductive film. In another form, the wires M1 can also be formed by a damascene method. In this case, after an insulating film is formed over the interlayer insulating film IL1 in which the plugs V1 are embedded, wire trenches are formed in the insulating film and a conductive film is embedded in the wire trenches to be able to form the wires M1 as embedded wires (e.g., embedded copper wires). The same applies also to the wires M2 and M3 formed later.

Figure 24:
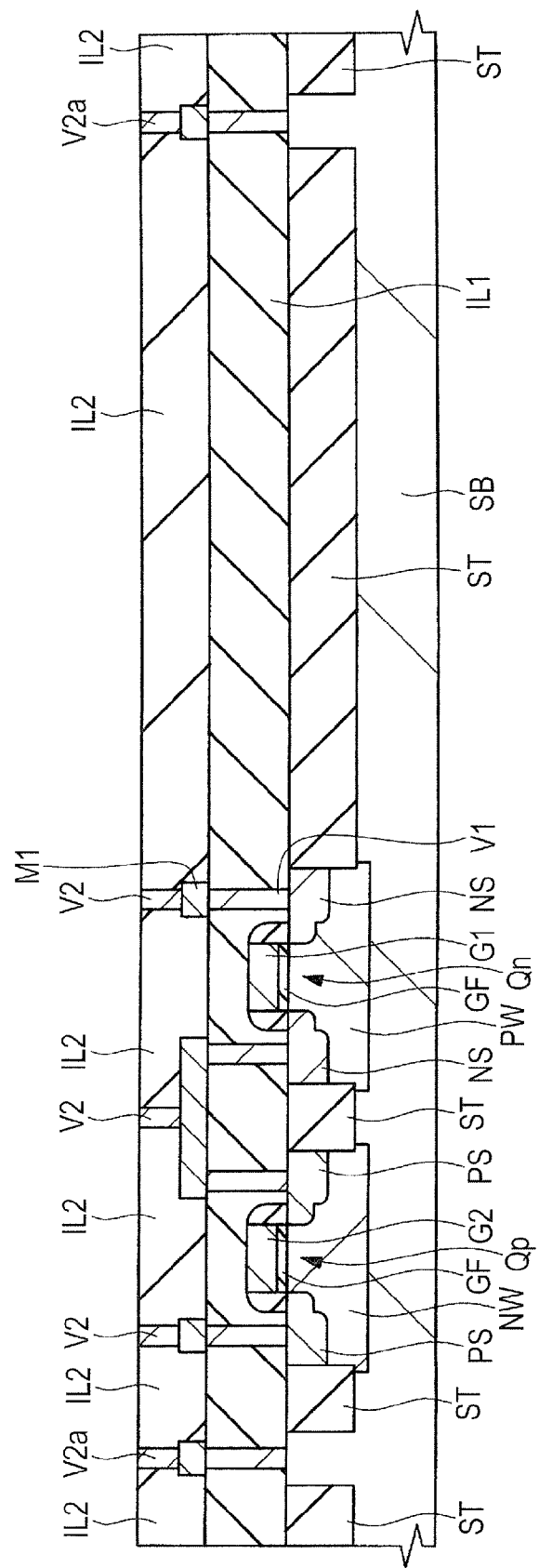
FIG. 24 is a cross-sectional view of the semiconductor chip during the manufacturing process thereof, which is subsequent to FIG. 23.

Next, as shown in FIG. 24, over the main surface (entire main surface) of the semiconductor substrate SB, i.e., over the interlayer insulating film IL1, the interlayer insulating film IL2 is formed so as to cover the wires M1. The interlayer insulating film IL2 is made of a silicon dioxide film or the like and can be formed using a CVD method or the like. After the deposition of the interlayer insulating film IL2, it is also possible to perform polishing or the like on the top surface (upper surface) of the interlayer insulating film IL2 by a CMP method and thus enhance the planarity of the upper surface of the interlayer insulating film IL2.

Next, using the photoresist layer (not shown) formed over the interlayer insulating film IL2 using a photolithographic technique as an etching mask, dry etching is performed on the interlayer insulating film IL2 to form through holes (through holes or holes) in the interlayer insulating film IL2. Then, by embedding the conductive film in the through holes, the conductive via portions (coupling conductor portions) V2 are formed. At this time, the seal ring via portion V2a is also formed. The via portions V2 can be regarded also as conductive plugs. The via portions V2 can be formed using the same method as used to form the plugs V1, but the material of the conductive film of the via portions V2 can also be different from that of the plugs V1. For example, the plugs V1 can be made mainly of a tungsten film, while the via portions V2 can be made mainly of an aluminum film.

Figure 25:
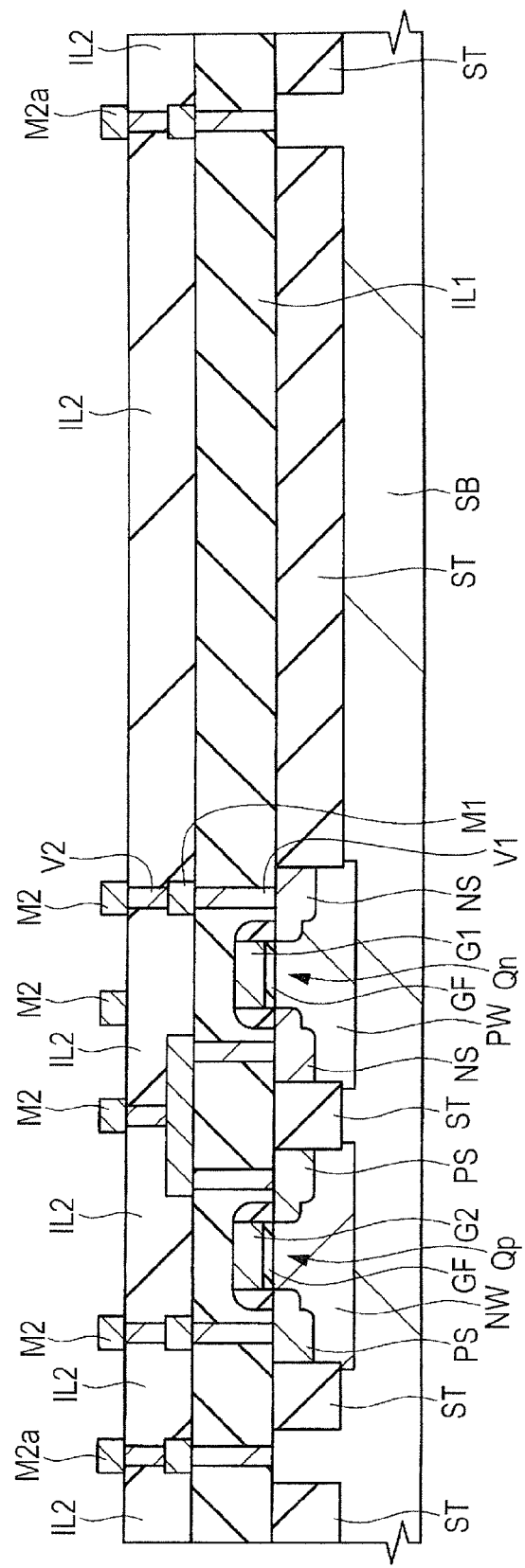
FIG. 25 is a cross-sectional view of the semiconductor chip during the manufacturing process thereof, which is subsequent to FIG. 24.

Next, as shown in FIG. 25, over the interlayer insulating film IL2 in which the via portions V2 are embedded, the wires M2 in the second wiring layer are formed. To form the wires M2, first, over the interlayer insulating film IL2 in which the via portions V2 are embedded, a conductive film for the second wiring layer is formed. For the conductive film for the second wiring layer, the same material as that of the conductive film for the foregoing first wiring layer can be used. Then, the conductive film for the second wiring layer is patterned using a photolithographic technique and an etching technique to be able to form the wires M2. At this time, the seal ring wire M2a is also formed. The via portions V2 have lower surfaces in contact with the wires M1 to thus be electrically coupled to the wires M1 and have upper surfaces in contact with the wires M2 to thus be electrically coupled to the wires M2. That is, the via portions V2 electrically couple the wires M1 and M2 to each other.

Figure 26:
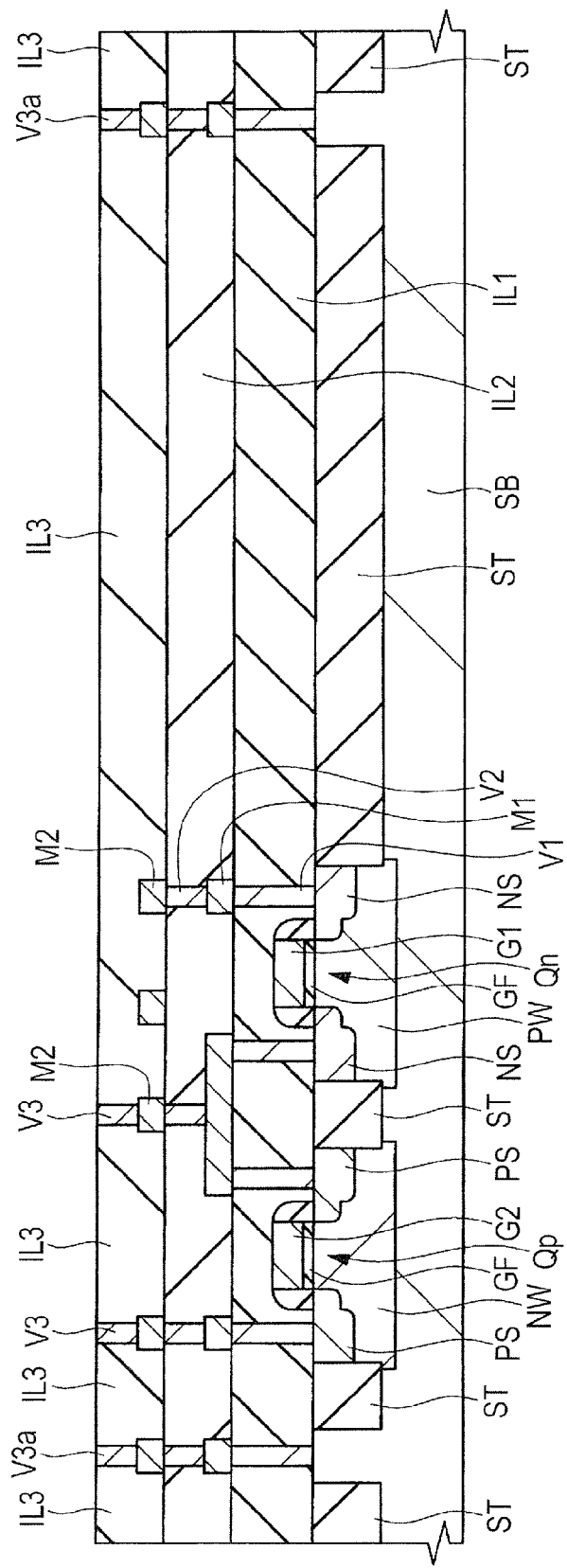
FIG. 26 is a cross-sectional view of the semiconductor chip during the manufacturing process thereof, which is subsequent to FIG. 25.

Next, as shown in FIG. 26, over the main surface (entire main surface) of the semiconductor substrate SB, i.e., over the interlayer insulating film IL2, the interlayer insulating film IL3 is formed so as to cover the wires M2. The interlayer insulating film IL3 is made of a silicon dioxide film or the like and can be formed using a CVD method or the like. After the deposition of the interlayer insulating film IL3, it is also possible to perform polishing or the like on the top surface (upper surface) of the interlayer insulating film IL3 by a CMP method and thus enhance the planarity of the upper surface of the interlayer insulating film IL3.

Next, using the photoresist layer (not shown) formed over the interlayer insulating film IL3 using a photolithographic technique as an etching mask, dry etching is performed on the interlayer insulating film IL3 to form through holes (through holes or holes) in the interlayer insulating film IL3. Then, by embedding the conductive film in the through holes, the conductive via portions (coupling conductor portions) V3 are formed. At this time, the seal ring via portion V3a is also formed. The via portions V3 can be regarded also as conductive plugs. The via portions V3 can be formed of the same conductive material as that of the via portions V2 using the same method as used to form the via portions V2.

Figure 27:
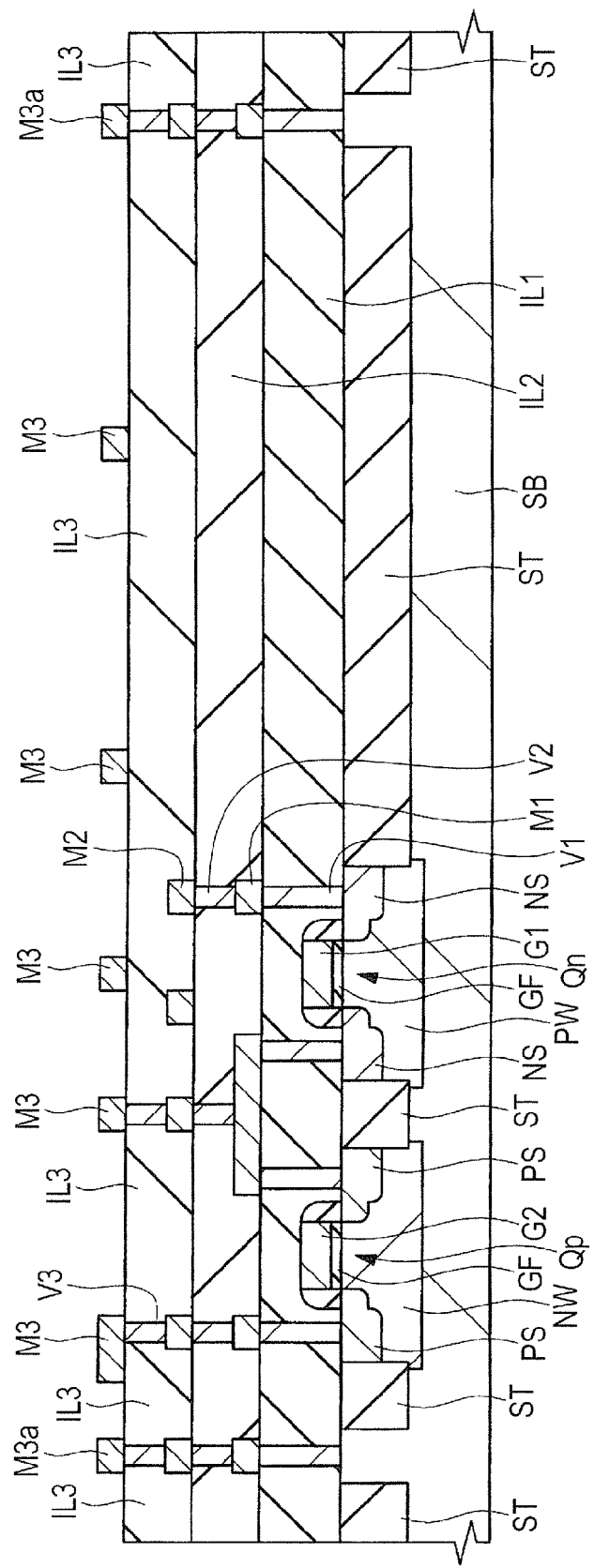
FIG. 27 is a cross-sectional view of the semiconductor chip during the manufacturing process thereof, which is subsequent to FIG. 26.

Next, as shown in FIG. 27, over the interlayer insulating film IL3 in which the via portions V3 are embedded, the wires M3 in the third wiring layer are formed. To form the wires M3, first, over the interlayer insulating film IL3 in which the via portions V3 are embedded, a conductive film for the third wiring layer is formed. For the conductive film for the third wiring layer, the same material as that of each of the conductive film for the foregoing first wiring layer and the conductive film for the foregoing second wiring layer can be used. Then, the conductive film for the third wiring layer is patterned using a photolithographic technique and an etching technique to be able to form the wires M3. At this time, the seal ring wire M3a is also formed. The via portions V3 have lower surfaces in contact with the wires M2 to thus be electrically coupled to the wires M2 and have upper surfaces in contact with the wires M3 to thus be electrically coupled to the wires M3. That is, the via portions V3 electrically couple the wires M2 and M3 to each other.

Figure 28:
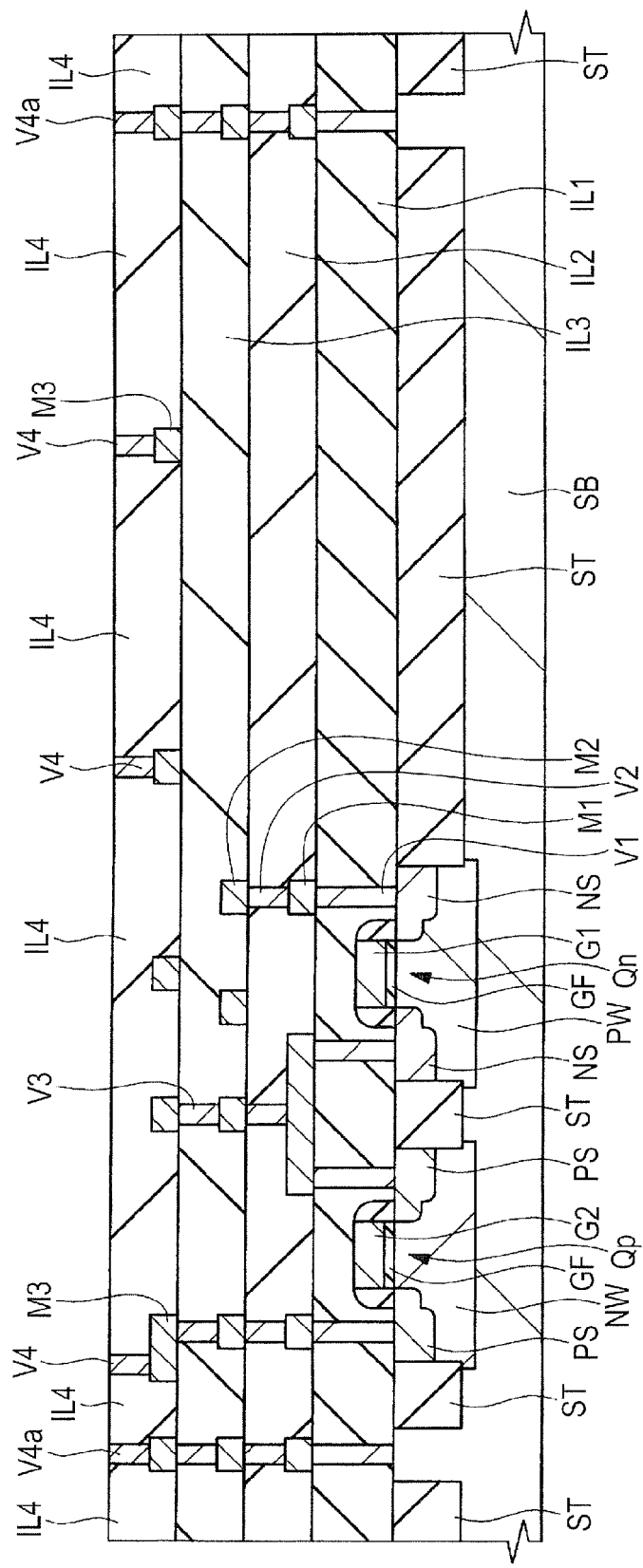
FIG. 28 is a cross-sectional view of the semiconductor chip during the manufacturing process thereof, which is subsequent to FIG. 27.

Next, as shown in FIG. 28, over the main surface (entire main surface) of the semiconductor substrate SB, i.e., over the interlayer insulating film IL3, the interlayer insulating film IL4 is formed so as to cover the wires M3. The interlayer insulating film IL4 is made of a silicon dioxide film or the like and can be formed using a CVD method or the like. After the deposition of the interlayer insulating film IL4, it is also possible to perform polishing or the like on the top surface (upper surface) of the interlayer insulating film IL4 by a CMP method and thus enhance the planarity of the upper surface of the interlayer insulating film IL4.

Next, using the photoresist layer (not shown) formed over the interlayer insulating film IL4 using a photolithographic technique as an etching mask, dry etching is performed on the interlayer insulating film IL4 to form through holes (through holes or holes) in the interlayer insulating film IL4. Then, by embedding the conductive film in the through holes, the conductive via portions (coupling conductor portions) V4 are formed. At this time, the seal ring via portion V4a is also formed. The via portions V4 can be regarded also as conductive plugs. The via portions V4 can be formed of the same conductive material as that of the via portions V3 using the same method as used to form the plugs V3.

Figure 29:
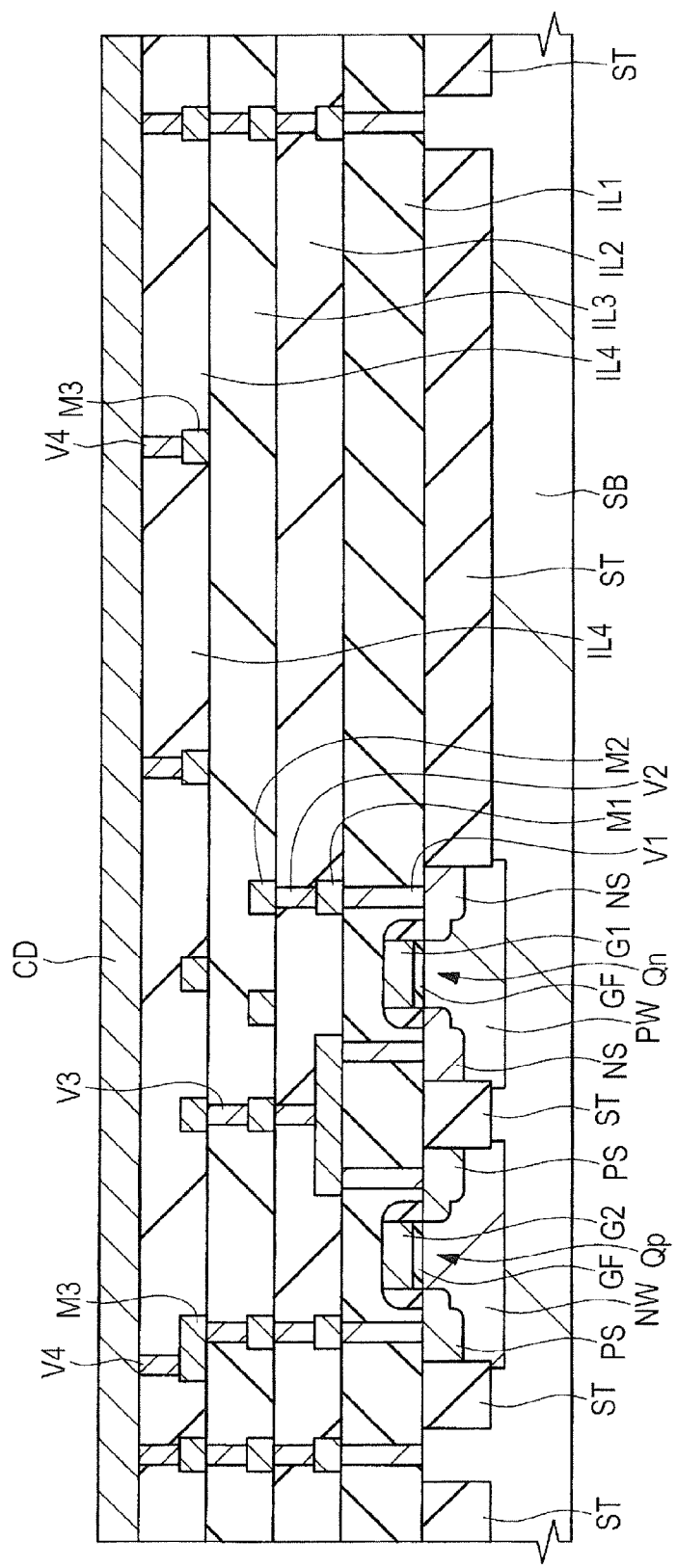
FIG. 29 is a cross-sectional view of the semiconductor chip during the manufacturing process thereof, which is subsequent to FIG. 28.
Figure 30:
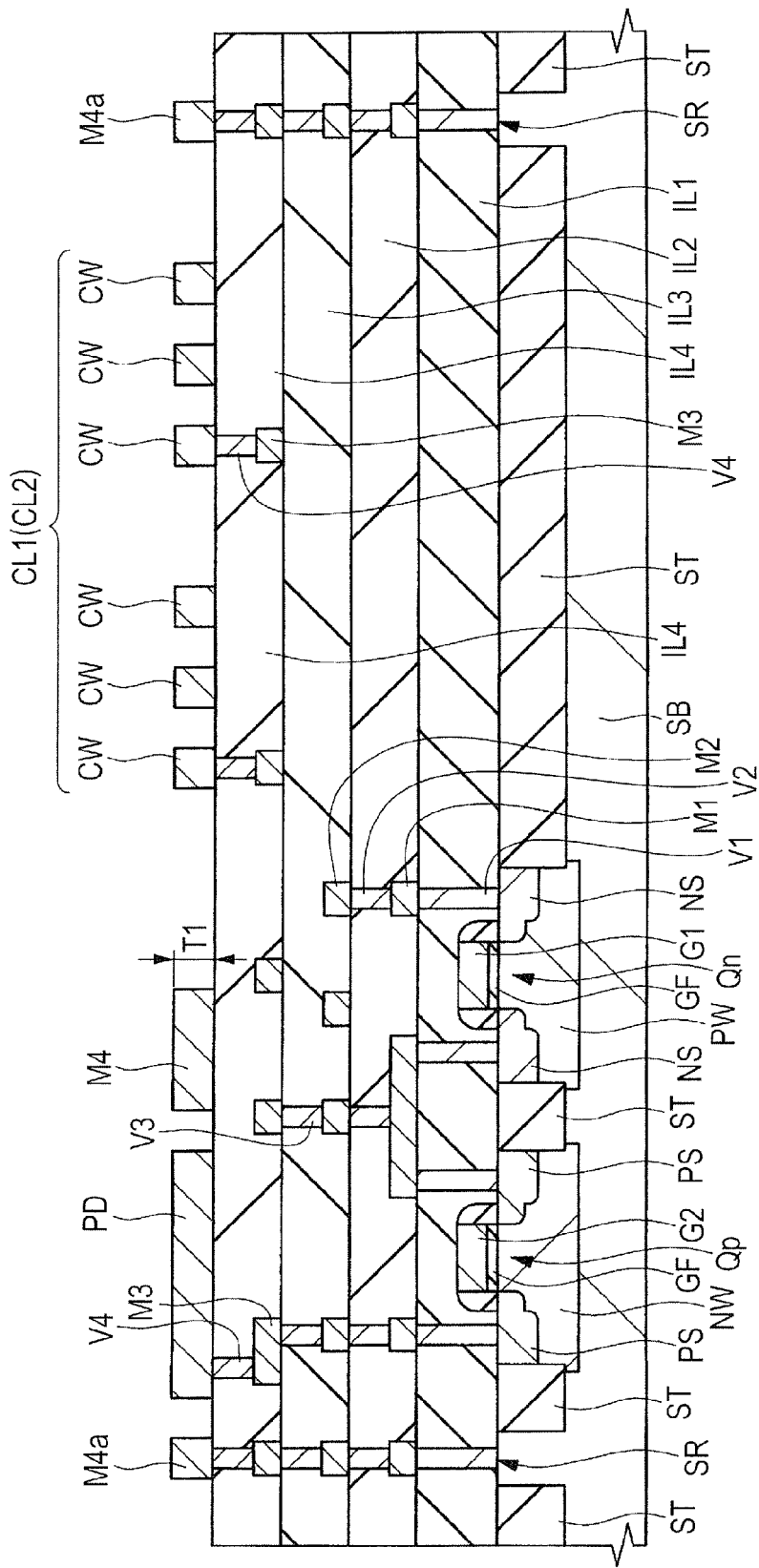
FIG. 30 is a cross-sectional view of the semiconductor chip during the manufacturing process thereof, which is subsequent to FIG. 29.

Next, over the interlayer insulating film IL4 in which the via portions V4 are embedded, the wires M4 in the fourth wiring layer, the pad PD, and the coils CL1 and CL2 (coil wires CW forming the coils CL1 and CL2) are formed. To form the wires M4, the pad PD, and the coils CL1 and CL2 (coil wires CW), first, as shown in FIG. 29, the conductive film CD for the fourth wiring layer is formed over the interlayer insulating film IL4 in which the via portions V4 are embedded. The conductive film CD is made of a laminated film including, e.g., a barrier conductor film (e.g., a titanium film, a titanium nitride film, or a laminated film thereof), an aluminum film, and a barrier conductor film (e.g., a titanium film, a titanium nitride film, or a laminated film thereof) which are stacked upwardly in this order. The conductive film CD can be formed using a sputtering method or the like. The conductive film CD is a conductive film for the fourth wiring layer and serves as each of a conductive film for forming the wires M4, a conductive film for forming the pad PD, a conductive film for forming the coils CL1 and CL2 (coil wires CW), and a conductive film for forming the seal ring wire M4a. Then, the conductive film CD is patterned using a photolithographic technique and an etching technique to be able to form the wires M4, the pad PD, the coils CL1 and CL2 (coil wires), and the seal ring wire M4a, as shown in FIG. 30. The wires M4, the pad PD, the coils CL1 (coil wires CW forming the coils CL1), the coils CL2 (coil wires CW forming the coils CL2), and the seal ring wire M4a are each made of the patterned conductive film CD. Accordingly, the respective thicknesses of the wires M4, the pad PD, the coil wires CW, and the seal ring wire M4a are substantially equal to each other.

The via portions V4 have lower surfaces in contact with the wires M3 to thus be electrically coupled to the wires M3 and have upper surfaces in contact with the pad PD, the coils CL1 (coil wires CW forming the coils CL1), or the coils CL2 (coil wires CW forming the coils CL2) to thus be electrically coupled to the wires M4, the pad PD, and the coils CL1 or CL2. That is, the via portions V4 electrically couple the wires M3 and M4 to each other, electrically couple the wires M3 to the pad PD, electrically couple the wires M3 to the coils CL1 (coil wires CW forming the coils CL1), or electrically couple the wires M3 to the coils CL2 (coil wires CW forming the coils CL2).

When the semiconductor chip CP corresponds to the foregoing semiconductor chip CP1, the coils CL1 and CL2 are the foregoing coils CL1a and CL2a, respectively, and the pad PD is the foregoing pad PD1. When the semiconductor chip corresponds to the foregoing semiconductor chip CP2, the coils CL1 and CL2 are the foregoing coils CL1b and CL2b, respectively, and the pad PD is the foregoing pad PD2.

The description has been given heretofore of the case where the via portions V4 and the wires M4 are formed in different steps. In another form, the via portions V4 can also be formed in the same step of forming the wires M4, the pad PD, and the coils CL1 and CL2 (coil wires CW forming the coils CL1 and CL2). In this case, the via portions V4 are formed integrally with the wires M4, the pad, the coils CL1 (coil wires CW forming the coils CL1), or the coils CL2 (coil wires CW forming the coils CL2). In this case, after the through holes for the via portions V4 are formed in the interlayer insulating film IL4, the foregoing conductive film CD is formed over the interlayer insulating film IL4 so as to be embedded in the through holes and patterned using a photolithographic technique and an etching technique to form the wires M4, the pad PD, and the coils CL1 and CL2 (coil wires CW). Thus, the wires M4, the pad PD, and the coils CL1 and CL2 (coil wires CW) are formed, while the via portions V4 are also formed integrally with the wires M4, the pad PD, the coils CL (coil wires CW forming the coils CL1), or the coils CL2 (coil wires CW forming the coils CL2).

It is also possible to form the foregoing via portions V2 and the foregoing wires M2 in the same step. In that case, the foregoing via portions V2 are formed integrally with the foregoing wires W2. It is also possible to form the foregoing via portions V3 and the foregoing wires M3 in the same step. In that case, the foregoing via portions V3 are formed integrally with the foregoing wires W3.

The pad PD can have a generally rectangular two-dimensional shape having sides each larger than the wire width of each of the wires M4. The pad PD is preferably an aluminum pad containing aluminum as a main component. The wires M4 are preferably aluminum wires containing aluminum as a main component.

Note that, as the aluminum film used for the aluminum pad and the aluminum wires, an Al (aluminum)/Si (silicon) compound or alloy film, an Al (aluminum)/Cu (copper) compound or alloy film, an Al (aluminum)/Si (silicon)/Cu (copper) compound or alloy film, or the like can be used appropriately. The composition ratio of Al (aluminum) is preferably higher than 50 at % (i.e., Al-rich).

Figure 31:
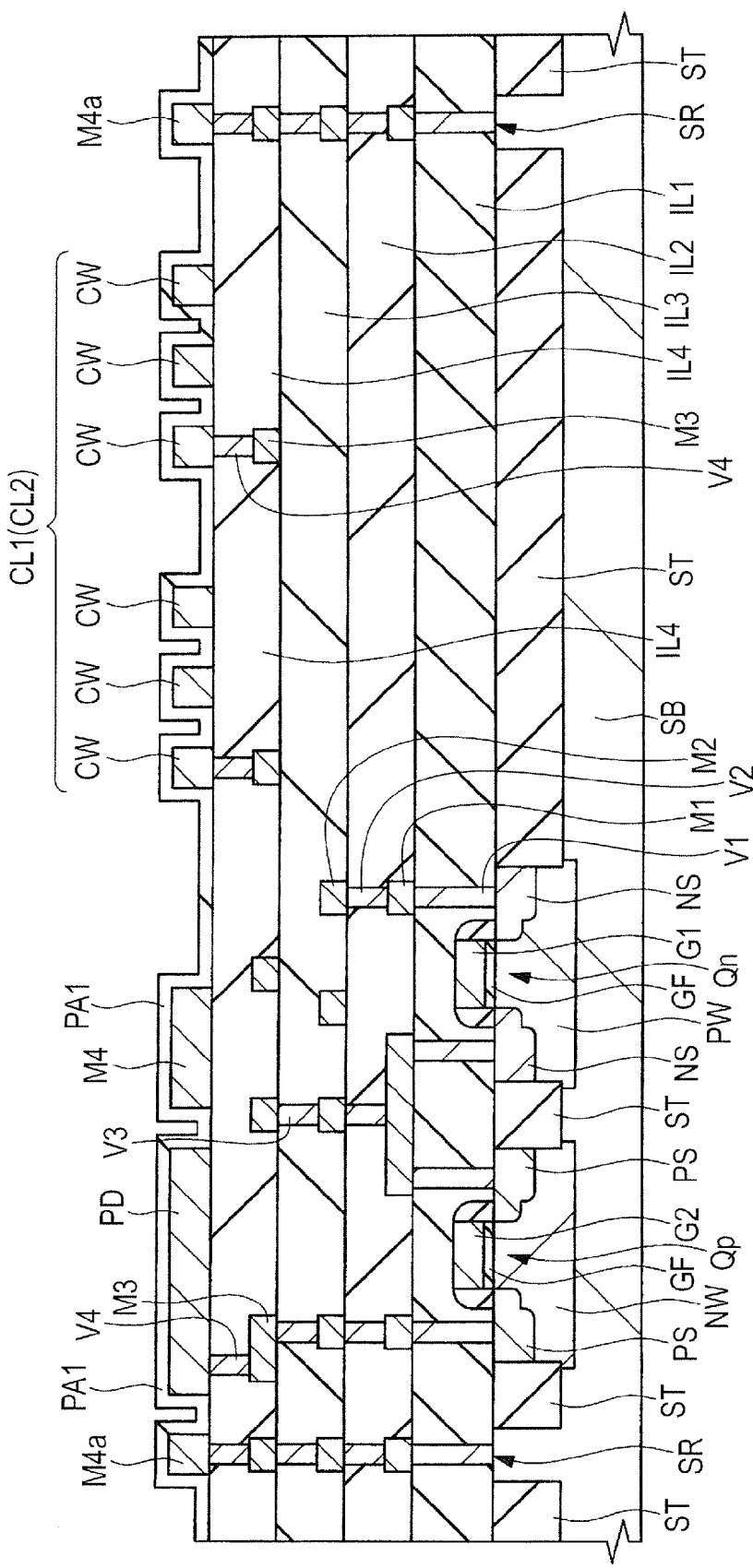
FIG. 31 is a cross-sectional view of the semiconductor chip during the manufacturing process thereof, which is subsequent to FIG. 30.

Next, as shown in FIG. 31, over the main surface (entire main surface) of the semiconductor substrate SB, i.e. over the interlayer insulating film IL4, the insulating film PA1 is formed so as to cover the wires M4, the pad PD, the coils CL1 and CL2 (coil wires CW), and the seal ring wire M4a. The insulating film PA1 is preferably made of a silicon nitride film and can be formed using a CVD method or the like. As a method for depositing a silicon nitride film forming the insulating film PA1, a HDP (High Density Plasma)-CVD method is particularly appropriate. The thickness (formed film thickness) of the insulating film PA1 can be set to, e.g., about 0.3 μm.

At the stage prior to the deposition of the insulating film PA1, the wires M4, the pad PD, the coils CL1 and CL2 (coil wires CW), and the seal ring wire M4a are exposed. When the insulating film PA1 is deposited, the wires M4, the pad PD, the coils CL1 and CL2 (coil wires CW), and the seal ring wire M4a are covered with the insulating film PA to be in a non-exposed state.

Figure 32:
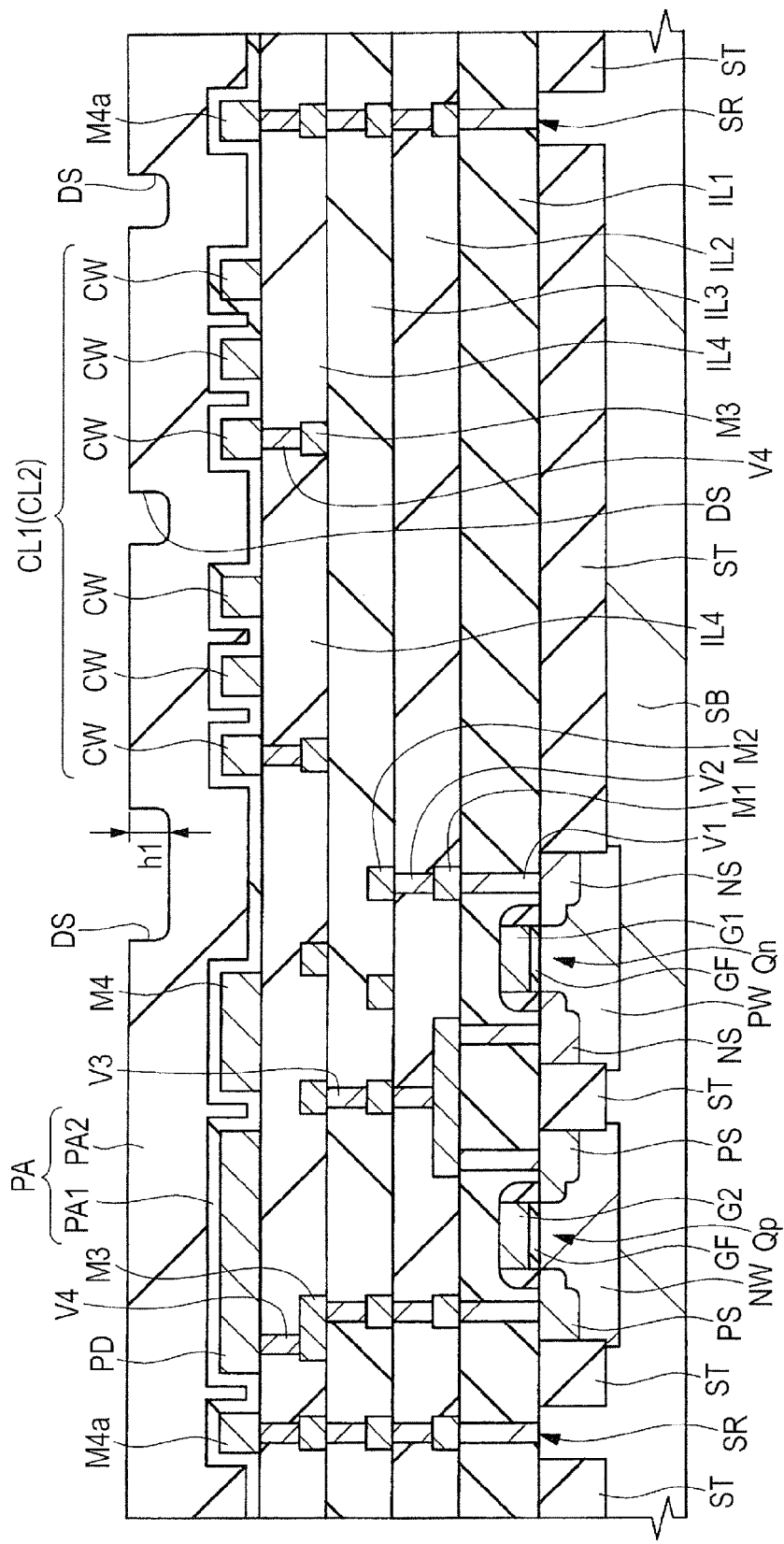
FIG. 32 is a cross-sectional view of the semiconductor chip during the manufacturing process thereof, which is subsequent to FIG. 31.

Next, as shown in FIG. 32, over the main surface (entire main surface) of the semiconductor substrate SB, i.e., over the insulating film PA1, the insulating film PA2 is formed. The insulating film PA2 is preferably made of a resin film. As the insulating film PA2, a polyimide film or the like can be used appropriately. The resin film forming the insulating film PA2 can be formed by, e.g., a coating method. The thickness (formed film thickness) of the insulating film PA2 is larger than the thickness (formed film thickness) of the insulating film PA1 and can be set to, e.g., about 3 μm.

By forming the insulating films PA1 and PA2, a state is reached where the insulating film PA made of a laminated film including the insulating film PA1 and the insulating film PA2 over the insulating film PA1 is formed over the interlayer insulating film IL4 so as to cover the wires M4, the pad PD, the coils CL1 or CL2, and the seal ring wire M4a. The insulating film PA serves as the uppermost-layer film in the manufactured semiconductor chip CP.

At this stage, the process of planarizing the upper surface of the insulating film PA has not been performed yet. Accordingly, depressions DS reflecting an underlying metal pattern (including the pad PD, the wires M4, the coil wires CW, and the seal ring wire M4a herein) are formed in the upper surface of the insulating film PA. The dimension (height) h1 of each of the depressions DS is substantially the same as a thickness T1 of the underlying metal pattern (including the pad PD, the wires M4, the coil wires CW, and the seal ring wire M4a herein). Note that the dimension (height) of each of the depressions in the upper surface of the insulating film PA corresponds to a dimension in a thickness direction (direction generally perpendicular to the main surface of the semiconductor substrate SB) and corresponds to the level difference between the upper surface of the insulating film PA and the bottom surface of the depression. The dimension h1 is shown in FIG. 32. The thickness T1 is shown in FIG. 30 described above.

Next, the process (step) of planarizing the upper surface of the insulating film PA is performed. The process of planarizing the upper surface of the insulating film PA can also be regarded as the process of enhancing the planarity of the upper surface of the insulating film PA. The following will specifically describe the process of planarizing the upper surface of the insulating film PA with reference to FIGS. 33 to 35. Note that, here, the insulating film PA is a laminated insulating film. Since the uppermost layer of the insulating film PA is the insulating film PA2, the "upper surface of the insulating film PA" and the "upper surface of the insulating film PA2" are substantially the same.

Figure 33:
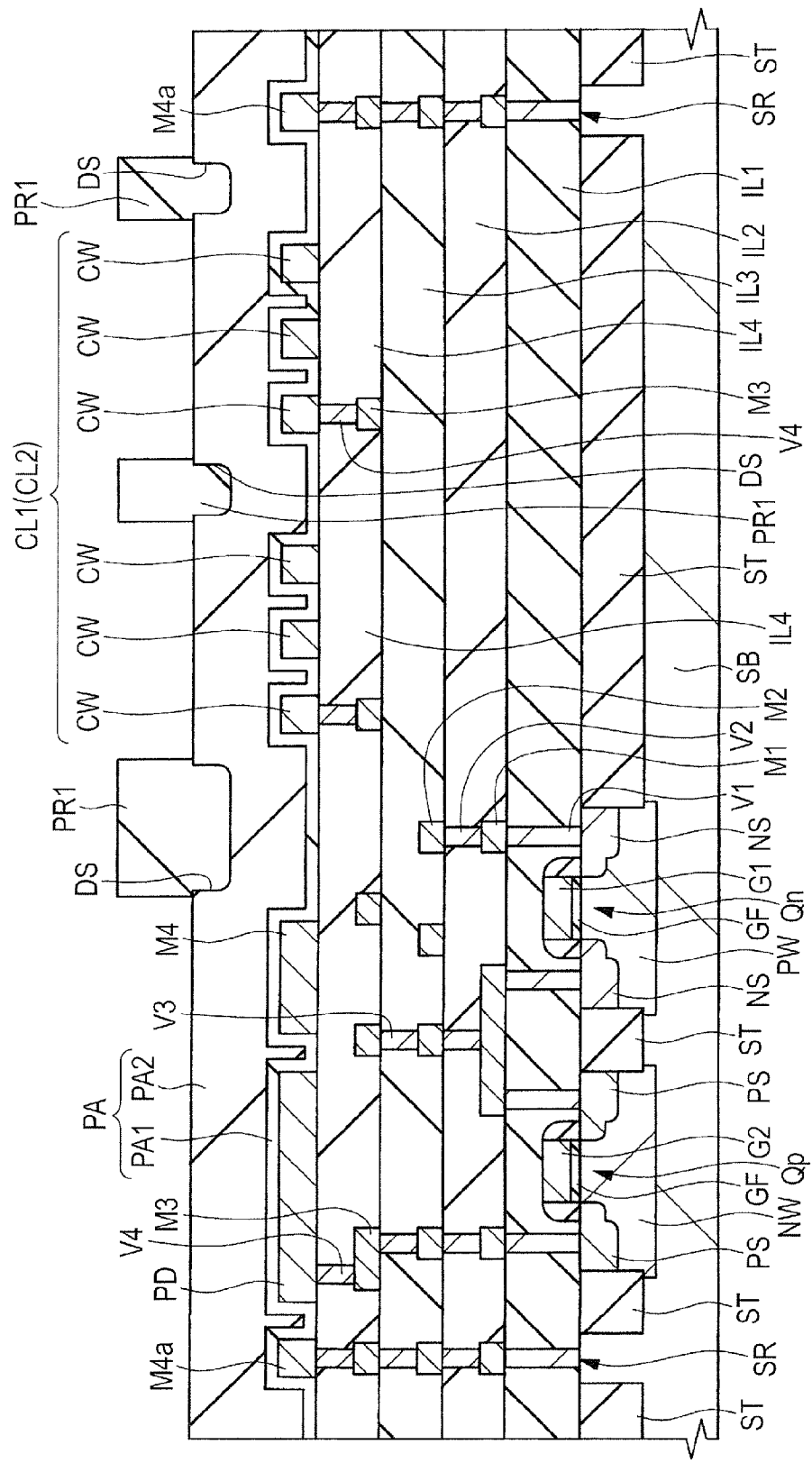
FIG. 33 is a cross-sectional view of the semiconductor chip during the manufacturing process thereof, which is subsequent to FIG. 32.

First, as shown in FIG. 33, over the upper surface of the insulating film PA (i.e. over the upper surface of the insulating film PA2), a photoresist pattern (photoresist layer) PR1 is formed using a photolithographic technique.

The photoresist pattern PR1 is formed locally over the region of the upper surface of the insulating film PA which is lower in level and is not formed over the region of the upper surface of the insulating film PA which is higher in level. Accordingly, when the photoresist pattern PR1 is formed, a state is reached where the region of the upper surface of the insulating film PA which is lower in level is covered with the photoresist pattern PR1, while the region of the upper surface of the insulating film PA which is higher in level is uncovered with the photoresist pattern PR1 and exposed. That is, the state is reached where, over the regions of the upper surface of the insulating film PA which are located in the depressed portions DS, the photoresist pattern PR1 is formed while, over the region of the upper surface of the insulating film PA which is located outside the depressed portions DS, the photoresist pattern PR1 is scarcely formed.

Figure 34:
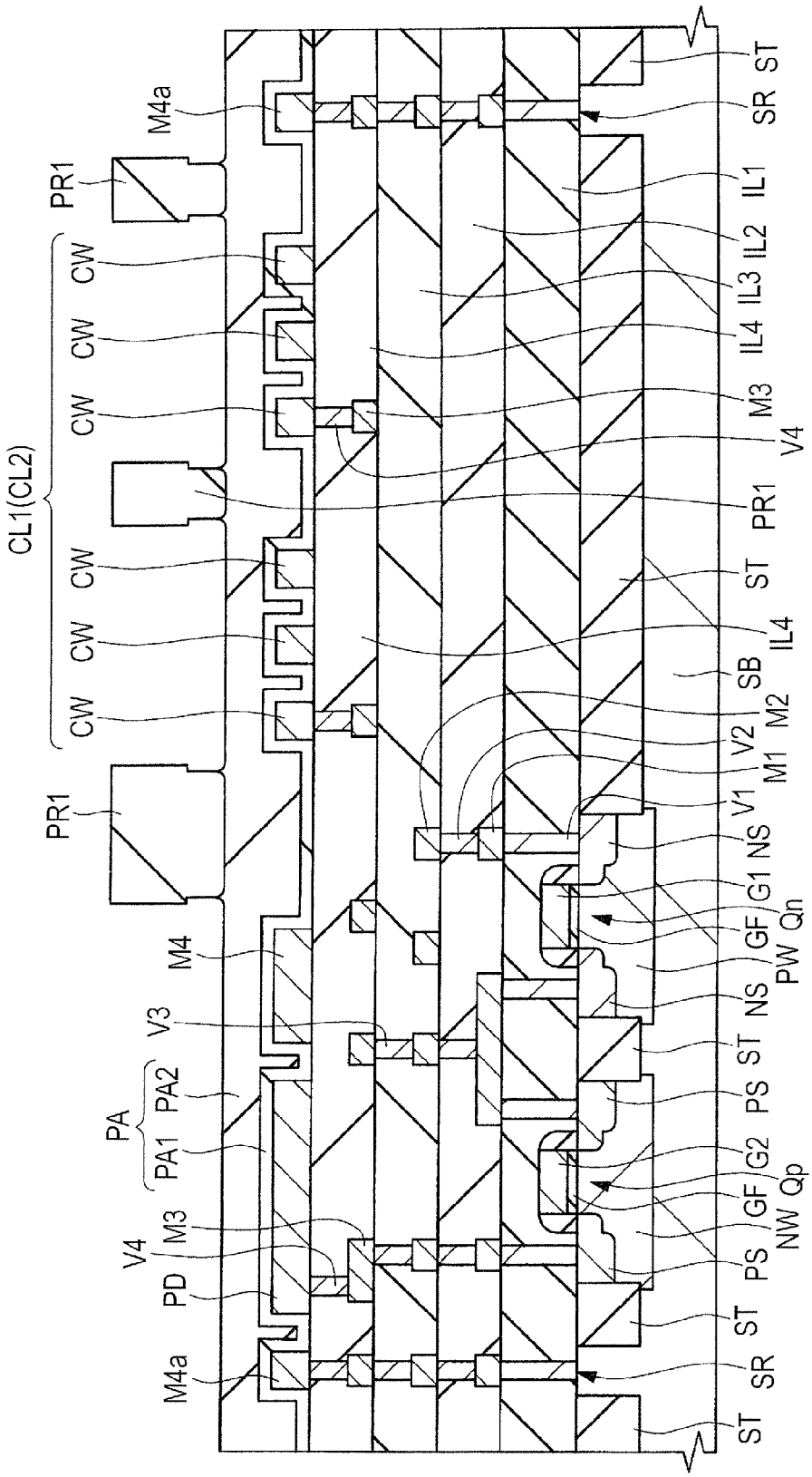
FIG. 34 is a cross-sectional view of the semiconductor chip during the manufacturing process thereof, which is subsequent to FIG. 33.

Then, as shown in FIG. 34, using the photoresist pattern PR1 as an etching mask, the insulating film PA (more specifically the insulating film PA2) is etched back (subjected to etching). The etch-back step will be hereinafter referred to as the "etch-back step in FIG. 34").

Figure 35:
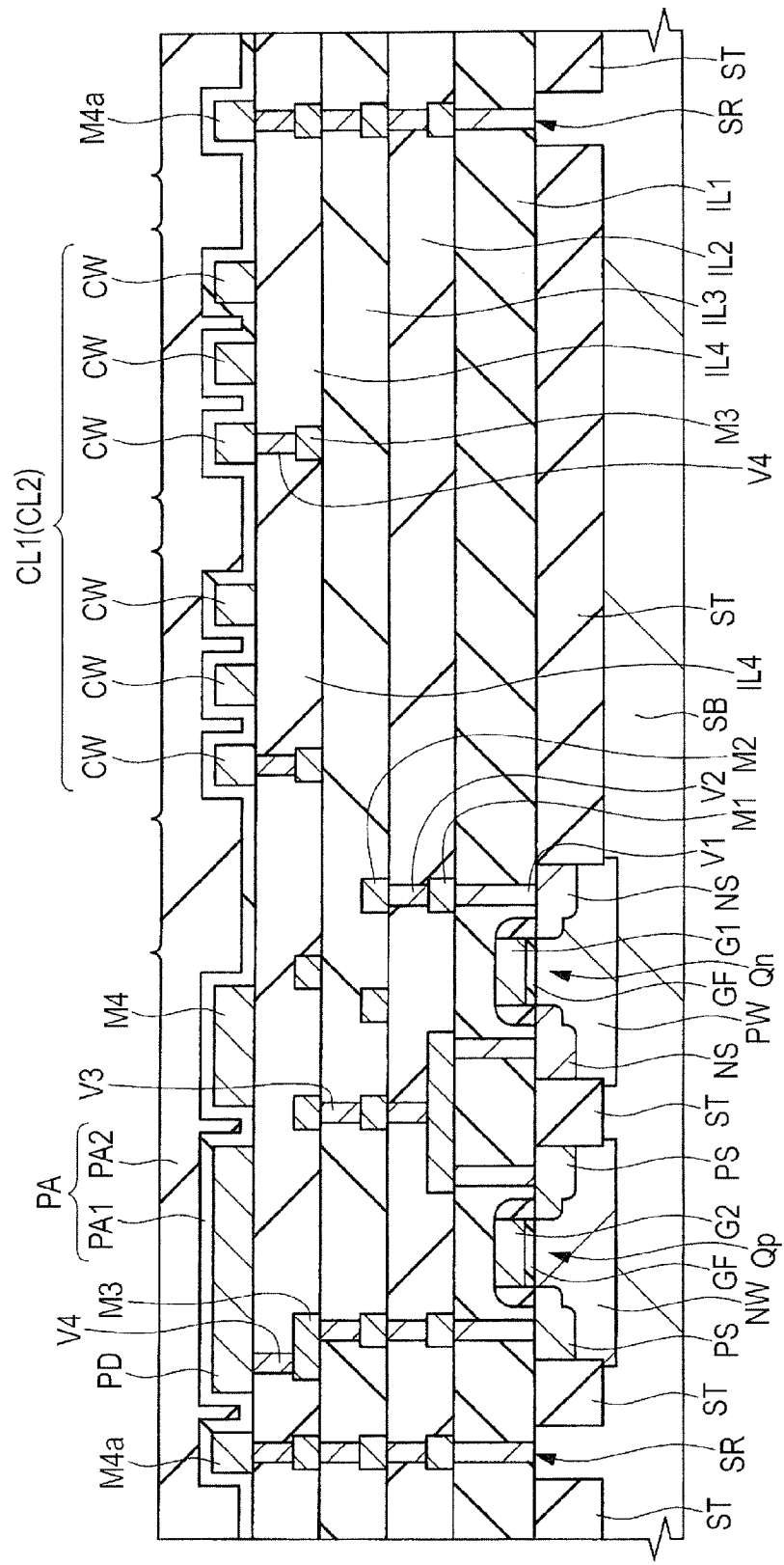
FIG. 35 is a cross-sectional view of the semiconductor chip during the manufacturing process thereof, which is subsequent to FIG. 34.

As the etch-back step in FIG. 34, anisotropic etching is preferably used. By the etch-back step in FIG. 34, the exposed portion of the insulating film PA (more specifically the insulating film PA2) which is uncovered with the photoresist pattern PR1 is selectively etched to have a smaller thickness. The etch-back step in FIG. 34 is performed so as to planarize the upper surface of the insulating film PA and enhance the planarity of the upper surface of the insulating film PA. Accordingly, the amount of etching (the thickness of the etched portion) in the etch-back step in FIG. 34 is preferably controlled to be about the same as the dimension h1 of each of the depressions DS at the stage before the etch-back step is performed. After the etch-back step in FIG. 34, as shown in FIG. 35, the photoresist pattern PR1 is removed.

Preferably, the etch-back step in FIG. 34 is ended before the insulating film PA1 is exposed to prevent the insulating film PA2 from being excessively etched back and thus prevent the insulating film PA1 from being exposed. Since the dimension h1 of each of the depressions DS is about the same as the foregoing thickness T1 of the metal pattern, the formed film thickness of the insulating film PA2 is controlled to be larger than the foregoing thickness T1 of the metal pattern. Since the amount of etching (thickness of the etched portion) in the etch-back step is smaller than the formed film thickness of the insulating film PA2, the insulating film PA2 remains in the form of a layer even after the etch-back step.

Before the etch-back step in FIG. 34 is performed, the depressions DS (or unevenness) resulting from the underlying metal pattern (including the wires M4, the pad PD, the coil wires CW, and the seal ring wire M4a herein) are present in the upper surface of the insulating film PA. However, by performing the etch-back step in FIG. 34, the upper surface of the insulating film PA is planarized. That is, the depressions (or unevenness) of the upper surface of the insulating film PA before the etch-back step in FIG. 34 is performed are reduced after the etch-back step in FIG. 34 is performed, resulting in the enhanced planarity of the upper surface of the insulating film PA. In other words, the dimension (height) of each of the depressions (or unevenness) formed in the upper surface of the insulating film PA is smaller after the etch-back step in FIG. 34 is performed than before the etch-back step in FIG. 34 is performed. That is, by performing the etch-back step in FIG. 34, the upper surface of the insulating film PA is planarized to result in a state where the depressions DS reflecting the underlying metal pattern are not formed in the upper surface of the insulating film PA. Otherwise, even when depressions are formed in the upper surface of the insulating film PA, the dimension (height) of each of the depressions is smaller than the dimension (height) h1 of each of the depressions DS before the etch-back step.

Thus, the process of planarizing the upper surface of the insulating film PA is performed.

Figure 36:
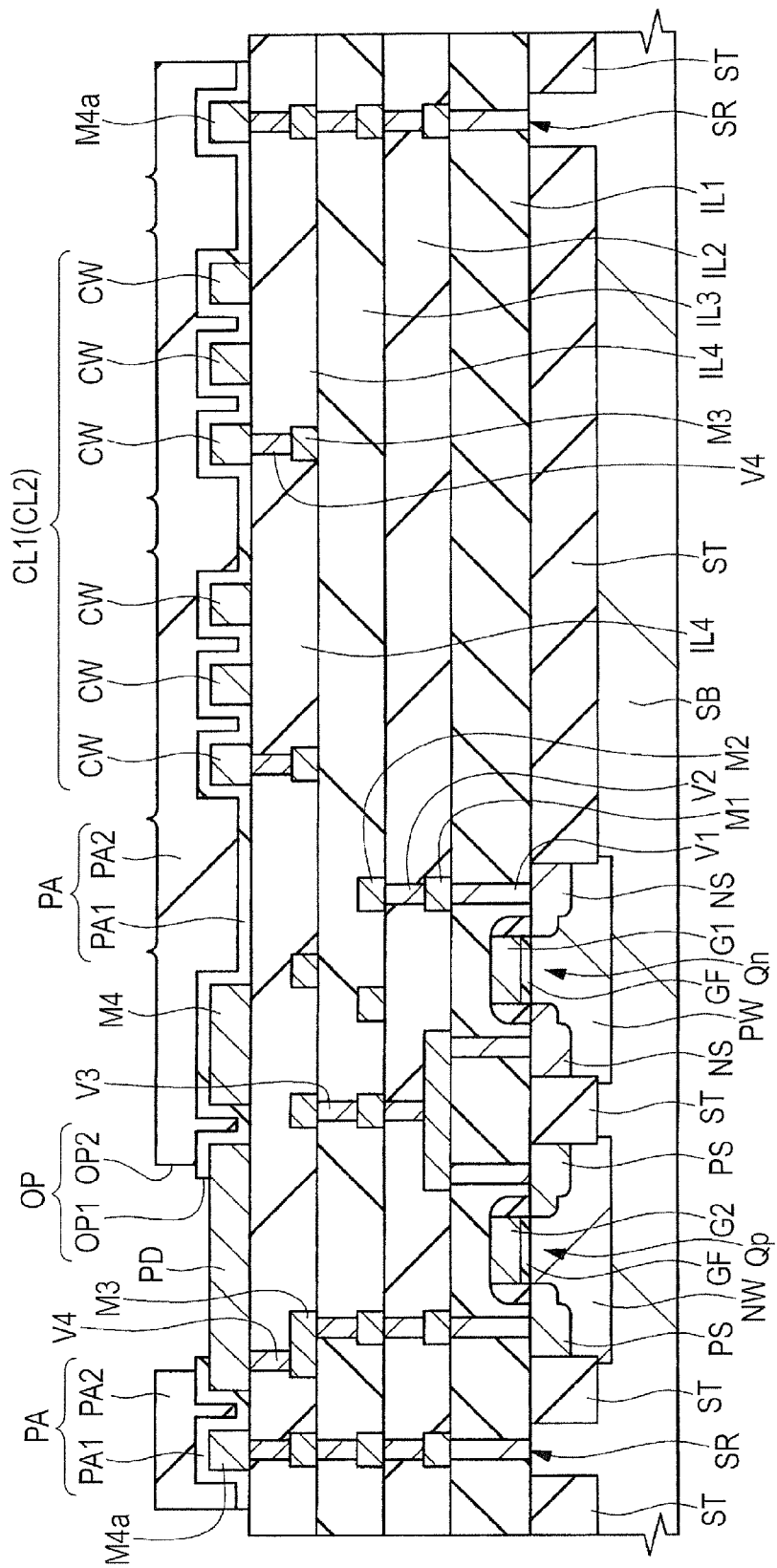
FIG. 36 is a cross-sectional view of the semiconductor chip during the manufacturing process thereof, which is subsequent to FIG. 35.

Next, as shown in FIG. 36, in the insulating film PA made of the laminated film including the insulating films PA1 and PA2, the opening OP is formed. When the opening OP is formed, the pad PD is exposed at the bottom portion of the opening OP. The step of forming the opening OP can be performed, e.g., as follows.

A description will be given of a first method of forming the opening OP. In the first method, after the process of planarizing the upper surface of the insulating film PA is performed as described above, a photoresist pattern (not shown) is formed over the insulating film PA2 using a photolithographic technique. Then, using the photoresist pattern as an etching mask, dry etching is performed on the insulating film PA2 to form the opening OP2 in the insulating film PA2. Subsequently, the photoresist pattern is removed and then a photoresist pattern (not shown) is formed again over the insulating film PA2 using a photolithographic technique. Then, using the photoresist pattern as an etching mask, dry etching is performed on the insulating film PA1 to form the opening OP1 in the insulating film PA1.

A description will be given of a second method of forming the opening OP. In the second method, when the insulating film PA2 is formed, the insulating film PA2 is formed as a photosensitive resin film. Subsequently, the process of planarizing the upper surface of the insulating film PA is performed as described above and then the insulating film PA2 made of a photosensitive resin is exposed to light/developed. By thus selectively removing the portion of the insulating film PA2 where the opening OP2 is to be formed, the opening OP2 is formed in the insulating film PA2. Then, heat treatment is performed to cure the insulating film PA2. Then, over the insulating film PA2, a photoresist pattern (not shown) is formed using a photolithographic technique. Using the photoresist pattern as an etching mask, dry etching is performed on the insulating film PA1 to form the opening OP1 in the insulating film PA1.

A description will be given of a third method of forming the opening OP. In the third method, after the insulating film PA1 is formed (deposited) and before the insulating film PA2 is formed, the opening OP1 is formed in the insulating film PA1. Specifically, after the insulating film PA1 is formed, a photoresist pattern (not shown) is formed over the insulating film PA1 using a photolithographic technique. Then, using the photoresist pattern as an etching mask, dry etching is performed on the insulating film PA1 to form the opening OP1 in the insulating film PA1. Subsequently, the photoresist pattern is removed and then the insulating film PA2 is formed. Thereafter, the process of planarizing the upper surface of the insulating film PA is performed as described above. Then, the opening OP2 is formed in the insulating film PA2. A method of forming the opening OP1 in the insulating film PA2 is the same as the method of forming the opening OP1 in the insulating film PA2 in the foregoing first or second method.

A description will be given of a fourth method of forming the opening OP. In the fourth method, after the process of planarizing the upper surface of the insulating film PA is performed as described above, a photoresist pattern (not shown) is formed over the insulating film PA2 using a photolithographic technique. Then, using the photoresist pattern as an etching mask, dry etching is performed successively on the insulating films PA2 and PA1 to form the opening OP2 in the insulating film PA2 and form the opening OP1 in the insulating film PA1. In this case, the openings OP1 and OP2 are formed using the same photoresist pattern so that the opening OP2 of the insulating film PA2 and the opening OP1 of the insulating film PA1 substantially coincide with each other in plan view. Then, the photoresist pattern is removed.

In any of the first, second, third, and fourth methods, a state is achieved where the opening OP2 is formed so as to extend through the insulating film PA2, the opening OP1 is formed so as to extend through the insulating film PA1, the opening OP including the opening OP2 of the insulating film PA2 and the opening OP1 of the insulating film PA1 is formed in the insulating film PA, and the pad PD is exposed at the bottom portion of the opening OP. In the first, second, and third methods, the opening OP1 is included in the opening OP2 in plan view while, in the fourth method, the opening OP1 substantially coincides with the opening OP2 in plan view.

Note that, when the opening OP2 is formed in the insulating film PA2, the insulating film PA2 is also preferably removed from a scribe region. When the opening OP1 is formed in the insulating film PA1, the insulating film PA1 is also preferably removed from the scribe region. By doing so, when the opening OP is formed in the insulating film PA, a state where the insulating films PA1 and PA2 are not formed over the interlayer insulating film IL4 is achieved in the scribe region. This facilitates a dicing step performed later.

Thus, the insulating film PA having the opening OP exposing at least a part of the pad PD is formed. The insulating film PA is made of a laminated film including the insulating films PA1 and PA2. The insulating film PA has the opening OP exposing at least a part of the pad PD. The opening OP is formed of the opening OP2 of the insulating film PA2 and the opening OP1 of the insulating film PA1. Preferably, the opening OP1 of the insulating film PA1 is included in the pad PD in plan view and the opening OP2 of the insulating film PA2 includes the opening OP1 of the insulating film PA1 in plan view. In that case, the inner wall of the opening OP of the insulating film PA is formed of the inner wall of the opening OP2 of the insulating film PA2, the inner wall of the opening OP1 of the insulating film PA1, and the upper surface of the insulating film PA1 located between the respective inner walls of the openings OP1 and OP2 and uncovered with the insulating film PA2.

Note that, in the case where the pad PD is formed of the laminated film including the barrier conductor film, the aluminum film over the barrier conductive film, and the barrier conductor film over the aluminum film as described above, when the opening OP1 is formed in the insulating film PA1, it is also possible to remove the barrier conductor film (upper-layer barrier conductive film) exposed from the opening OP1 by etching and expose the aluminum film forming the pad PD from the opening OP1. After the aluminum film forming the pad PD is exposed from the opening OP1, an underlying metal film (not shown) can also be formed over the aluminum film exposed from the opening OP1. The underlying metal film is made of a laminated film including, e.g., a nickel (Ni) film and a gold (Au) film over the nickel (Ni) film or the like. The formation of the underlying metal film leads to the coupling of the foregoing wires BW to the underlying metal film. As a result, the foregoing wires BW can easily be coupled.

Thereafter, the back surface of the semiconductor substrate SB is ground or polished as necessary to reduce the thickness of the semiconductor substrate SB. Then, the semiconductor substrate SB is subjected to dicing (cutting) together with the laminated structure over the semiconductor substrate SB. At this time, the semiconductor substrate SB and the laminated structure over the semiconductor substrate SB are diced (cut) along the scribe region. Thus, from the individual chip regions of the semiconductor substrate SB (semiconductor wafer), semiconductor chips are acquired.

In this manner, the semiconductor chip (semiconductor device) CP can be manufactured.

<About Stacking of Semiconductor Chips>

Figure 37:
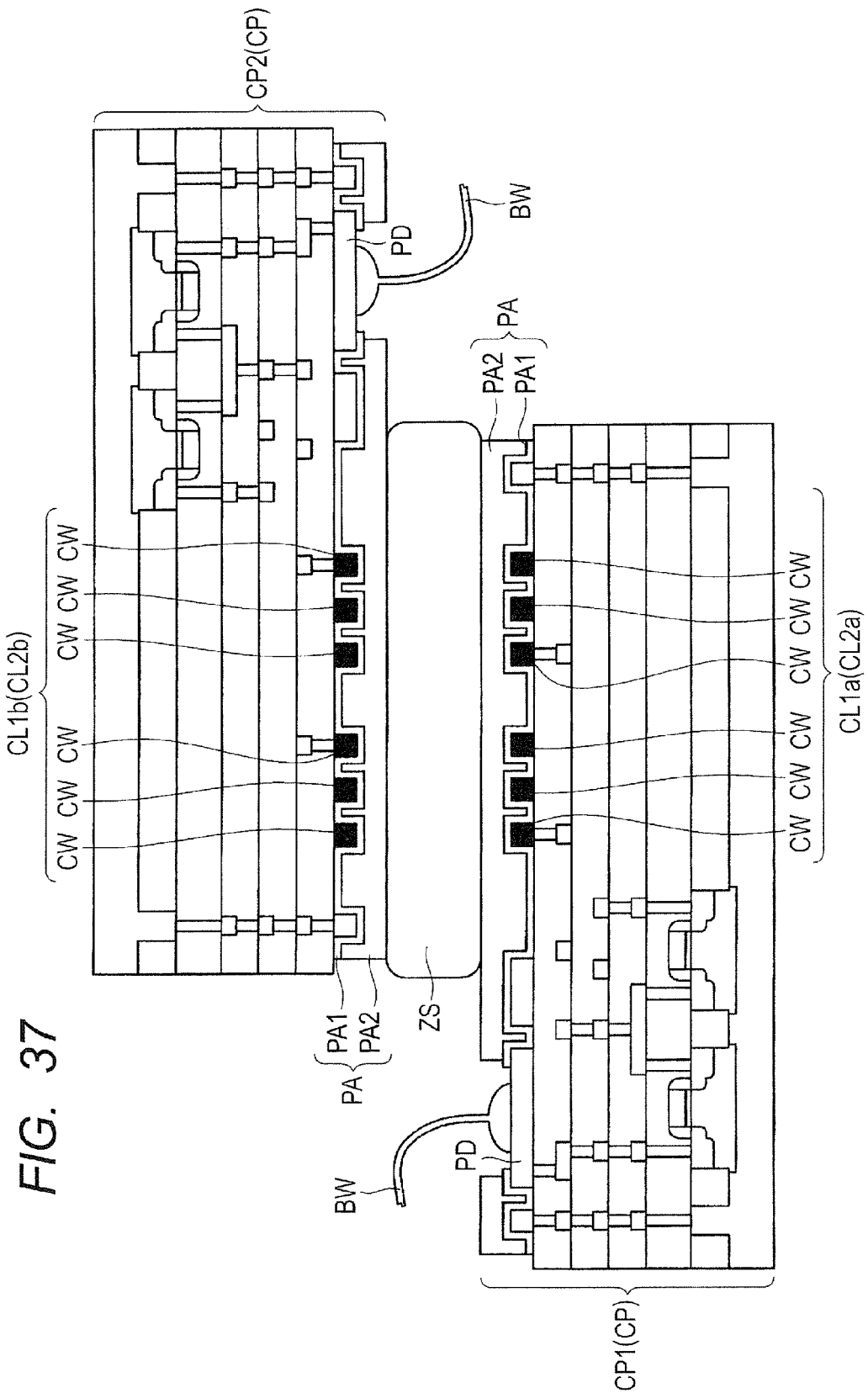
FIG. 37 is a partially enlarged cross-sectional view showing a part of the semiconductor package in FIG. 9 in enlarged relation.

FIG. 37 is a partially enlarged cross-sectional view showing a part of the semiconductor package PKG in FIG. 9 described above in enlarged relation. Note that, in FIG. 37, for improved clarity of illustration, the illustration of the sealing resin portion MR, the die pad DP, and the leads LD is omitted.

In FIG. 37, to the cross-sectional structure of each of the semiconductor chips CP1 and CP2, the cross-sectional structure of the semiconductor chip CP in FIG. 18 is applied. That is, in FIG. 37, the cross-sectional structure of each of the semiconductor chips CP1 and CP2 is substantially the same as the cross-sectional structure of the semiconductor chip CP in FIG. 18 described above. However, the semiconductor chips CP1 and CP2 actually have different semiconductor elements and wires in accordance with the difference between the circuit formed in the semiconductor chip CP1 and the circuit formed in the semiconductor chip CP2. However, the content of the description about the configuration and manufacturing method of the semiconductor chip CP2 described above is common to the semiconductor chips CP1 and CP2.

As shown in FIGS. 18 and 37 described above, the semiconductor chip CP1 includes the semiconductor substrate SB, a wiring structure including one or more wiring layers (preferably a plurality of wiring layers) formed over the semiconductor substrate SB, the coils CL1$a$ and CL2$a$ formed in the wiring structure, and the insulating film PA formed over the wiring structure. On the other hand, the semiconductor chip CP2 has the semiconductor substrate SB, a wiring structure including one or more wiring layers (preferably a plurality of wiring layers) formed over the semiconductor substrate SB, the coils CL1$b$ and CL2$b$ formed in the wiring structure, and the insulating film PA formed over the wiring structure. In the semiconductor chip CP1, the insulating film PA is the uppermost-layer film. In the semiconductor chip CP2, the insulating film PA is the uppermost-layer film. The semiconductor chips CP1 and CP2 are stacked via the insulating sheet ZS with the insulating film PA of the semiconductor chip CP1 and the insulating film PA of the semiconductor chip CP2 facing each other. Consequently, between the insulating film PA of the semiconductor chip CP1 and the insulating film PA of the semiconductor chip CP2, the insulating sheet ZS is interposed. The insulating film PA of the semiconductor chip CP1 is in contact with one surface of the insulating sheet ZS, while the insulating film PA of the semiconductor chip CP2 is in contact with the other surface of the insulating sheet ZS. The coils CL1$a$ of the semiconductor chip CP1 and the coils CL1$b$ of the semiconductor chip CP2 overlap each other in plan view and are not electrically coupled via a conductor, but are magnetically coupled to each other. The coils CL2$a$ of the semiconductor chip CP1 and the coils CL2$b$ of the semiconductor chip CP2 overlap each other in plan view and are not electrically coupled via a conductor, but are magnetically coupled to each other.

Note that, in FIG. 37, for improved clarity of illustration, the foregoing coil wires CW formed in the semiconductor chips CP1 and CP2 are shown blacked out, while the other types of hatching are omitted.

Between the coils CL1a of the semiconductor chip CP1 and the coils CL1b of the semiconductor chip CP2, the insulating film PA of the semiconductor chip CP1, the insulating film PA of the semiconductor chip CP2, and the insulating sheet ZS are interposed. The coils CL1a of the semiconductor chip CP1 and the coils CL1b of the semiconductor chip CP2 are insulated from each other by the insulating film PA of the semiconductor chip CP1, the insulating film PA of the semiconductor chip CP2, and the insulating sheet ZS. Also, between the coils CL2a of the semiconductor chip CP1 and the coils CL2b of the semiconductor chip CP2, the insulating film PA of the semiconductor chip CP1, the insulating film PA of the semiconductor chip CP2, and the insulating sheet ZS are interposed. The coils CL2a of the semiconductor chip CP1 and the coils CL2b of the semiconductor chip CP2 are insulated from each other by the insulating film PA of the semiconductor chip CP1, the insulating film PA of the semiconductor chip CP2, and the insulating sheet ZS. This allows the breakdown voltage (dielectric breakdown voltage) between the semiconductor chips CP1 and CP2 to be ensured using the insulating film PA of the semiconductor chip CP1, the insulating film PA of the semiconductor chip CP2, and the insulating sheet ZS. Therefore, it is possible to ensure the breakdown voltage (dielectric breakdown voltage) between the coils CL1a of the semiconductor chip CP1 and the coils CL1b of the semiconductor chip CP2 and the breakdown voltage (dielectric breakdown voltage) between the coils CL2a of the semiconductor chip CP1 and the coils CL2b of the semiconductor chip CP2 using the insulating film PA of the semiconductor chip CP1, the insulating film PA of the semiconductor chip CP2, and the insulating sheet ZS.

When the thickness of the insulating film PA is excessively increased in each of the semiconductor chips CP1 and CP2, the semiconductor wafer is likely to warp while the semiconductor chips are manufactured. Consequently, the manufacturing process of the semiconductor chips CP1 and CP2 is hard to perform. On the other hand, the thickness of the insulating sheet ZS is easy to control. Using the insulating sheet ZS having an intended thickness, the foregoing semiconductor package PKG can be manufactured. Accordingly, the thickness of the insulating sheet ZS is preferably larger than the thickness of the insulating film PA of the semiconductor chip CP1 and larger than the thickness of the insulating film PA of the semiconductor chip CP2. In other words, each of the thickness of the insulating film PA of the semiconductor chip CP1 and the thickness of the insulating film PA of the semiconductor chip CP2 is smaller than the thickness of the insulating sheet ZS. This can inhibit or prevent the semiconductor wafer from warping during the manufacturing process of the semiconductor chips. As a result, the manufacturing process of the semiconductor chips CP1 and CP2 is easier to perform and a sufficient breakdown voltage can be ensured between the semiconductor chips CP1 and CP2 by mainly using the insulating sheet ZS.

<About Study by Present Inventors>

The present inventors have studied a technique in which, as shown in FIG. 37 described above and FIG. 39 described later, the two semiconductor chips are stacked with the insulating sheet (ZS) being interposed therebetween, the coils of one of the semiconductor chips are magnetically coupled (inductively coupled) to the coils of the other semiconductor chip, and a signal is transmitted from one of the semiconductor chips to the other semiconductor chip via the magnetically coupled coils.

The technique allows the breakdown voltage between one of the semiconductor chips and the other semiconductor chip to be adjusted by adjusting the thickness of the insulating sheet (ZS). For example, when a high breakdown voltage is required, by increasing the thickness of the insulating sheet (ZS) interposed between the two semiconductor chips, it is possible to increase the breakdown voltage between one of the semiconductor chips and the other semiconductor chip.

As a result of conducting study, the present inventors have found that the following problem occurs in the semiconductor package (semiconductor device) in which the coils of one of the two semiconductor chips and the coils of the other semiconductor chip are stacked with the insulating sheet (ZS) being interposed therebetween and magnetically coupled to each other. That is, the present inventors have found that a phenomenon may occur in which the insulating sheet (ZS) interposed between the two semiconductor chips peels off the semiconductor chips to result in a lower breakdown voltage (dielectric breakdown voltage) between one of the semiconductor chips and the other semiconductor chip. Referring to the studied example in FIG. 38, a specific description will be given below.

Figure 38:
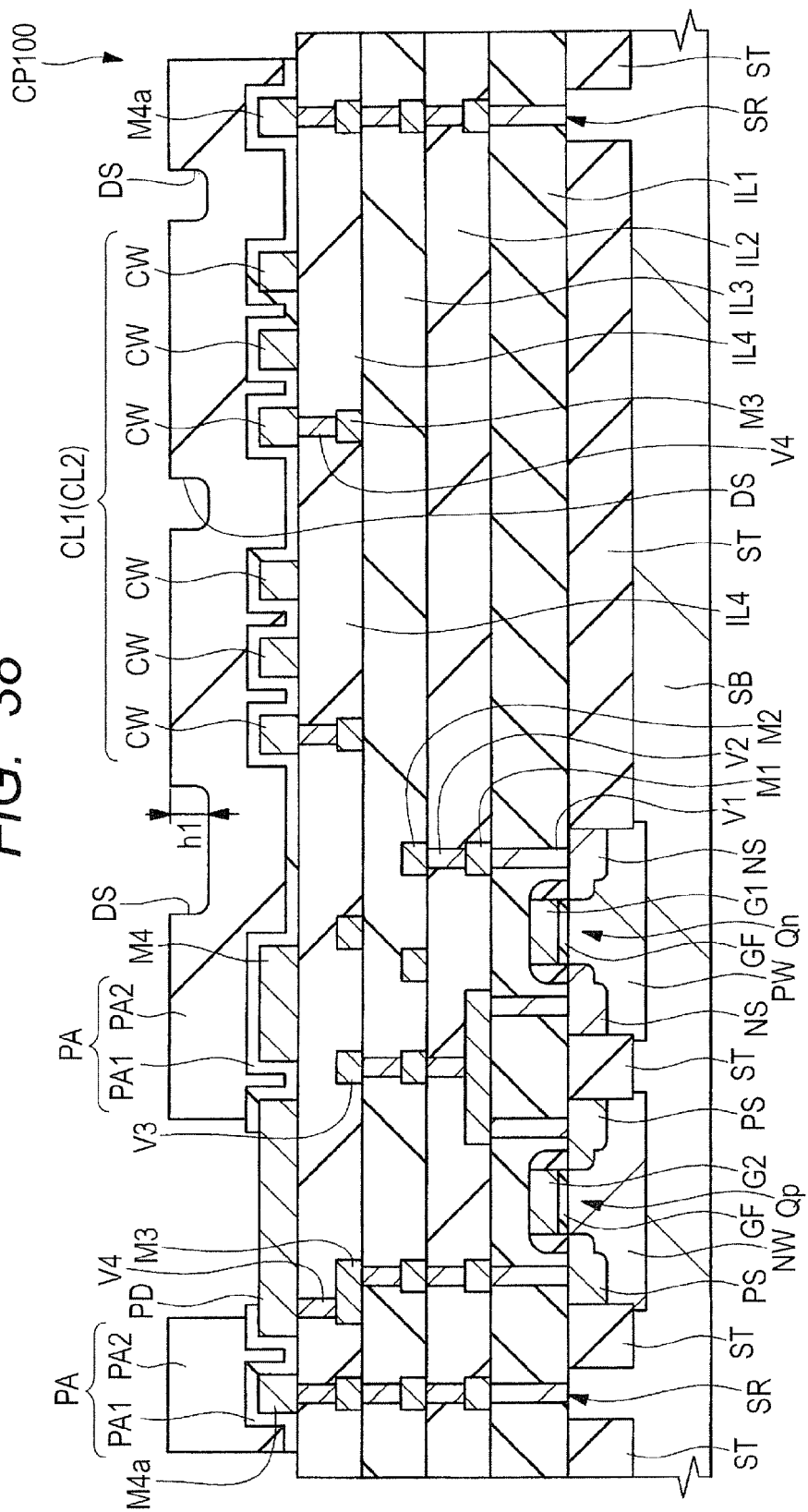
FIG. 38 is a cross-sectional view of a semiconductor chip in a studied example.

FIG. 38 is a cross-sectional view of a semiconductor chip CP100 in the studied example studied by the present inventors, which corresponds to FIG. 18 described above in the present embodiment.

The semiconductor chip CP100 shown in FIG. 38 is mainly different from the semiconductor chip CP in the present embodiment shown in FIG. 18 described above in that, in the semiconductor chip CP100 shown in FIG. 38, after the insulating film PA2 is formed, the process of planarizing the upper surface of the insulating film PA described above has not been performed. That is, when the semiconductor chip CP100 shown in FIG. 38 is manufactured, after the insulating film PA2 is formed, the steps in FIGS. 33 to 35 described above in the present embodiment are not performed. Consequently, in the semiconductor chip CP100 in the studied example shown in FIG. 38, the depressions DS are formed in the upper surface of the insulating film PA (i.e., the upper surface of the insulating film PA2).

The depressions DS are undesirably formed when there are vacant spaces where the metal pattern is not formed and the areas of the vacant spaces are rather large. The dimension (height) h1 of each of the depressions DS is generally the same as the thickness (height) of each of the wires M4, the coil wires CW, the pad PD, and the seal ring wire M4a which are formed in the uppermost wiring layer.

Figure 39:
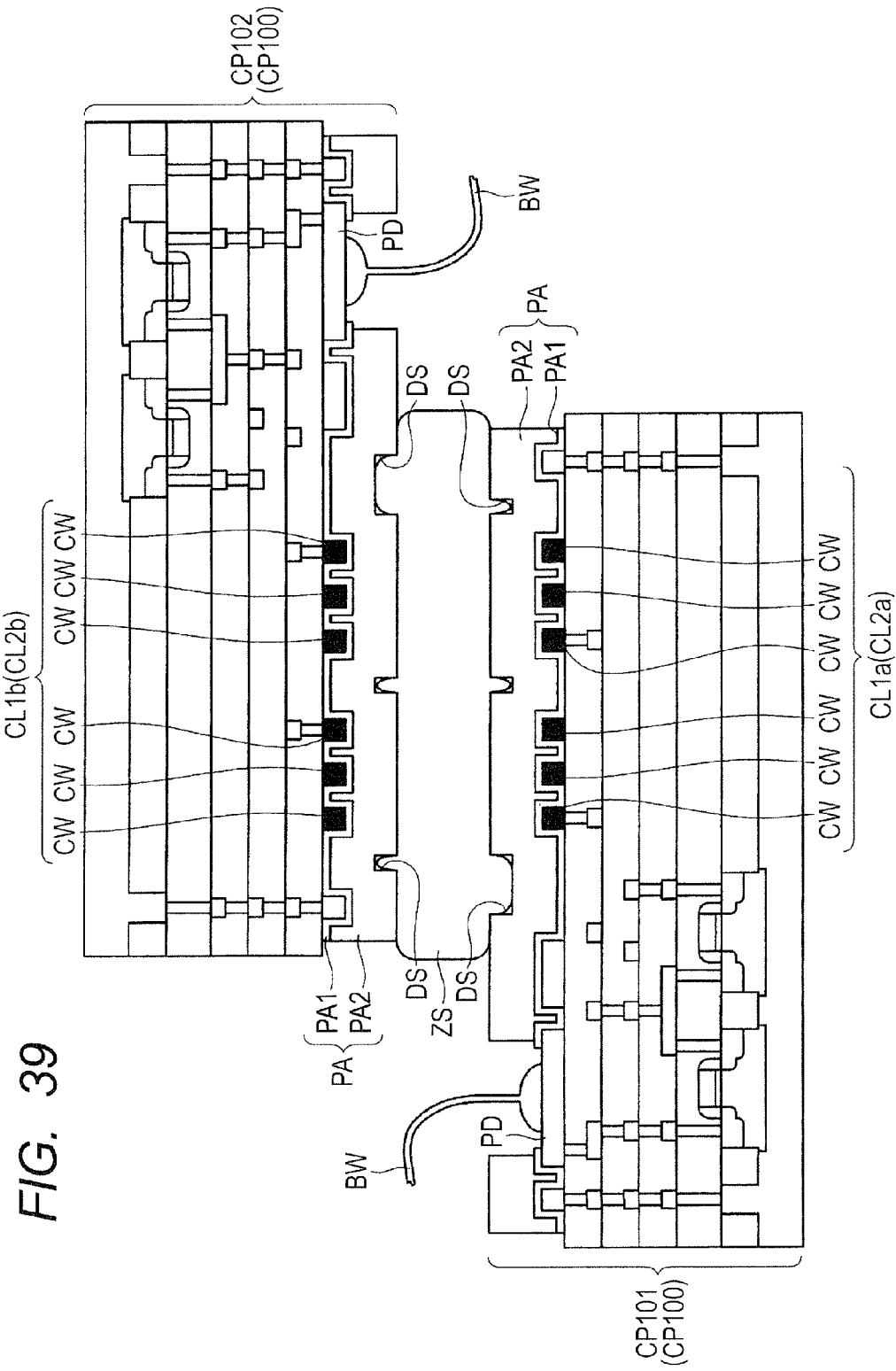
FIG. 39 is a partially enlarged cross-sectional view showing, in enlarged relation, a part of a semiconductor package obtained by applying the semiconductor chip in the studied example to the semiconductor chip of the semiconductor package in FIG. 9.
Figure 40:
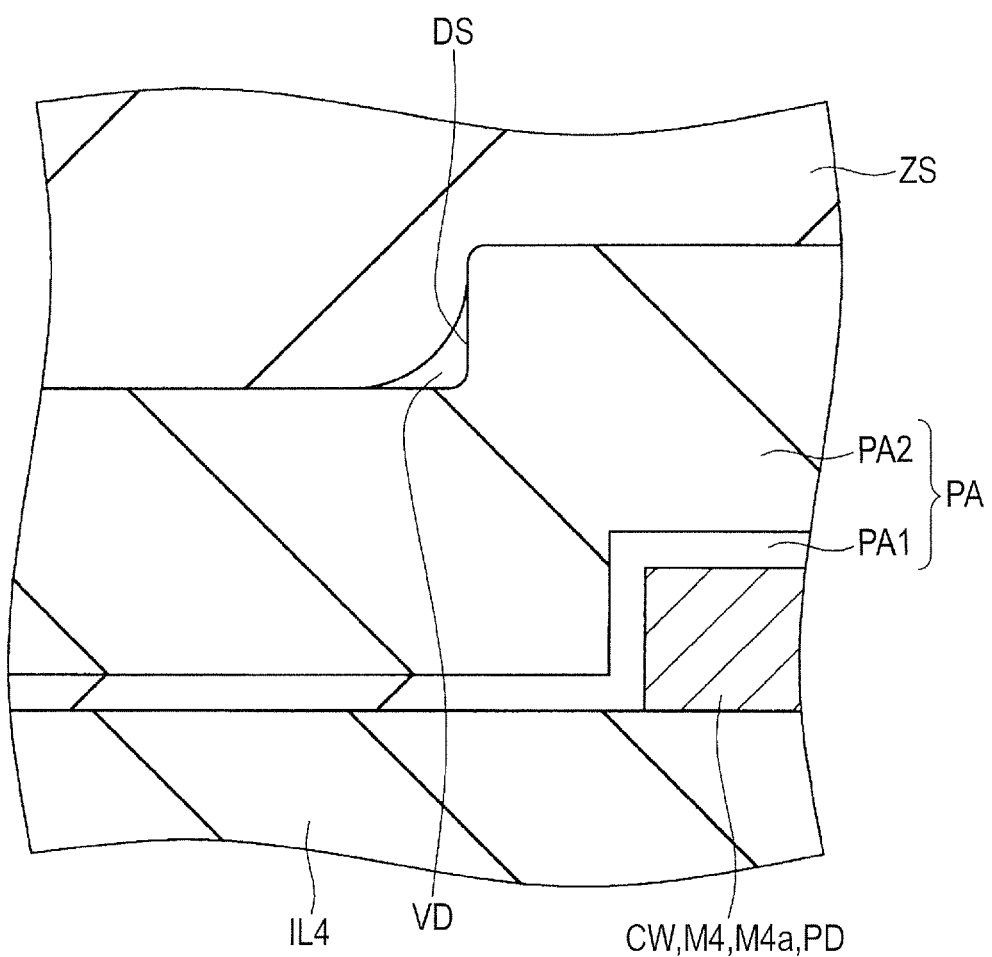
FIG. 40 is a partially enlarged cross-sectional view of FIG. 39.

FIG. 39 is a partially enlarged cross-sectional view showing a part of the semiconductor package PKG in FIG. 9 described above in enlarged relation when the semiconductor chip CP100 in the studied example in FIG. 38 is applied to the semiconductor chip of the semiconductor package PKG, which corresponds to FIG. 37 described above. As shown in FIG. 39, two semiconductor chips CP101 and CP102 are stacked with the insulating sheet ZS being interposed therebetween. To the cross-sectional structure of each of the semiconductor chips CP101 and CP102, the cross-sectional structure of the semiconductor chip CP100 in the studied example in FIG. 38 is applied. Accordingly, in the semiconductor chips CP101 and CP102 in FIG. 39, as a consequence of not performing the steps in FIGS. 33 to 35 described above during the manufacturing thereof, the depressions DS are formed in the upper surface of the uppermost-layer insulating film PA. FIG. 40 is a partially enlarged cross-sectional view showing the vicinity of each of the depressions in FIG. 39.

When the two semiconductor chips CP101 and CP102 are stacked with the insulating sheet ZS being interposed therebetween, it follows that the insulating sheet ZS is interposed between the respective insulating films PA of the semiconductor chips CP101 and CP102. When the upper surface of the insulating film PA is flat, the insulating sheet ZS can firmly adheres to the upper surface of the insulating film PA. However, when the depressions DS are formed in the upper surface of the insulating film PA, as shown in FIG. 40, the insulating sheet ZS cannot firmly adhere to the insulating film PA at a position adjacent to each of the depressions DS. As a result, between the insulating sheet ZS and the insulating film PA, a void (space or clearance) VD is undesirably formed.

As shown in FIGS. 39 and 40, when the void VD is formed at the position adjacent to the depression DS between the insulating sheet ZS and the insulating film PA, the insulating sheet ZS is likely to peel off the semiconductor chips CP101 and CP102, starting at the void VD. When the insulating sheet ZS peels off the semiconductor chips CP101 and CP102, the breakdown voltage (dielectric breakdown voltage) between the semiconductor chips CP101 and CP102 tends to decrease. In particular, the breakdown voltage (dielectric breakdown voltage) between the coils in the semiconductor chip CP101 and the coils in the semiconductor chip CP102 which are magnetically coupled to each other tends to decrease. This may result in the dielectric breakdown of the semiconductor device (semiconductor package) during the high-voltage operation thereof or the like, which leads to reliability degradation. When the insulating sheet ZS peels off the semiconductor chips CP101 and CP102, the portion that has peeled serves as an entry pathway for moisture or the like, resulting in a reduction in moisture resistance. This may result in the dielectric breakdown of the semiconductor device (semiconductor package) in a high-humidity environment or the like, which leads to reliability degradation.

<Main Characteristic Features and Effects>

The semiconductor device (semiconductor package) in the present embodiment includes the semiconductor chip CP1 (first semiconductor chip) having the coils (CL1$a$ and CL2$a$), the semiconductor chip CP2 (second semiconductor chip) having the coils (CL1$b$ and CL2$b$), and the insulating sheet ZS interposed between the semiconductor chips CP1 and CP2. The semiconductor chips CP1 and CP2 are stacked via the insulating sheet ZS. The coils (CL1$a$ and CL2$a$) of the semiconductor chip CP1 are magnetically coupled to the coils (CL1$b$ and CL2$b$) of the semiconductor chip CP2.

The method of manufacturing the semiconductor device (semiconductor package) in the present embodiment includes the steps of providing (producing) the semiconductor chip CP1, providing (producing) the semiconductor chip CP2, and stacking the semiconductor chips CP1 and CP2 via the insulating sheet ZS. In the step of stacking the semiconductor chips CP1 and CP2, the semiconductor chips CP1 and CP2 are stacked via the insulating sheet ZS with the respective insulating films PA of the semiconductor chips CP1 and CP2 facing each other such that the respective coils in semiconductor chips CP1 and CP2 are magnetically coupled to each other. Each of the step of providing (producing) the semiconductor chip CP1 and the step of providing (producing) the semiconductor chip CP2 includes the steps of forming the wiring structure having one or more wiring layers and including the coils (CL1 and CL2) over the semiconductor substrate SB, forming the insulating film PA over the wiring structure, and planarizing the upper surface of the insulating film PA.

One of the main characteristic features of the present embodiment is that the semiconductor chip CP1 (first semiconductor chip) and the semiconductor chip CP2 (second semiconductor chip) are stacked via the insulating sheet ZS and the coils (CL1$a$ and CL2$a$) in the semiconductor chip CP1 are magnetically coupled to the coils (CL1$b$ and CL2$b$) in the semiconductor chip CP2.

This allows signal transmission between the semiconductor chips CP1 and CP2 to be performed using the magnetic coupling of the coils.

A case is assumed where, unlike in the present embodiment, the primary and secondary coils included in a transformer for signal transmission are formed in the same semiconductor chip. In this case, the breakdown voltage (dielectric breakdown) between the primary and secondary coils formed in the same semiconductor chip is ensured using the interlayer insulating film interposed between the primary and secondary coils. However, when the thickness of the interlayer insulating film is excessively increased, a semiconductor wafer is likely to warp during the manufacturing process of the semiconductor chip so that the manufacturing process of the semiconductor chips is hard to perform. The excessively increased thickness of the interlayer insulating film increases difficulty in forming the wiring structure. Thus, there is a limit to the increase of the thickness of the interlayer insulating film so that there is a limit to the increase of the breakdown voltage between the primary and secondary coils formed in the same semiconductor chip.

By contrast, in the present embodiment, the primary and secondary coils included in each of the transformers for signal transmission are formed in the different semiconductor chips. That is, the coils formed in the semiconductor chip CP1 and the coils formed in the semiconductor chip CP2 are magnetically coupled to form the transformer for signal transmission. In addition, between the semiconductor chips CP1 and CP2, the insulating sheet is interposed. This allows the breakdown voltage (dielectric breakdown voltage) between the primary and secondary coils to be ensured using the insulating film (PA) formed over the coils (CL1$a$ and CL2$a$) in the semiconductor chip CP1, the insulating film (PA) formed over the coils (CL1$b$ and CL2$b$) in the semiconductor chip CP2, and the insulating sheet ZS interposed between the semiconductor chips CP1 and CP2. Since the thickness of the insulating sheet ZS can selectively be determined in accordance with the required breakdown voltage, the breakdown voltage (dielectric breakdown voltage) between the primary and secondary coils can easily and properly be increased. When, e.g., specifications require a high level of the breakdown voltage between the primary and secondary coils, the thickness of the insulating sheet ZS is increased in accordance with the specifications to thus allow a semiconductor device (semiconductor package) satisfying the specifications to be provided.

However, according to the study by the present inventors, as has been described above with reference to the foregoing studied example, when the foregoing void VD (see FIG. 40 described above) due to the foregoing depression DS is formed at the position adjacent to the depression DS in the semiconductor package having the configuration in which the semiconductor chips CP101 and CP102 are stacked via the insulating sheet ZS, the insulating sheet ZS is likely to peel off the semiconductor chips CP101 and CP102. The peeling of the insulating sheet ZS causes a reduction in the breakdown voltage (dielectric breakdown voltage) between the coils in the semiconductor chip CP101 and the coils in the semiconductor chip CP102. This leads to the degradation of the reliability of the semiconductor package.

Another main characteristic feature of the present embodiment is that each of the step of providing (producing) the semiconductor chip CP1 and the step of providing (producing) the semiconductor chip CP2 includes the step of planarizing the upper surface of the insulating film PA. That is, when the semiconductor chip CP1 is manufactured, the process of planarizing the upper surface of the insulating film PA is performed and, when the semiconductor chip CP2 is manufactured, the process of planarizing the upper surface of the insulating film PA is performed.

This can inhibit or prevent a depression such as the foregoing depression DS from being formed in the upper surface of the uppermost-layer insulating film PA of each of the semiconductor chips CP1 and CP2. Consequently, it is possible to inhibit or prevent a void such as the foregoing void VD from being formed between the insulating sheet ZS and the insulating film PA of each of the semiconductor chips CP1 and CP2 due to the depression (or unevenness) of the upper surface of the insulating film PA and thus inhibit or prevent the insulating sheet ZS from peeling off the semiconductor chips CP1 and CP2. Therefore, it is possible to improve the reliability of the semiconductor device (semiconductor package).

That is, in the case where the step of planarizing the upper surface of the insulating film PA is not performed unlike in the present embodiment (corresponding to the studied example in FIG. 38), the foregoing depression DS is formed in the upper surface of the uppermost-layer insulating film PA of the semiconductor chip (CP101 or CP102). By contrast, in the present embodiment, the step of planarizing the upper surface of the insulating film PA is performed to thus remove the depression or unevenness of the upper surface of the uppermost-layer insulating film PA of each of the semiconductor chips CP1 and CP2 and planarize the upper surface of the uppermost-layer insulating film PA. Accordingly, the planarity of the upper surface of the uppermost-layer insulating film PA of each of the semiconductor chips CP1 and CP2 is higher and the depression or unevenness of the upper surface of the uppermost-layer insulating film PA of each of the semiconductor chips CP1 and CP2 is smaller in the case where the step of planarizing the upper surface of the insulating film PA is performed (corresponding to the present embodiment) than in the case where the step of planarizing the upper surface of the insulating film PA is not performed (corresponding to the studied example in FIG. 38 described above).

When a depression is formed in the upper surface of the region of the insulating film PA which overlaps the insulating sheet ZS, a void may be formed at a position adjacent to the depression between the insulating sheet ZS and the insulating film PA. As the depression of the upper surface of the insulating film PA decreases, the void is less likely to be formed between the insulating sheet ZS and the insulating film PA. Therefore, enhancing the planarity of the upper surface of the insulating film PA is extremely important in inhibiting or preventing a void from being formed between the insulating sheet ZS and the insulating film PA. When a void is formed between the insulating sheet ZS and the insulating film PA due to the depression of the upper surface of the insulating film PA, the insulating sheet ZS is likely to peel off the insulating film PA of each of the semiconductor chips, starting at the void. This causes the degradation of the reliability of the semiconductor device, as described in the foregoing studied example. Therefore, preventing a void from being formed between the insulating sheet ZS and the insulating film PA is extremely important in improving the reliability of the semiconductor device. In the present embodiment, the process of planarizing the upper surface of the insulating film PA is performed during the manufacturing of the semiconductor chips CP1 and CP2. This can reduce the dimension (height) of the depression formed in the upper surface of the insulating film PA and thus inhibit or prevent a void from being formed between the insulating sheet ZS and the insulating film PA of each of the semiconductor chips CP1 and CP2 due to the depression (or unevenness) of the upper surface of the insulating film PA. Therefore, it is possible to inhibit or prevent the insulating sheet ZS from peeling off the semiconductor chips CP1 and CP2 in the semiconductor device in which the semiconductor chips CP1 and CP2 are stacked via the insulating sheet ZS and thus improve the reliability of the semiconductor device.

As described above, the present inventors have performed such study as described in the foregoing section "About Study by Present Inventors". As a result, the present inventors have introduced the step of planarizing the upper surface of the insulating film PA into the manufacturing of the semiconductor chips CP1 and CP2. In general, planarity is not required of the upper surface of a semiconductor chip and therefore a process for ensuring planarity to an uppermost-layer insulating film need not be performed. When consideration is given to a reduction in the number of manufacturing steps, it is advantageous not to perform the process of planarizing the uppermost-layer insulating film. However, the present inventors have studied the technique which stacks the two semiconductor chips via the insulating sheet and magnetically couples the respective coils formed in the semiconductor chips to each other to thus transmit a signal and found that, when the foregoing depression DS is formed in the uppermost-layer insulating film (PA) of the semiconductor chip, the peeling of the insulating sheet (ZS) occurs to cause the degradation of the reliability of the semiconductor device (semiconductor package). The finding of such a problem has caused the present inventors to notice that it is important not to form such a depression as the foregoing depression DS in the uppermost-layer insulating film (PA) of the semiconductor chip. As a result, the present inventors have introduced the step of planarizing the upper surface of the insulating film PA into the manufacturing of the semiconductor chips CP1 and CP2. Therefore, it can be said that the finding of the foregoing problem has led to the introduction of the step of planarizing the upper surface of the insulating film PA into the manufacturing of the semiconductor chips CP1 and CP2.

Also, in the present embodiment, the coils CL1a and CL2a are formed in the semiconductor chip CP1, while the coils CL1b and CL2b are formed in the semiconductor chip CP2. The coil CL1a in the semiconductor chip CP1 is magnetically coupled to the coil CL1b in the semiconductor chip CP2, while the coil CL2a in the semiconductor chip CP1 is magnetically coupled to the coil CL2b in the semiconductor chip CP2. That is, signal transmission paths between the semiconductor chips CP1 and CP2 are only paths extending through the magnetically coupled coils, which come in two systems including a path extending through the coils CL1a and CL1b and a path extending through the coils CL2a and CL2b.

However, signal transmission paths between the semiconductor chips CP1 and CP2 (transmission paths extending through the magnetically coupled coils) are not limited to the two systems. For example, it is also possible to omit the formation of the coil CL2a in the semiconductor chip CP1, omit the formation of the coil CL2b in the semiconductor chip CP2, magnetically couple the coil CL1a in the semiconductor chip CP1 to the coil CL1b in the semiconductor chip CP2, and transmit a signal between the semiconductor chips CP1 and CP2 via the magnetically coupled coils CL1a and CL1b. In this case, a signal transmission path between the semiconductor chips CP1 and CP2 (transmission path extending through the magnetically coupled coils) comes in one system. Alternatively, it is also possible to form three or more coils in the semiconductor chip CP1, form three or more coils in the semiconductor chip CP2, magnetically couple the individual coils in the semiconductor chip CP1 to the individual coils in the semiconductor chip CP2, and transmit signals between the semiconductor chips CP1 and CP2 via the magnetically coupled coils. In this case, signal transmission paths (transmission paths extending through the magnetically coupled coils) between the semiconductor chips CP1 and CP2 come in three or more systems.

Embodiment 2

Embodiment 2 is in common with Embodiment 1 described above in performing the process (step) of planarizing the upper surfaces of the insulating films PA when the semiconductor chips CP1 and CP2 are manufactured. However, Embodiment 2 uses a specific method for the process of planarizing the upper surfaces of the insulating films PA which is different from that used in Embodiment 1 described above.

That is, in Embodiment 1 described above, a mask layer (corresponding to the foregoing photoresist pattern PR1) is formed over each of the insulating films PA. Then, by etching back the insulating film PA using the mask layer as an etching mask, the upper surface of the insulating film PA is planarized. That is, in Embodiment 1 described above, the step of planarizing the upper surface of the insulating film PA includes the step of forming the mask layer (corresponding to the foregoing photoresist pattern PR1) over the insulating film PA and the step of etching back the insulating film PA using the mask layer as the etching mask.

On the other hand, in Embodiment 2, in the process (step) of planarizing the upper surface of the insulating film PA, the upper surface of the insulating film PA is polished to be planarized. More specifically, the upper surface of the insulating film PA is planarized using a CMP method to be planarized.

Figure 41:
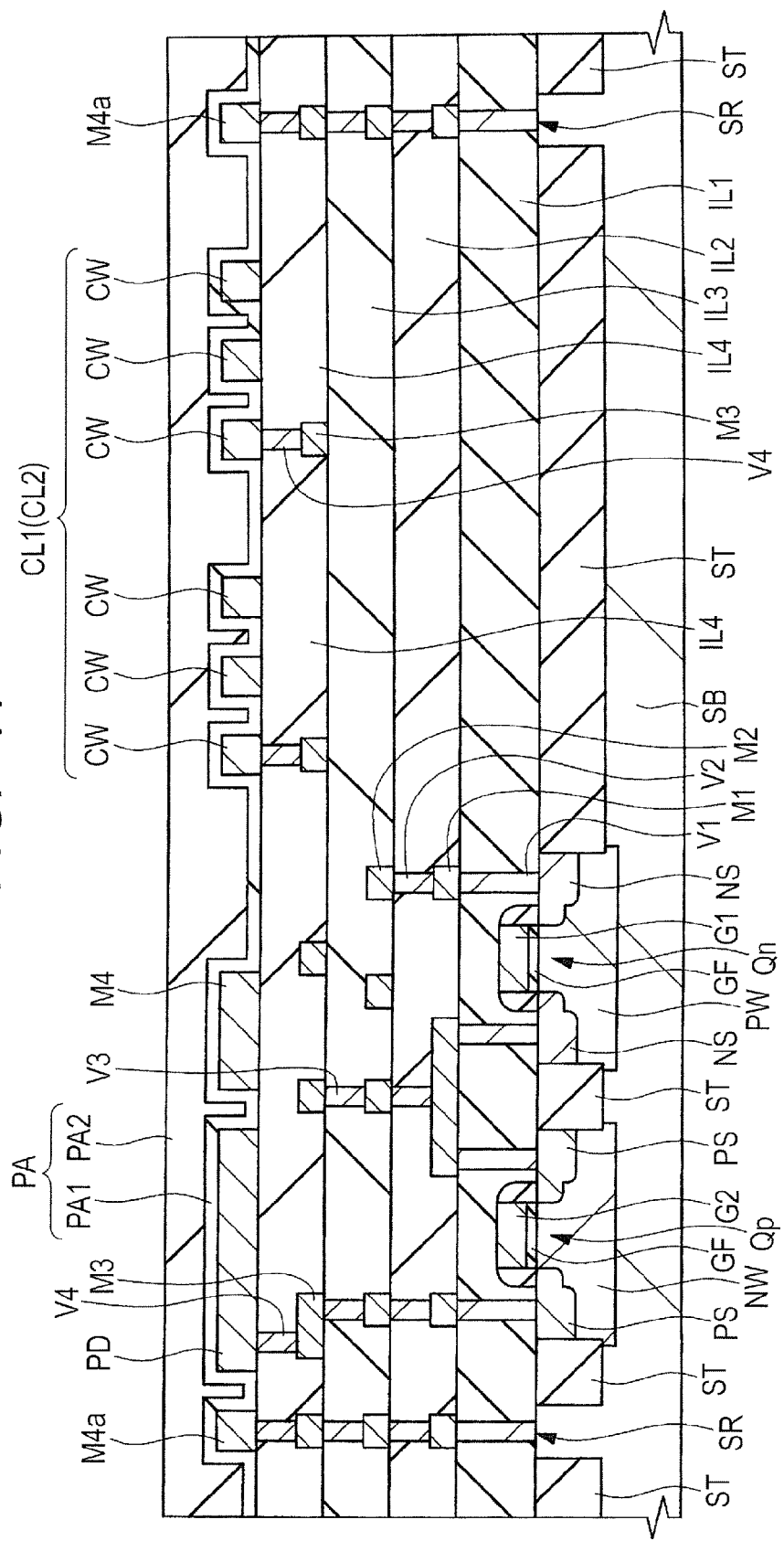
FIG. 41 is a cross-sectional view of a semiconductor chip in another embodiment during the manufacturing process thereof.

Referring to FIG. 32 described above and FIG. 41, a specific description will be given of the process of planarizing the upper surface of the insulating film PA in Embodiment 2. FIG. 41 is a main-portion cross-sectional view of the semiconductor chip CP in Embodiment 2 during the manufacturing process thereof, which shows a cross section corresponding to FIGS. 20 to 36 described above in Embodiment 1 described above. FIG. 41 corresponds to a main-portion cross-sectional view of the semiconductor chip CP1 during the manufacturing process thereof, which is subsequent to FIG. 32 described above.

The manufacturing process of the semiconductor chip CP in Embodiment 2 is basically the same as that in Embodiment 1 described above up until the step of forming the insulating film PA2 is performed to obtain the structure in FIG. 32 described above.

While the insulating film PA2 is preferably a resin film in Embodiment 1 described above, the insulating film PA2 is preferably a silicon dioxide film in Embodiment 2. The silicon dioxide film forming the insulating film PA2 can be formed using a CVD method or the like. The formed film thickness of the insulating film PA2 can be controlled to be about the same as in Embodiment 1 described above.

In Embodiment 2 also, the insulating films PA1 and PA2 are formed in the same manner as in Embodiment 1 described above except that the material of the insulating film PA2 and a method of depositing the insulating film PA2 are different. This achieves a state where, in the same manner as in Embodiment 1 described above, over the interlayer insulating film IL4, the insulating film PA made of the laminated film including the insulating film PA1 and the insulating film PA2 over the insulating film PA1 is formed so as to cover the wires M4, the pad PD, the coils CL1 and CL2, and the seal ring wire M4a.

At this stage, the process of planarizing the upper surface of the insulating film PA has not been performed yet. Accordingly, in Embodiment 2 also, in the same manner as in Embodiment 1 described above, the depression DS reflecting the underlying metal pattern (including the pad PD, the wires M4, the coil wires CW, and the seal ring wire M4a herein) is formed in the upper surface of the insulating film PA. The dimension (height) h1 of the depression DS is substantially the same as the thickness T1 of the underlying metal pattern (including the pad PD, the wires M4, the coil wires CW, and the seal ring wire M4a herein).

Next, in Embodiment 2 also, the process of planarizing the upper surface of the insulating film PA is performed. However, the specific method for the process of planarizing the upper surface of the insulating film PA is different from that in Embodiment 1 described above.

That is, in Embodiment 2, the upper surface of the insulating film PA is planarized by polishing the upper surface of the insulating film PA (i.e., the upper surface of the insulating film PA2). FIG. 41 shows the stage after the polishing process is performed. At this time, a CMP method can appropriately be used for the polishing. The polishing process is performed to planarize the upper surface of the insulating film PA and enhance the planarity of the upper surface of the insulating film PA. Accordingly, the amount of the polishing of the insulating film PA (specifically the insulating film PA2) (thickness of the polished portion thereof) is preferably controlled to be about the same as or larger than the dimension h1 of the depression DS at the stage before the polishing process is performed.

The polishing process is ended before the insulating film PA1 is exposed to prevent the insulating film PA2 from being excessively polished and thus prevent the insulating film PA1 from being exposed. Since the dimension h1 of the depression DS is about the same as the foregoing thickness T1, the formed film thickness of the insulating film PA2 is controlled to be larger than the foregoing thickness T1 of the metal pattern. Since the amount of the polishing of the insulating film PA2 (thickness of the polished portion thereof) is smaller than the formed film thickness of the insulating film PA2, the insulating film PA2 remains in a layer even after the polishing process.

Before the polishing process is performed, the depression DS (or unevenness) resulting from the underling metal pattern (including the wires M4, the pad PD, the coil wires CW, and the seal ring wires M4a) is present in the upper surface of the insulating film PA. However, by performing the polishing process, the upper surface of the insulating film PA is planarized. That is, the depression (or unevenness) of the upper surface of the insulating film PA before the polishing process is performed is reduced after the polishing process is performed, resulting in the enhanced planarity of the upper surface of the insulating film PA. In other words, the dimension (height) of the depression formed in the upper surface of the insulating film PA is smaller after the polishing process is performed than before the polishing process is performed. That is, by performing the polishing process, the upper surface of the insulating film PA is planarized to result in a state where the depression DS reflecting the underlying metal pattern is not formed in the upper surface of the insulating film PA. Otherwise, even when the depression is formed in the upper surface of the insulating film PA, the dimension (height) of the depression is smaller than the height h1 of the depression DS before the polishing process.

Thus, the process of planarizing the upper surface of the insulating film PA is performed.

The subsequent steps in Embodiment 2 are the same as in Embodiment 1 described above. The step of forming the foregoing opening OP (step described with reference to FIG. 36 described above) in the insulating film PA and the subsequent steps are performed in the same manner as in Embodiment 1 described above, but the illustration and repeated description thereof is omitted herein.

In Embodiment 2 also, each of the step of providing (producing) the semiconductor chip CP1 and the step of providing (producing) the semiconductor chip CP2 includes the step of planarizing the upper surface of the insulating film PA. That is, during the manufacturing of the semiconductor chip CP1, the process of planarizing the upper surface of the insulating film PA is performed and, during the manufacturing of the semiconductor chip CP2 also, the process of planarizing the upper surface of the insulating film PA is performed.

By performing the process (step) of planarizing the upper surface of the insulating film PA during the manufacturing of each of the semiconductor chips CP1 and CP2, the dimension (height) of the depression formed in the upper surface of the insulating film PA can be reduced. This can inhibit or prevent a void from being formed between the insulating sheet ZS and the insulating film PA of each of the semiconductor chips CP1 and CP2 due to the depression (or unevenness) of the upper surface of the insulating film PA. As a result, it is possible to inhibit or prevent the insulating sheet ZS from peeling off the semiconductor chips CP1 and CP2 in the semiconductor device (semiconductor package) in which the semiconductor chips CP1 and CP2 are stacked via the insulating sheet ZS and thus improve the reliability of the semiconductor device.

In Embodiment 1 described above, the etch-back process is used as the process of planarizing the upper surface of the insulating film PA while, in Embodiment 2, the polishing process is used as the process of planarizing the upper surface of the insulating film PA. In terms of enhancing the planarity of the insulating film PA, the polishing process is advantageous over the etch-back process. Accordingly, the planarity of the upper surface of the insulating film PA in each of the semiconductor chips CP1 and CP2 is more likely to be enhanced in Embodiment 2 than in Embodiment 1 described above. To minimize the possibility of the insulating film ZS peeling off the insulating film PA of each of the semiconductor chips CP1 and CP2, it is advantageous to maximize the planarity of the upper surface of the insulating film PA in each of the semiconductor chips CP1 and CP2. As the process of planarizing the upper surface of the insulating film PA, Embodiment 2 uses the polishing process which is more likely to enhance the planarity. This can more reliably enhance the planarity of the upper surface of the insulating film PA in each of the semiconductor chips CP1 and CP2 and consequently more reliably inhibit or prevent the insulating sheet ZS from peeling off the semiconductor chips CP1 and CP2. Therefore, it is possible to further improve the reliability of the semiconductor device.

However, the polishing process is easy to perform on a rather hard film, but is difficult to perform on a soft film. On the other hand, the etch-back process can properly be performed on either a hard film or a soft film as long as etching conditions (such as the type and flow rate of an etching gas) are set successfully. As the outermost film (which is the insulating film PA2 herein) of the semiconductor chip, a resin film or a silicon dioxide film is preferable, but the resin film is softer than the silicon dioxide film. That is, the silicon dioxide film is suitable for the polishing process, while the resin film is less suitable for the polishing process.

Accordingly, in the case where the insulating film PA2 is a resin film (e.g., a polyimide film), Embodiment 1 described above is more preferably applied thereto. By doing so, even when the insulating film PA2 is a soft resin film, the upper surface of the insulating film PA2 can be planarized by the etch-back process. Thus, it is possible to inhibit or prevent the insulating sheet ZS from peeling off the semiconductor chips CP1 and CP2 and obtain the effect of improving the reliability of the semiconductor device.

On the other hand, when the insulating film PA2 is a silicon dioxide film, it is possible to ensure a sufficient hardness to allow the polishing process to be properly performed. Accordingly, Embodiment 2 is preferably applied thereto. This allows the polishing process to further enhance the planarity of the upper surface of the insulating film PA. Therefore, it is possible to further improve the effect of inhibiting or preventing the insulating sheet ZS from peeling off the semiconductor chips CP1 and CP2 and further improve the reliability of the semiconductor device.

Accordingly, when the insulating film PA includes a resin film and the resin film is a target to be subjected to the planarization process in the step of planarizing the insulating film PA, an etch-back process is used preferably as the planarization process. On the other hand, when the insulating film PA includes the silicon dioxide film and the silicon dioxide film is a target to be subjected to the planarization process in the step of planarizing the insulating film PA, a polishing process is used preferably as the planarization process.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

What is claimed is:

1. A method of manufacturing a semiconductor device including a first semiconductor chip having a first coil, a second semiconductor chip having a second coil, and an insulating sheet interposed between the first and second semiconductor chips, the first and second semiconductor chips being stacked via the insulating sheet, and the first and second coils being magnetically coupled to each other, the method comprising the steps of:
   (a) providing the first semiconductor chip;
   (b) providing the second semiconductor chip; and
   (c) stacking the first and second semiconductor chips via the insulating sheet so as to magnetically couple the first and second coils to each other;

wherein the step (a) includes the steps of:
(a1) forming a first wiring structure having one or more wiring layers and including the first coil over a first semiconductor substrate;
(a2) forming a first insulating film over the first wiring structure; and
(a3) planarizing an upper surface of the first insulating film,
wherein the step (b) includes the steps of:
(b1) forming a second wiring structure having one or more wiring layers and including the second coil over a second semiconductor substrate;
(b2) forming a second insulating film over the second wiring structure; and
(b3) planarizing an upper surface of the second insulating film, and
wherein, in the step (c), the first and second semiconductor chips are stacked via the insulating sheet with the first insulating film of the first semiconductor chip and the second insulating film of the second semiconductor chip facing each other.

2. The method of manufacturing the semiconductor device according to claim 1,
wherein the step (a3) includes the steps of:
(a4) forming a first mask layer over the first insulating film; and
(a5) etching back the first insulating film using the first mask layer as an etching mask, and
wherein the step (b3) includes the steps of:
(b4) forming a second mask layer over the second insulating film; and
(b5) etching the second insulating film using the second mask layer as an etching mask.

3. The method of manufacturing the semiconductor device according to claim 2,
wherein, by performing the step (a5), a planarity of the upper surface of the first insulating film is improved, and
wherein, by performing the step (b5), a planarity of the upper surface of the second insulating film is improved.

4. The method of manufacturing the semiconductor device according to claim 2,
wherein the first insulating film includes a first resin film,
wherein, in the step (a5), the first resin film is etched back,
wherein the second insulating film includes a second resin film, and
wherein, in the step (b5), the second resin film is etched back.

5. The method of manufacturing the semiconductor device according to claim 4,
wherein each of the first and second resin films is made of polyimide.

6. The method of manufacturing the semiconductor device according to claim 1,
wherein, in the step (a3), the upper surface of the first insulating film is polished to be planarized, and
wherein, in the step (b3), the upper surface of the second insulating film is polished to be planarized.

7. The method of manufacturing the semiconductor device according to claim 6,
wherein, in the step (a3), the upper surface of the first insulating film is polished by a CMP method, and
wherein, in the step (b3), the upper surface of the second insulating film is polished by a CMP method.

8. The method of manufacturing the semiconductor device according to claim 6,
wherein the first insulating film includes a first silicon dioxide film,
wherein, in the step (a3), the first silicon dioxide film is polished,
wherein the second insulating film includes a second silicon dioxide film, and
wherein, in the step (b3), the second silicon dioxide film is polished.

9. The method of manufacturing the semiconductor device according to claim 1,
wherein the first insulating film is a film in an uppermost layer of the first semiconductor chip, and
wherein the second insulating film is a film in an uppermost layer of the second semiconductor chip.

10. The method of manufacturing the semiconductor device according to claim 1,
wherein the step (c) includes the steps of:
(c1) mounting the first semiconductor chip over a chip mounting portion; and
(c2) mounting the second semiconductor chip over the first semiconductor chip via the insulating sheet to stack the second semiconductor chip over the first semiconductor chip with the first insulating film of the first semiconductor chip and the second insulating film of the second semiconductor chip facing each other.

11. The method of manufacturing the semiconductor device according to claim 10,
wherein the first semiconductor chip has a plurality of first pads,
wherein the second semiconductor chip has a plurality of second pads,
the method further comprising the step of:
(d) after the step (c), electrically coupling a plurality of first external terminals to the first pads of the first semiconductor chip via a plurality of first conductive coupling members and electrically coupling a plurality of second external terminals to the second pads of the second semiconductor chip via a plurality of second conductive coupling members.

12. The method of manufacturing the semiconductor device according to claim 11, further comprising the step of:
(e) after the step (d), forming a sealing portion which seals the first semiconductor chip, the second semiconductor chip, the insulating sheet, the chip mounting portion, the first conductive coupling members, the second conductive coupling members, the first external terminals, and the second external terminals.

* * * * *